US012568322B2

(12) United States Patent
Mori et al.

(10) Patent No.: US 12,568,322 B2
(45) Date of Patent: Mar. 3, 2026

(54) SOLID-STATE IMAGING DEVICE, METHOD FOR MANUFACTURING SOLID-STATE IMAGING DEVICE, AND ELECTRONIC APPARATUS

(71) Applicant: Brillnics Singapore Pte. Ltd., Singapore (SG)

(72) Inventors: Kazuya Mori, Tokyo (JP); Ken Miyauchi, Tokyo (JP)

(73) Assignee: BRILLNICS SINGAPORE PTE. LTD., Singapore (SG)

( * ) Notice: Subject to any disclaimer, the term of this patent is extended or adjusted under 35 U.S.C. 154(b) by 83 days.

(21) Appl. No.: 18/391,489

(22) Filed: Dec. 20, 2023

(65) Prior Publication Data

US 2024/0214707 A1 Jun. 27, 2024

(30) Foreign Application Priority Data

Dec. 21, 2022 (JP) ................................. 2022-204860

(51) Int. Cl.
*H04N 25/78* (2023.01)
*H04N 25/13* (2023.01)
(Continued)

(52) U.S. Cl.
CPC ............. *H04N 25/78* (2023.01); *H04N 25/13* (2023.01); *H04N 25/46* (2023.01);
(Continued)

(58) Field of Classification Search
CPC ........ H04N 25/78; H04N 25/46; H04N 25/13; H10F 39/807; H10F 39/8053; H10F 39/8037
(Continued)

(56) References Cited

U.S. PATENT DOCUMENTS

2006/0175536 A1* 8/2006 Kim ...................... H10F 39/813
348/E3.018
2007/0058062 A1 3/2007 Ohta
(Continued)

FOREIGN PATENT DOCUMENTS

JP 2007-081033 A 3/2007
JP 2013-062789 A 4/2013

OTHER PUBLICATIONS

Kawada et al., "A Wide Dynamic Range Checkered-Color CMOS Image Sensor with IR-Cut RGB and Visible-to-Near-IR Pixels", IEEE Sensors 2009 Conference, 2009, pp. 1648-1651.

*Primary Examiner* — Joel W Fosselman
(74) *Attorney, Agent, or Firm* — Pillsbury Winthrop Shaw Pittman LLP

(57) ABSTRACT

Provided are a solid-state imaging device, a method for manufacturing a solid-state imaging device and an electronic apparatus that are capable of achieving maximized photo-responsiveness, ensuring low optical SNR in addition to reproducibility, and further reducing the pixel size, thereby efficiently improving important performance factors such as the dynamic range, responsiveness, and resolution. The charges integrated in a first photoelectric conversion element are stored in a storage node, and charges overflowing from the first photoelectric conversion element are stored in a floating diffusion. The charges integrated in a second photoelectric conversion element are stored in a storage node, and charges overflowing from the second photoelectric conversion element are discharged to the region that is not occupied by the floating diffusion.

21 Claims, 43 Drawing Sheets

(51) Int. Cl.
 *H04N 25/46* (2023.01)
 *H10F 39/00* (2025.01)
(52) U.S. Cl.
 CPC ..... *H10F 39/8037* (2025.01); *H10F 39/8053*
 (2025.01); *H10F 39/807* (2025.01)
(58) Field of Classification Search
 USPC ....................................................... 348/294
 See application file for complete search history.

(56) References Cited

U.S. PATENT DOCUMENTS

2013/0049082 A1    2/2013  Kato et al.
2019/0020839 A1*   1/2019  Velichko ............. H04N 25/771

* cited by examiner

Cross section A-A'

FD

FD

Full DTI

2100

2100

ML

A          A'

Cross section B-B'

Full DTI

2100

CF

ML

B          B'

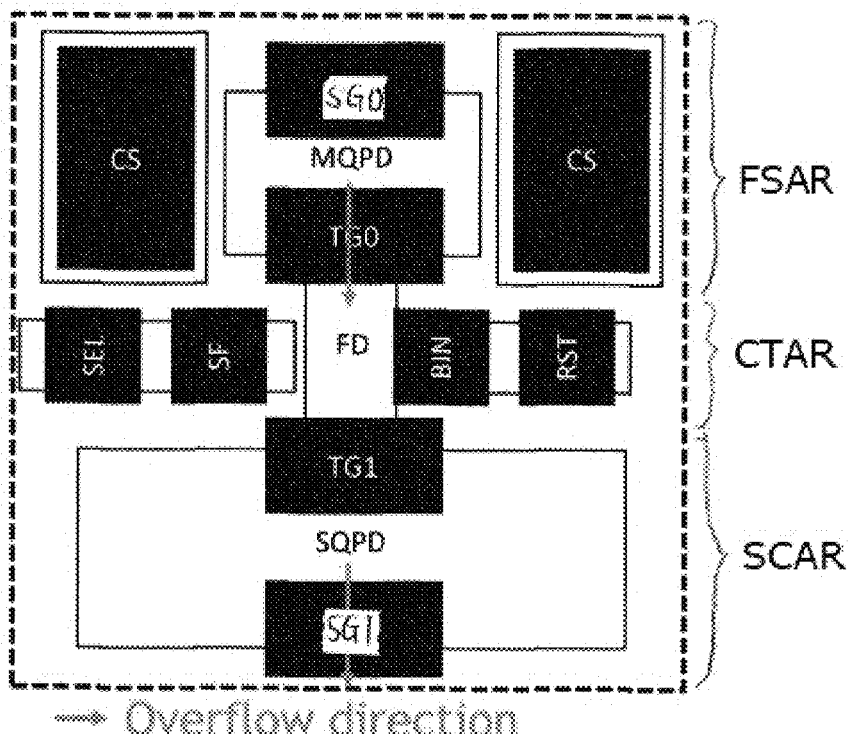
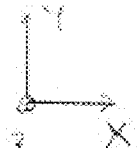
Fig. 7

Partial Full Deep Trench Isolation

Fig. 9

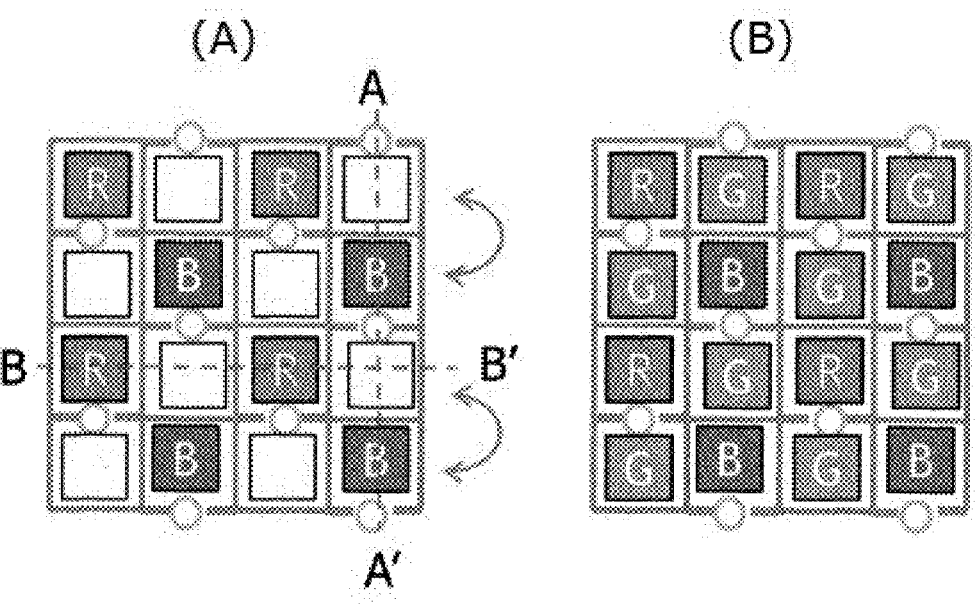
Fig. 11

Example of color filter transmittance and color matrix

Photo charge state in FD shared type PD

Block diagram example (Column wise ADC conversion)

Fig. 18

Color matrix example for 2x2 shared FD pixel (A) Normal bayer (B) RGBW (C) Block bayer (D) RGBW 2x2

Partial Full Deep Trench Isolation (A) Case1 : 4PD/FD (B) Case2 : 4PD/FD (C) Case3 : 4PD/FD

Fig. 23 full deep trench isolation

Block Bayer (2x2 shared FD pixel) configuration and CF configuration
(B)
HDR, High speed and responsivity
low noise by 2X2 binning
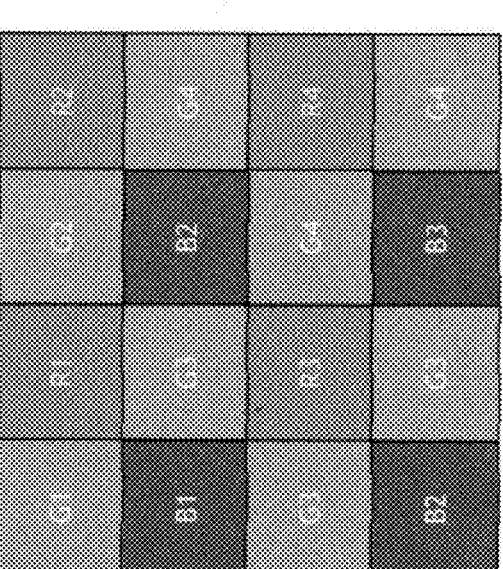
(A)
Full resolution mode
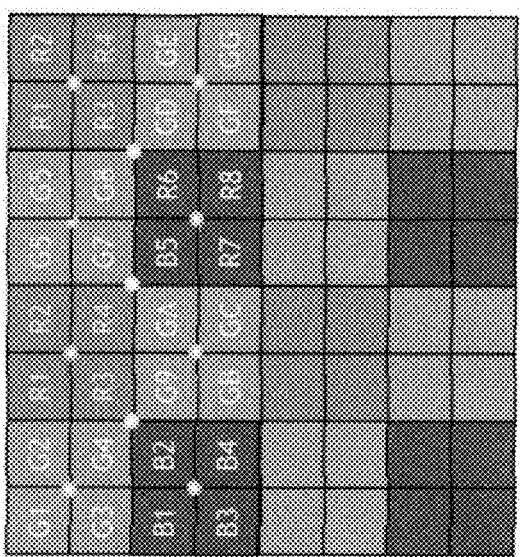
Fig. 24

Photo charge coverage for each of readout operation and charge mixing scheme for linearization 4 Shared FD pixel circuit w/ shutter function 4 Shared FD pixel circuit w/ shutter function FD shared with RGB PD configuration (2x2 block bayer)
Full utilization for overflow signal

| Sig read | CF | |
|---|---|---|
| PD & LOFIC | G | |
| PD & LOFIC | G | |
| PD & LOFIC | G | |
| PD & LOFIC | G | |

Fig. 32

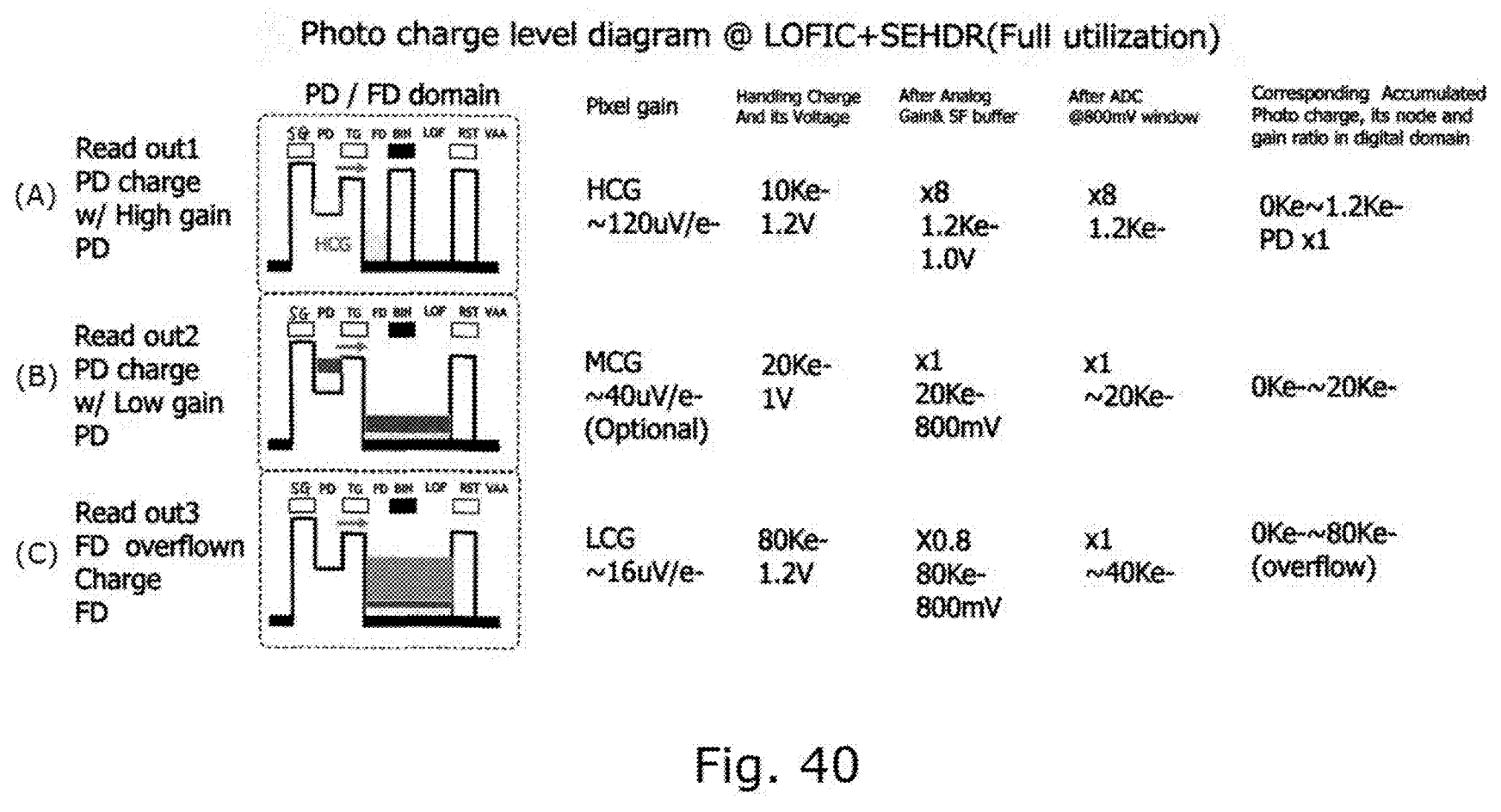

Photo charge level diagram @ LOFIC+SEHDR(Full utilization)

| PD / FD domain | | Pixel gain | Handling Charge And its Voltage | After Analog Gain& SF buffer | After ADC @800mV window | Corresponding Accumulated Photo charge, its node and gain ratio in digital domain |
|---|---|---|---|---|---|---|
| (A) | Read out1 PD charge w/ High gain PD | HCG ~120uV/e- | 10Ke~ 1.2V | x8 1.2Ke~ 1.0V | x8 1.2Ke~ | 0Ke~1.2Ke~ PD x1 |
| (B) | Read out2 PD charge w/ Low gain PD | MCG ~40uV/e- (Optional) | 20Ke~ 1V | x1 20Ke~ 800mV | x1 ~20Ke~ | 0Ke~~20Ke~ |
| (C) | Read out3 FD overflown Charge FD | LCG ~16uV/e- | 80Ke~ 1.2V | X0.8 80Ke~ 800mV | x1 ~40Ke~ | 0Ke~~80Ke~ (overflow) |

Fig. 40

Photo charge level diagram @ LOFIC+SEHDR(Partial utilization)

| | PD / FD domain | Pixel gain | Handling Charge And its Voltage | After Analog Gain& SF buffer | After ADC @980mV window | Corresponding Accumulated Photo charge, its node and gain ratio in digital domain |
|---|---|---|---|---|---|---|
| (A) Read out1 PD charge w/ High gain PD0 | | HCG ~120uV/e- | 8Ke- 1.2V | x1 8Ke- 1.0V | x1 6Ke- | 0Ke~6Ke- PD x1 |
| (B) Read out2 FD overflown Charge PD0 | | LCG ~20uV/e- | 40Ke- 1V | x1 40Ke- 800mV | x1 ~40Ke- | 0Ke~40Ke- (overflow) Equivalent ~160Ke- |
| (C) Read out3 PD charge w/ high gain PD1,2,3 | | HCG ~120uV/e- | 40~50Ke- 1.0V | x8 1Ke- 800mV | x8 1Ke- | 0Ke~40Ke- PD @pixelxanalog gain |
| (D) Read out4 PD charge w/ low gain PD1,2,3 | | LCG ~20uV/e- | 24Ke- 500mV | x1 40~50Ke- 0.8V | x1 ~40Ke- | 0Ke~40Ke- PD @pixelxanalog gain |

Fig. 41

SOLID-STATE IMAGING DEVICE, METHOD FOR MANUFACTURING SOLID-STATE IMAGING DEVICE, AND ELECTRONIC APPARATUS

CROSS-REFERENCE TO RELATED APPLICATIONS

This application is based on and claims the benefit of priority from Japanese Patent Application Serial No. 2022-204860 (filed on Dec. 21, 2022), the contents of which are incorporated herein.

TECHNICAL FIELD

The present disclosure relates to a solid-state imaging device, a method for manufacturing a solid-state imaging device, and an electronic apparatus.

BACKGROUND

Solid-state imaging devices (image sensors) including photoelectric conversion elements for detecting light and generating charges are embodied as complementary metal oxide semiconductor (CMOS) image sensors, which have been in practical use. The CMOS image sensors have been widely applied in various types of electronic apparatuses such as digital cameras, video cameras, surveillance cameras, medical endoscopes, personal computers (PCs), mobile phones and other portable terminals (mobile devices) as their parts.

The CMOS image sensors include pixels, each of which includes a photodiode (a photoelectric conversion element) and a floating diffusion (FD) amplifier having a floating diffusion (FD). The mainstream design of the reading operation in the CMOS image sensors is a column parallel output processing of selecting one of the rows in the pixel array and reading the pixels in the selected row simultaneously in the column output direction.

Each pixel of the CMOS image sensor generally includes, for one photodiode for example, four active elements: a transfer transistor serving as a transfer element; a reset transistor serving as a reset element; a source follower transistor serving as a source follower element (an amplification element); and a selection transistor serving as a selection element.

Common CMOS image sensors capture color images using three primary color filters for red (R), green (G), and blue (B) or four complementary color filters for cyan, magenta, yellow, and green.

In general CMOS image sensors, pixels respectively have filters. The filters include red (R) filters that mainly transmit red light, green (Gr, Gb) filters that mainly transmit green light, and blue (B) filters that mainly transmit blue light. An R filter, a Gr filter, a Gb filter and a B filter, in total, four filters are arranged in a square geometry and forms a sub-pixel group, which is referred to as a unit RGB sub-pixel group or multi-pixel. The multi-pixels are arranged two-dimensionally.

Light incident on a CMOS image sensor goes through the filters before received by the photodiodes. The photodiodes can receive light having wavelengths (380 nm to 1,100 nm), which include wavelengths outside the visible wavelength range (380 nm to approximately 780 nm), and produce signal charges. Therefore, the produced signal charges contain errors attributable to infrared light, and the photodiodes suffer from reduced color reproduction quality. Accordingly, it is a general practice to eliminate infrared light using infrared cut filters (IR cut filters).

RGB pixels with IR cut filters can achieve favorable color reproduction quality for visible light with high saturation light intensity and improved dynamic range. Instead of IR filters, white (W) or clear pixels can make highly sensitive cut filters for visible to near infrared wavelength ranges (see, for example, S. Kawada, S. Sakai, N. Akahane, R. Kuroda, and S. Sugawa, "Wide dynamic range checkerboard color CMOS image sensor with IR-Cut RGB and visible-near-IR pixels," SENSORS, 2009, IEEE, 2009, pp. 1648-1651, doi:10.1109/ICSENS.2009.5398511).

W filters are by far more responsive to visible light than other filters such as R, G and B filters. Therefore, by applying the white/clear filter technology to a color matrix, improved photo-responsiveness performance and enhanced performance under low illuminance can be accomplished.

FIG. 1 shows photo-responsive characteristics for a color matrix including various colors of W, R, G and B.

As can be seen from FIG. 1, when visible light is incident on a color matrix, the saturation point is limited by a high-transmissivity color filter (CF) of the color matrix. Therefore, by enhancing the saturation point of only the W and G filters, the dynamic range (DR) can be improved without requiring an increase in pixel size.

One of the approaches applied to increase the dynamic range, a lateral overflow integration capacitor (LOFIC) can be proposed.

In recent years, the increase in number of pixels in CMOS image sensors lead to an enhanced demand for a reduction in pixel size. To deal with this demand, multiple-pixel sharing technique has been proposed, according to which one floating diffusion FD, one reset transistor, one source follower transistor and one selection transistor are shared between a plurality of photodiodes and between a plurality of transfer transistors (see, for example, Japanese Patent Application Publications Nos. 2007-81033 ("the '033 Publication") and 2013-62789 ("the '789 Publication")).

The '033 Publication discloses an example of pixels of a CMOS image sensor having a two-pixel sharing configuration in which one floating diffusion FD, one reset transistor, one source follower transistor, and one selection transistor are shared by two sets of a photodiode and a transfer transistor.

The '789 Publication discloses an example of pixels of a CMOS image sensor having a four-pixel sharing configuration in which one floating diffusion FD, one reset transistor, one source follower transistor, and one selection transistor are shared by four sets of a photodiode and a transfer transistor.

A sharing pixel PXL1 has a rectangular region RCT1 where the elements are formed. The rectangular region RCT1 can be divided into a central region CTAR1 positioned in the center, and a first region FSAR1 and a second region SCAR1 sandwiching the central region CTAR1 therebetween (in the Y direction). The layout of the sharing pixel is basically as follows. A floating diffusion FD is arranged at the center of the element formation region, and photoelectric conversion elements or photodiodes PD are radially arranged around the floating diffusion FD.

For example, according to a two-pixel sharing configuration, in the central region CTAR1, the floating diffusion FD is formed in the X- and Y-direction-wise central portion thereof, the reset transistor RST-Tr is formed on the right side of the floating diffusion FD in the X direction, and the source follower transistor SF-Tr and the selection transistor SEL-Tr are formed on the left side of the floating diffusion FD in the X direction. The relative positions represented by the terms such as left and right can be only example and modified in any other manners than the illustrated example.

A first photodiode PD0 and a first transfer transistor TG0-Tr are adjacent to each other in the first region FSAR1. The first transfer transistor TG0-Tr is shaped like a rectangle, arranged closer to the central region CTAR1, and connected to the floating diffusion FD.

In the second region SCAR1, a second photodiode PD1 and a second transfer transistor TG1-Tr are formed. The second transfer transistor TG1-Tr is arranged closer to the central region CTAR1 and connected to the floating diffusion FD.

According to the above-described configurations, every two or four pixels can share their pixel components, so that the photodiode PD in each pixel can have a maximized size. This can contribute to reduce the size of the pixels while the sensitivity and well capacity remain unchanged.

Since the floating diffusion FD is shared by two or more photodiodes PDs, the deep trench isolation (DTI) technique is applied to prevent color signal cross-talk between the photodiodes PDs. Beneath the region where the shared FD is formed, the sub-deep trench isolation (sub-DTI) technique is applied in place of the full deep trench isolation (full-DTI).

The various types of CMOS image sensors described above respectively have the following advantages and disadvantages.

If CMOS image sensors using the "white/clear" filter technology in the color matrix are actually used in strong light environment, the white signal is saturated and first clipped by the corresponding ADC code. After this, color reproducibility is destroyed while the other signals such as R, G, and B signals are still changing. The difference in saturation point results in poor performance under high illuminance.

Single-chip wide dynamic range (DR) CMOS image sensors, to which LOFIC-based saturation point optimization is applied, have demonstrated good color reproduction quality and high sensitivity in the visible wavelength band. CMOS image sensors employing the LOFIC architecture can have maximized dynamic range, thereby achieving optimized capacitance value of each color pixel depending on the sensitivity.

CMOS image sensors employing the pixel size reduction technique and HDR technology have pixel circuits where the FD-shared PD layout and overflow direction control are applied. Although this allows further reduction in pixel size, the LOFIC configuration is used for the HDR and it is difficult to hold overflow signal charges from the respective photodiodes PDs at the floating diffusion FD (FD node).

CMOS image sensors employing the full DTI structure face major challenges in scaling back-illuminated pixels, including how to control crosstalk to fall within acceptable limits. Without proper arrangement of highly advanced DTI structures, the crosstalk issue may serve as a limiting factor.

The following further discusses issues related to the pixel size and crosstalk. According to the above-described two- or four-pixel sharing configuration, every two or four pixels can share their pixel components, so that the photodiode PD in each pixel can have a maximized size. This can contribute to reduce the pixel size while the sensitivity and well capacity remain unchanged.

In the case of the four-pixel sharing configuration, however, the floating diffusion FD has a large area. This disadvantageously increases the capacitance of the floating diffusion FD, which lowers the conversion gain and increases the noise.

According to the basic sharing pixel layout, the photodiodes PD are radially arranged around the floating diffusion FD. Requiring electrical connection, the reset transistor RST-Tr is connected to the floating diffusion FD of a different node formed in a nearby region in the pixels. This in turn increases the junction capacitance and the wiring capacitance for electrical connection, which disadvantageously increases the capacitance (Cfd) of the FD node, reduces the conversion gain and compromises the noise characteristics.

Generally, the signal (overflow charges) exceeding the charges that can be stored on a certain photodiode PD may flow into adjacent pixels, which can result in mixing of charges (causing a false signal). To prevent this, the overflow charges are guided to flow into the connected floating diffusion FD before leaking out into adjacent pixels. When this configuration is applied, a false signal may be generated while the charges in the floating diffusion FD are being read out if charges leak into the floating diffusion from the pixels that share the floating diffusion FD. Taking the Bayer array as an example, overflow charges of the G signal may leak while the R signal is being read out. In this case, the charges may mix together at the floating diffusion FD serving as an output node.

Conventional CMOS image sensors with the sharing configuration described above encounter difficulties in employing white in the color matrix. Specifically, the photo-responsiveness can hardly be maximized, low optical SNR can hardly be achieved in addition to reproducibility. Due to these technical limitations, it is difficult to further reduce the pixel size.

SUMMARY

An object of the present disclosure is to provide a solid-state imaging device, a method for manufacturing a solid-state imaging device and an electronic apparatus that are capable of not only reducing the size of the pixels while keeping the sensitivity and well capacity unchanged but also preventing an increase in junction capacitance and wiring capacitance, preventing an increase in the capacitance of the floating diffusion serving as an output node, preventing a drop in conversion gain, and eventually achieving improved noise characteristics, and also preventing the charges of different pixels from mixing together at the floating diffusion. Another object of the present disclosure is to provide a solid-state imaging device, a method for manufacturing a solid-state imaging device and an electronic apparatus that are capable of achieving maximized photo-responsiveness, ensuring low optical SNR in addition to reproducibility, and further reducing the pixel size, thereby efficiently improving important performance factors such as the dynamic range, responsiveness, and resolution.

A first aspect of the disclosure provides a solid-state imaging device including: a pixel part including sharing pixels arranged therein; and a reading part for reading a pixel signal from each sharing pixel in the pixel part. The each sharing pixel has: at least two photoelectric conversion elements for storing therein charges generated by photoelectric conversion; at least two transfer elements for individually transferring the charges stored in the respective photoelectric conversion elements; and a floating diffusion to which the charges stored in each of the photoelectric conversion elements are transferred through a corresponding one of the transfer elements. One floating diffusion is shared between the photoelectric conversion elements and between the transfer elements, a charge transfer path part extending from at least a first one of the photoelectric conversion elements to the floating diffusion via one of the transfer elements has an overflow path part for allowing a saturation signal to overflow from the first photoelectric conversion element into the floating diffusion, a charge transfer path part extending from at least a second one of the photoelectric conversion elements to a region that is not occupied by the floating diffusion has a charge discharge path part for allowing a saturation signal to be discharged from the second photoelectric conversion element into the region that is not occupied by the floating diffusion, a first saturation signal from one of the photoelectric conversion elements is transferred to the floating diffusion via one of the transfer elements, and a second saturation signal from a different one of the photoelectric conversion elements is discharged through the charge discharge path part.

A second aspect of the disclosure provides a method for manufacturing a solid-state imaging device including: a pixel part including sharing pixels arranged therein; and a reading part for reading a pixel signal from each sharing pixel in the pixel part. The each sharing pixel has: at least two photoelectric conversion elements for storing therein charges generated by photoelectric conversion; at least two transfer elements for individually transferring the charges stored in the respective photoelectric conversion elements; and a floating diffusion to which the charges stored in each of the photoelectric conversion elements are transferred through a corresponding one of the transfer elements, and one floating diffusion is shared between the photoelectric conversion elements and between the transfer elements. In a charge transfer path part extending from at least a first one of the photoelectric conversion elements to the floating diffusion via one of the transfer elements, an overflow path part for allowing a saturation signal to overflow from the first photoelectric conversion element into the floating diffusion is formed. In a charge transfer path part extending from at least a second one of the photoelectric conversion elements to a region that is not occupied by the floating diffusion, a charge discharge path part for allowing a saturation signal to be discharged from the second photoelectric conversion element into the region that is not occupied by the floating diffusion is formed. The overflow path part is formed such that a first saturation signal from one of the photoelectric conversion elements is transferred to the floating diffusion via one of the transfer elements, and the charge discharge path part is formed such that a second saturation signal from a different one of the photoelectric conversion elements is discharged through the charge discharge path part.

A third aspect of the disclosure provides an electronic apparatus including: a solid-state imaging device; and an optical system for forming a subject image on the solid-state imaging device. The solid-state imaging device includes: a pixel part including sharing pixels arranged therein; and a reading part for reading a pixel signal from each sharing pixel in the pixel part. The each sharing pixel has: at least two photoelectric conversion elements for storing therein charges generated by photoelectric conversion; at least two transfer elements for individually transferring the charges stored in the respective photoelectric conversion elements; and a floating diffusion to which the charges stored in each of the photoelectric conversion elements are transferred through a corresponding one of the transfer elements. One floating diffusion is shared between the photoelectric conversion elements and between the transfer elements, a charge transfer path part extending from at least a first one of the photoelectric conversion elements to the floating diffusion via one of the transfer elements has an overflow path part for allowing a saturation signal to overflow from the first photoelectric conversion element into the floating diffusion, a charge transfer path part extending from at least a second one of the photoelectric conversion elements to a region that is not occupied by the floating diffusion has a charge discharge path part for allowing a saturation signal to be discharged from the second photoelectric conversion element into the region that is not occupied by the floating diffusion, a first saturation signal from one of the photoelectric conversion elements is transferred to the floating diffusion via one of the transfer elements, and a second saturation signal from a different one of the photoelectric conversion elements is discharged through the charge discharge path part.

ADVANTAGEOUS EFFECTS

The present disclosure can not only reduce the size of the pixels while keeping the sensitivity and full well capacity unchanged but also prevent an increase in junction capacitance and wiring capacitance, prevent an increase in the capacitance of the floating diffusion serving as an output node, prevent a drop in conversion gain and eventually achieve improved noise characteristics, and also prevent the charges of different pixels from mixing together at the floating diffusion. Furthermore, the disclosure can achieve maximized photo-responsiveness, ensure low optical SNR in addition to reproducibility, and further reduce the pixel size, thereby efficiently improving important performance factors such as the dynamic range, responsiveness, and resolution.

BRIEF DESCRIPTION OF THE DRAWINGS

FIG. 7 is a simplified plan view illustrating, as an example, how transistors, capacitors and other components are arranged when a single floating diffusion FD is shared by two photodiodes in a single photoelectric conversion reading part relating to the first embodiment.

FIG. 9 is used to illustrate examples of a full DTI structure pattern in a FD shared pixel in the solid-state imaging device relating to the first embodiment of the present disclosure.

FIG. 11 is used to illustrate example configurations of a color matrix applicable in the first embodiment of the present disclosure.

FIG. 18 shows an example of a read-out operation applicable to the sharing pixel of the solid-state imaging device relating to the first embodiment of the present disclosure, showing an example of a circuitry of the sharing pixel, a timing chart and potential transition.

FIG. 23 is used to illustrate example patterns of a full DTI structure in a FD shared pixel in the solid-state imaging device relating to the second embodiment of the present disclosure.

FIG. 24 is used to illustrate a block Bayer configuration and a color filter configuration applicable in the second embodiment of the present disclosure.

FIG. 32 shows an example reading system for a pixel circuit with shutter function that has a 2×2 block Bayer configuration and in which four photodiodes PDs share one floating diffusion FD, where all overflow signals are used.

FIG. 40 shows an example of a read-out operation with LOFIC and SEHDR being fully utilized applicable to the solid-state imaging device relating to the second embodiment of the present disclosure.

FIG. 41 shows an example of a read-out operation with SEHDR and with LOFIC being partially utilized applicable to the solid-state imaging device relating to the second embodiment of the present disclosure.

DESCRIPTION OF THE PREFERRED EMBODIMENTS

Embodiments of the present disclosure will be hereinafter described with reference to the drawings.

First Embodiment

Figure 2:
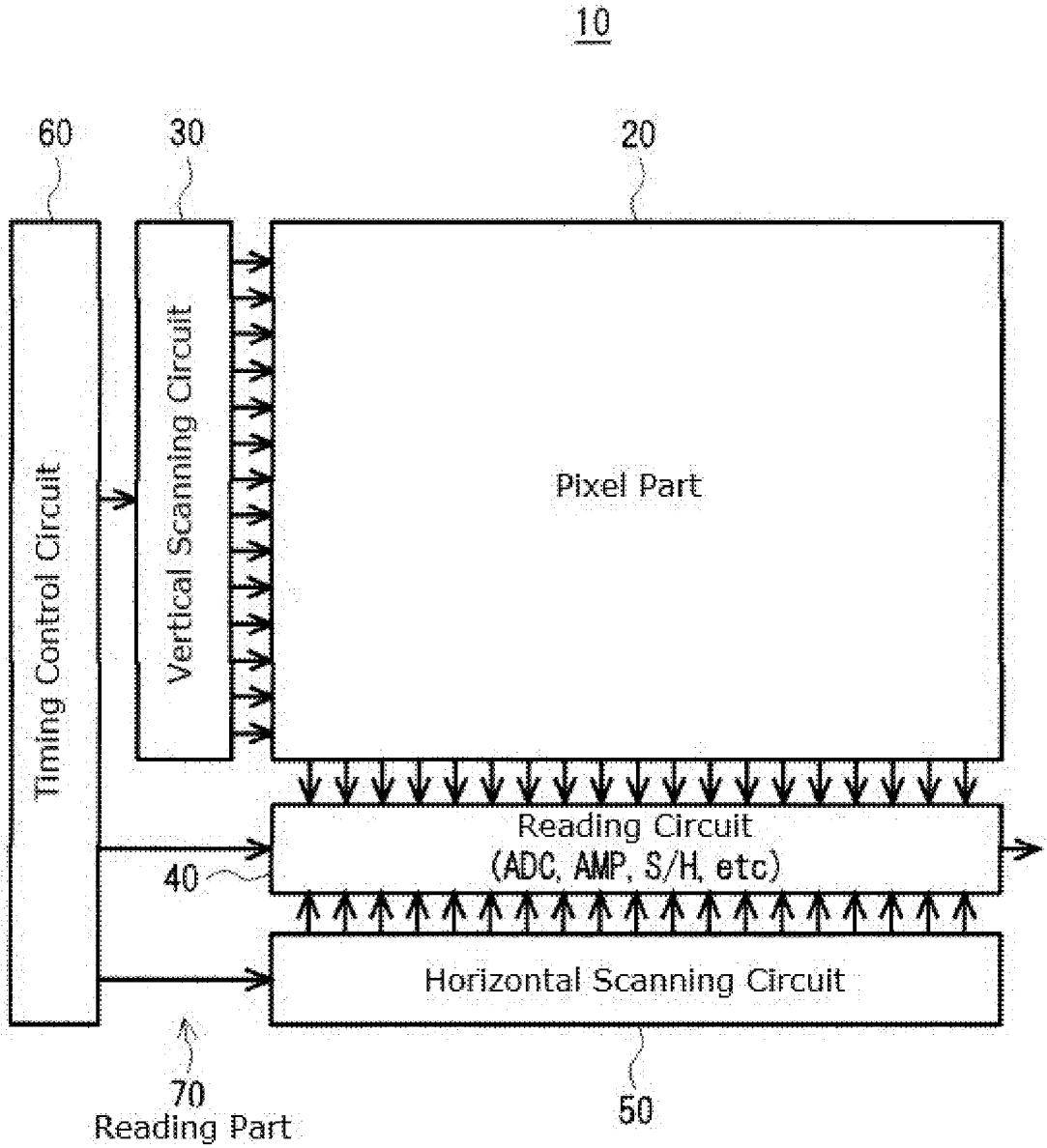
FIG. 2 is a block diagram showing an example configuration of a solid-state imaging device according to a first embodiment of the present disclosure.
Figure 3:
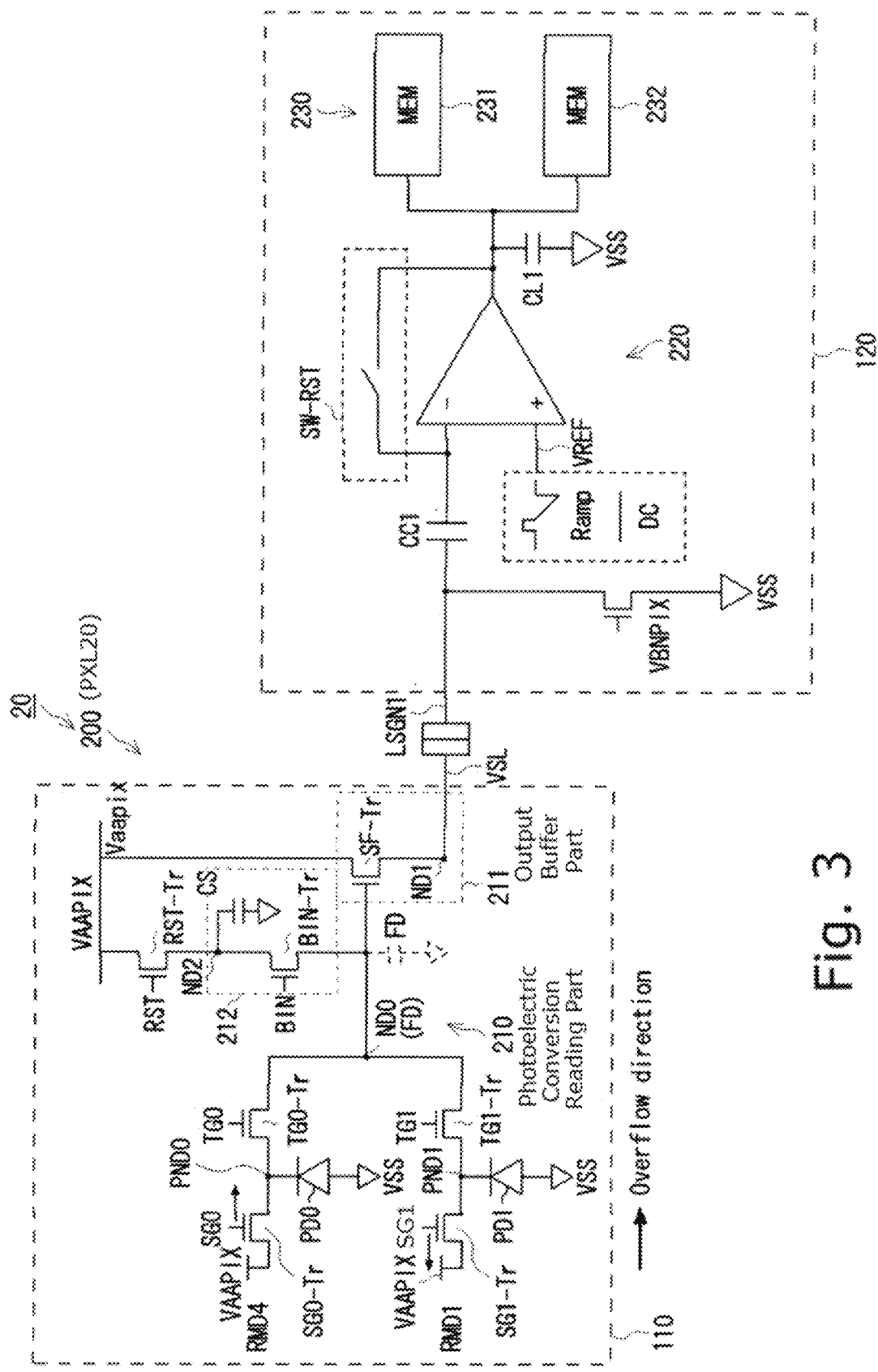
FIG. 3 is a circuit diagram showing an example of a sharing pixel of the solid-state imaging device relating to the first embodiment of the present disclosure.

FIG. 2 is a block diagram showing an example configuration of a solid-state imaging device relating to a first embodiment of the present disclosure. FIG. 3 is a circuit diagram showing an example of a sharing pixel of the solid-state imaging device relating to the first embodiment of the present disclosure. In this embodiment, a solid-state imaging device 10 is constituted by, for example, a CMOS image sensor.

As shown in FIG. 2, the solid-state imaging device 10 is constituted mainly by a pixel part 20 serving as an image capturing part, a vertical scanning circuit (a row scanning circuit) 30, a reading circuit (a column reading circuit) 40, a horizontal scanning circuit (a column scanning circuit) 50, and a timing control circuit 60.

Among these components, for example, the vertical scanning circuit 30, the reading circuit 40, the horizontal scanning circuit 50, and the timing control circuit 60 constitute a reading part 70 for reading out pixel signals.

According to the first embodiment, the solid-state imaging device 10 has pixels (or the pixel part 20) arranged in a matrix pattern in the pixel part 20, as will be described in detail below. The pixels are configured such that every two photoelectric conversion elements (photodiodes: PDs) and every two transfer elements (transfer transistors) share one floating diffusion FD serving as an output node and one source follower element (source follower transistor) constituting an output buffer. The floating diffusion FD is placed at the center of the element formation area of the sharing pixel, and the photoelectric conversion elements are arranged radially (in the vertical (Y) direction in the present embodiment) around the floating diffusion FD.

The sharing pixel of the solid-state imaging device 10 relating to the present embodiment has the following characteristic features to not only reduce the pixel size while keeping the sensitivity and full well capacity unchanged but also prevent an increase in junction capacitance and wiring capacitance, to prevent an increase in capacitance of the floating diffusion serving as an output node, to prevent a drop in conversion gain, and to eventually achieve improved noise characteristics, and to achieve maximized photo-responsiveness, to ensure low optical SNR in addition to reproducibility, and to further reduce the pixel size, and to efficiently improve important performance factors such as the dynamic range, responsiveness, and resolution.

The following first briefly describes characteristic configurations of the solid-state imaging device 10 relating to the first embodiment, such as the sharing pixel and the color filter matrix of the pixel part, and then moves onto detailed description of the configurations and functions such as the configuration of the sharing pixel and arrangement.

Overview of Characteristic Configurations of Solid-State Imaging Device 10 Relating to First Embodiment, e.g., Sharing Pixel In the solid-state imaging device 10 relating to the first embodiment, the sharing pixel PXL20 has a shared FD structure including a first photodiode PD0 and a second photodiode PD1, where a first saturation signal beyond saturation in the first photodiode PD0 is fully transferred to the floating diffusion FD (overflow). In the sharing pixel PXL20, an overflow signal from the other PD or the second photodiode PD1 to the floating diffusion FD is released (discharged) to the drain of the shutter gate SG (AB) on the other side. Therefore, no overflow signal flows into the floating diffusion FD. Accordingly, while the FD is shared in the sharing pixel PXL20, no overflow signal mixing happens and no signal crosstalk resultantly takes place.

The photodiodes PD0 and PD1 each have two transfer gates connected thereto, so that the stored charges can be individually discharged to individually control the integration time. In addition, the overflow direction can be controlled so that the overflow signal does not mix into the floating diffusion FD, as mentioned above.

The sharing pixel PXL20 includes a floating diffusion FD shared between the first and second photodiodes PD0 and PD1, transfer transistors TG-Tr, a reset transistor RST-Tr, a binning (BIN) transistor BIN-Tr, and a source follower (SF) transistor SF-Tr.

The photodiodes PD (0,1) are each formed by a pinned photodiode having a transfer transistor TG-Tr being connected to transfer charges to the floating diffusion FD. The reset transistor RST-Tr is connected to forcibly set the floating diffusion FD to a reset level (Vrst) before the charges are transferred. The electrons produced by the photoelectric conversion are stored in the photodiodes PD and transferred to the floating diffusion FD via the transfer transistors TG-Tr.

A sequence of operations performed for read out in the first embodiment may start with a PD read-out signal Qpd0, which is read first from the PDs. Subsequently, an overflow signal Qfd, which is read second and can be used as a storage node, follows. This can extend the total amount of photo charges to be processed. After this, a PD signal Qpd1 is read out, which is read second from the PDs. Thus, the total amount of photo charges is determined by the charges (Qpd1+Qfd) from the first photodiode PD0 and the charges Qpd1 from the second photodiode PD1.

The signals representing the stored photo charges can be each read out within a single frame using a pair of memories for the corresponding signal provided in a column- or pixel-wise ADC. Such multi-node multi-gain readout scheme can accomplish extended dynamic range, so that signals can be reliably produced over a wide range from low illuminance (high gain) to bright light (low gain).

ADC conversion may occur for each signal representing the stored photo charges, and at least two or more ADC conversions are available for different conversion gains. These digital codes can be linearized after post data processing.

In the sharing pixel PXL20, one of the PDs can have a large full well capacitance (FWC). Therefore, a high-transmittance color filter is applied to the first photodiode PD0, from which the overflow photo charges are stored in the floating diffusion FD. A low-transmittance color filter is applied to the second photodiode PD1, which only stores a focused pixel PD in which corresponding photo charges are accumulated.

In this way, the first photodiode PD0 can achieve an enlarged maximum photo area, so that the signal ratio can remain unchanged due to high saturation.

The color matrix has an RBW configuration typified as follows. The highest transmittance filter or the clear (W) filter can be allocated to the first photodiode PD0 to extend the signal response coverage, so that all signals from the photodiode PD0 can saturate. The low transmittance filter or the R or B filter can be assigned to the second photodiode PD1. Accordingly, the signal response coverage of the single photodiode PD0 can be sufficiently extended, to ensure color reproducibility for all pixels while significantly reducing the pixel size.

Since the shared FD configuration is employed, the pixels can be formed above a back sided isolation (BSI) structure including a partially open full DTI, which can prevent color signal crosstalk between the photodiodes PDs.

The above has briefly described the characteristic features of the solid-state imaging device 10 relating to the first embodiment, such as the sharing pixel and the color filter matrix of the pixel part. The following now provides detailed description of the configurations and functions of the solid-state imaging device 10 relating to the first embodiment, such as the signal read-out scheme, the configuration of the sharing pixel, and the arrangement.

Example of Signal Read-Out Scheme

The following now describes an example of how to read the signals in the solid-state imaging device 10 relating to the first embodiment.

In the solid-state imaging device 10 relating to the first embodiment, the pixel part 20 includes pixels, and each pixel includes a photoelectric conversion reading part, an analog-to-digital (AD) converting part, and a memory part. The solid-state imaging device 10 is configured, for example, as a stacked CMOS image sensor. The solid-state imaging device 10 may be configured to be capable of operating in a global shutter mode. In the solid-state imaging device 10 relating to the first embodiment, as will be described in detail below, each pixel has an analog-to-digital (AD) converting function, and the AD converting part includes a comparator for comparing the voltage signal read out by the photoelectric conversion reading part against a referential voltage to analog-to-digital (AD) convert the read-out voltage signal VSL and outputting a resulting digital comparison result signal.

Under the control of the reading part 70, the comparator performs a first comparing operation and a second comparing operation. The first comparing operation is designed to output a digital first comparison result signal obtained by processing the voltage signal corresponding to the overflow charges that overflow from the photoelectric conversion element to the output node (floating diffusion) in an integration (exposure) period. The second comparing operation is designed to output a digital second comparison result signal obtained by processing the voltage signal corresponding to the charges stored in the photoelectric conversion element that are transferred to the output node in a transfer period following the integration period.

If irregular and strong light enters the photoelectric conversion element during the second comparing operation, unnecessary charges may be released from the photoelectric conversion element to a region where the floating diffusion FD is not formed. For this purpose, the pixel relating to the present embodiment includes a shutter gate (SG) for preventing a change in the level of the floating diffusion. Such a change in the FD level may be caused if charges overflow from the photoelectric conversion element into the floating diffusion FD. The shutter gate can prevent a change in the FD level even if irregular and strong light enters the photoelectric conversion element during the second comparing operation. Accordingly, the AD conversion can be successfully performed.

In the solid-state imaging device 10 relating to the first embodiment, the reading part 70 stores data obtained by reading and AD converting a pixel signal from a digital pixel in the following manner, in order to allow the pixel to achieve increased dynamic range, which can be done by performing the reading in a predetermined mode, while having a small pixel size.

In the solid-state imaging device 10, the comparator is configured to be capable of, under the control of the reading part 70, performing a comparing operation on read-out signals read in at least two different modes through different sequences of operations for reading performed on the charges stored in different photoelectric conversion elements. More specifically, the comparator is connected to a single photoelectric conversion reading part (pixel) in which two different photodiodes (photoelectric conversion elements) PD share a single floating diffusion FD, which serves as an output node, and is configured to be capable of performing a comparing operation on read-out signals read in at least two modes through different sequences of operations for reading performed on the charges stored on the different photodiodes PD in the same photoelectric conversion reading part. Alternatively, the comparator is connected to a selected one of a plurality of photoelectric conversion reading parts, each of which includes one or more (in the present example, two) photodiodes PDs, so that the single comparator is shared between the photoelectric conversion reading parts. In this way, the comparator is configured to be capable of performing a comparing operation on read-out signals read in at least two different modes through different sequences of operations for reading performed on the charges stored in the different photodiodes PD0 and PD1 in different photoelectric conversion reading parts.

In the present embodiment, the reading part 70 can read the pixel signals in at least two reading modes, which are selected from among at least four different reading modes: a first reading mode RMD1, a second reading mode RMD2, a third reading mode RMD3 and a fourth reading mode RMD4.

In the first reading mode RMD1, the reading part 70 can perform a second conversion gain reset reading operation LCGRRD of reading, in a reset reading period PRRD following a reset period PR, from the output buffer part, a read-out reset signal LCGVRST resulting from conversion performed with a second conversion gain (for example, low conversion gain: LCG) corresponding to a second amount of charges in the output node (floating diffusion) and performing a comparing operation at the comparator on the read-out reset signal LCGVRST. Furthermore, in the first reading mode RMD1, the reading part 70 can perform a second conversion gain reading operation LCGSRD of reading, in a reading period PRD following a transfer period PT after the reset reading period PRRD, from the output buffer part, a read-out signal LCGVSIG resulting from conversion performed with the second conversion gain corresponding to the second amount of charges in the output node and performing a comparing operation at the comparator on the read-out signal LCGVSIG.

In the first reading mode RMD1, the reading part 70 can perform a first conversion gain reset reading operation HCGRRD of reading, in the reset reading period PRRD following the reset period PR, from the output buffer part, a read-out reset signal HCGVRST resulting from conversion performed with a first conversion gain (for example, high conversion gain: HCG) corresponding to a first amount of charges in the output node (floating diffusion) and performing a comparing operation at the comparator on the read-out reset signal HCGVRST. Furthermore, in the first reading mode RMD1, the reading part 70 can perform a first conversion gain reading operation HCGSRD of reading, in the reading period PRD following the transfer period PT after the reset reading period PRRD, from the output buffer part, a read-out signal HCGVSIG resulting from conversion performed with the first conversion gain corresponding to the first amount of charges in the output node and performing a comparing operation at the comparator on the read-out signal HCGVSIG.

In the second reading mode RMD2, the reading part 70 can perform the second conversion gain reset reading operation LCGRRD of reading, in the reset reading period PRRD following the reset period PR, from the output buffer part, the second read-out reset signal LCGVRST resulting from conversion performed with the second conversion gain corresponding to the second amount of charges in the output node and performing a comparing operation at the comparator on the second read-out reset signal LCGVRST. Furthermore, in the second reading mode RMD2, the reading part 70 can use a gain switching part to switch the gain and perform the first conversion gain reset reading operation HCGRRD of reading, from the output buffer part, the first read-out reset signal HCGVRST resulting from conversion performed with the first conversion gain corresponding to the first amount of charges in the output node and performing a comparing operation at the comparator on the first read-out reset signal HCGVRST. Furthermore, in the second reading mode RMD2, the reading part 70 can perform the first conversion gain reading operation HCGSRD of reading, in a first reading period PRD1 following a first transfer period PT1 after the reset reading period PRRD, from the output buffer part, the first read-out signal HCGVSIG resulting from conversion performed with the first conversion gain corresponding to the first amount of charges in the output node and performing a comparing operation at the comparator on the first read-out signal HCGVSIG. Furthermore, in the second reading mode RMD2, the reading part 70 uses the gain switching part to switch the gain after the first reading period PRD1 and can perform the second conversion gain reading operation LCGSRD of reading, in a second reading period PRD2 following a second transfer period PT2 after the first reading period PRD1, from the output buffer part, the second read-out signal LCGVSIG resulting from conversion performed with the second conversion gain corresponding to the second amount of charges in the output node and performing a comparing operation at the comparator on the second read-out signal LCGVSIG.

In a third reading mode RMD3, the reading part 70 can perform the first conversion gain reset reading operation HCGRRD of reading, in a first reset reading period PRRD1 following a first reset period PR1, from the output buffer part, the first read-out reset signal HCGVRST resulting from conversion performed with the first conversion gain corresponding to the first amount of charges in the output node and performing a comparing operation at the comparator on the first read-out reset signal HCGVRST. Furthermore, in the third reading mode RMD3, the reading part 70 can perform the first conversion gain reading operation HCGSRD of reading, in the first reading period PRD1 following the first transfer period PT1 after the first reset reading period PRRD1, from the output buffer part, the first read-out signal HCGVSIG resulting from conversion performed with the first conversion gain corresponding to the first amount of charges in the output node and performing a comparing operation at the comparator on the first read-out signal HCGVSIG. Furthermore, in the third reading mode RMD3, the reading part 70 uses the gain switching part to switch the gain after the first reading period PRD1 and can perform the second conversion gain reading operation LCGSRD of reading, in the second reading period PRD2 following the second transfer period PT2 after the first reading period PRD1, from the output buffer part, a second read-out signal LCGVSIG resulting from conversion performed with the second conversion gain corresponding to the second amount of charges in the output node and performing a comparing operation at the comparator on the second read-out signal LCGVSIG. In the third reading mode RMD3, the reading part 70 can perform the second conversion gain reset reading operation LCGRSD of reading, in the second reset reading period PRRD2 following the second reset period PR2 after the second reading period PRD2, from the output buffer part, a second read-out reset signal LCGVRST resulting from conversion performed with the second conversion gain corresponding to the second amount of charges in the output node and performing a comparing operation at the comparator on the second read-out reset signal LCGVRST.

In the fourth reading mode RMD4, the reading part 70 uses the clock to count the time required, when irregular and strong light enters the photoelectric conversion elements, to allow the overflow charges to change the potential at the output node (the floating diffusion FD) and to eventually invert the output from the comparator, so that the reading part 60 can predict the amount of the signal. The reading part 60 can perform the first conversion gain reset reading operation HCGRRD of reading, in the first reset reading period PRRD1, from the output buffer part, a first read-out reset signal HCGVRST resulting from conversion performed with the first conversion gain corresponding to the first amount of charges in the output node and performing a comparing operation at the comparator on the first read-out reset signal HCGVRST. Furthermore, in the fourth reading mode RMD4, the reading part 70 can perform the first conversion gain reading operation HCGSRD of reading, in a first reading period PRD1 following a first transfer period PT1 after the first reset reading period PRRD1, from the output buffer part, the first read-out signal HCGVSIG resulting from conversion performed with the first conversion gain corresponding to the first amount of charges in the output node and performing a comparing operation at the comparator on the first read-out signal HCGVSIG. Furthermore, in the fourth reading mode RMD4, the reading part 70 uses the gain switching part to switch the gain after the first reading period PRD1 and can perform the second conversion gain reading operation LCGSRD of reading, in a second reading period PRD2 following a second transfer period PT2 after the first reading period PRD1, from the output buffer part, the second read-out signal LCGVSIG resulting from conversion performed with the second conversion gain corresponding to the second amount of charges in the output node and performing a comparing operation at the comparator on the second read-out signal LCGVSIG. Furthermore, in the fourth reading mode RMD4, the reading part 70 can perform the second conversion gain reset reading operation LCGRSD of reading, in a second reset reading period PRRD2 following a second reset period PR2 after the second reading period PRD2, from the output buffer part, the second read-out reset signal LCGVRST resulting from conversion performed with the second conversion gain corresponding to the second amount of charges in the output node and performing a comparing operation at the comparator on the second read-out reset signal LCGVRST.

The following outlines the configurations and functions of the parts of the solid-state imaging device 10. In particular, the configurations and functions of the pixel part 20 and pixels and the relating read-out operation will be described in detail, and other features will be also described in detail.

Example Configuration of Sharing Pixel PXL20

FIG. 3 is a circuit diagram showing an example of the sharing pixel of the solid-state imaging device 10 relating to the first embodiment of the present disclosure.

In the pixel part 20, a plurality of pixels 200 (sharing pixels PXL20) are arranged in a matrix of N rows and M columns.

The sharing pixels PXL20 relating to the first embodiment each include a photoelectric conversion reading part 210, an AD converting part 220, and a memory part 230. The pixel part 20 relating to the first embodiment is configured as a stacked CMOS image sensor made up by a first substrate 110 and a second substrate 120. In the present example, as shown in FIG. 3, the photoelectric conversion reading part 210 is formed in the first substrate 110, and the AD converting part 220 and the memory part 230 are formed in the second substrate 120.

The photoelectric conversion reading part 210 of the sharing pixel PXL20 includes two photodiodes (photoelectric conversion elements) and one in-pixel amplifier. More specifically, the photoelectric conversion reading part 210 includes, for example, a first photodiode PD1, which is a first photoelectric conversion element and a second photodiode PD1, which is a second photoelectric conversion element. In the sharing pixel PXL20 relating to the first embodiment, the first and second photodiodes PD0 and PD1 share the floating diffusion FD, which serves as an output node ND0.

The first and second photodiodes PD0 and PD1 perform photoelectric conversion to generate charges and store the generated charges in an integration period. A first transfer transistor TG0-Tr, which serves as a first transfer element, is connected between the storing part PND0 of the first photodiode PD0 and the floating diffusion FD, and a first shutter gate transistor SG0-Tr, which serves as a first charge overflow gate element, is connected between the storing part PND0 and a predetermined fixed potential VAAPIX. A second transfer transistor TG1-Tr, which serves as a second transfer element, is connected between the storing part PND1 of the second photodiode PD1 and the floating diffusion FD, and a second shutter gate transistor SG1-Tr, which serves as a second charge overflow gate element, is connected between the storing part PND1 and the predetermined fixed potential VAAPIX.

The photoelectric conversion reading part 210 includes, for the floating diffusion FD serving as the single output node ND0, one reset transistor RST-Tr serving as a reset element, one source follower transistor SF-Tr serving as a source follower element, one storage transistor BIN-Tr serving as a storing element, one storage capacitor CS serving as a storing capacitance element, and one reading node ND1. The photoelectric conversion reading part 210 can further include a selection transistor SEL-Tr serving as a selecting element.

In the first embodiment, the source follower transistor SF-Tr and the reading node ND1 together constitute an output buffer part 211. The storage transistor BIN-Tr and the storage capacitor CS together constitute a gain switching part 212.

In the photoelectric conversion reading part 210 relating to the first embodiment, the reading node ND1 of the output buffer part 211 is connected to the input part of the AD converting part 220. The photoelectric conversion reading part 210 converts the charges in the floating diffusion FD serving as an output node into a voltage signal at a level corresponding to the amount of the charges and outputs the voltage signal VSL to the AD converting part 220.

Under the control of the reading part 70, the photoelectric conversion reading part 210 relating to the first embodiment reads the charges stored in the first photodiode PD0 serving as the first photoelectric conversion element, in the fourth reading mode RMD4 or third reading mode RMD3. Following this, the photoelectric conversion reading part 210 reads the charges stored in the second photodiode PD1 serving as the second photoelectric conversion element, in the first reading mode RMD1 or second reading mode RMD2. In the first embodiment, the charges stored in the first photodiode PD0 serving as the first photoelectric conversion element are read out in the fourth reading mode RMD4, and the charges stored in the second photodiode PD1 serving as the second photoelectric conversion element are read out in the second reading mode RMD2.

For example, the photoelectric conversion reading part 210 outputs, in a first comparing operation period PCMP1 of the AD converting part 220, a voltage signal VSL corresponding to the overflow charges overflowing from the photodiode PD0, which is a photoelectric conversion element, to the floating diffusion FD serving as an output node in an integration period PI.

Furthermore, the photoelectric conversion reading part 210 outputs, in a second comparing operation period PCMP2 of the AD converting part 220, a voltage signal VSL corresponding to the charges stored in the photodiode PD1 that are transferred to the floating diffusion FD serving as an output node in a transfer period PT following the integration period PI. The photoelectric conversion reading part 210 outputs a read-out reset signal (signal voltage) (VRST) and a read-out signal (signal voltage) (VSIG), as a pixel signal, to the AD converting part 220 in the second comparing operation period PCMP2.

The first and second photodiodes PD0 and PD1 generate signal charges (electrons) in an amount determined by the amount of the incident light and stores the same. Description will be hereinafter given of a case where the signal charges are electrons and each transistor is an n-type transistor. However, it is also possible that the signal charges are holes or each transistor is a p-type transistor.

The photodiodes (PDs) in the sharing pixel PXL20 are pinned photodiodes (PPDs). On the substrate surface for forming the photodiodes (PDs), there is a surface level due to dangling bonds or other defects, and therefore, a lot of charges (dark current) are generated due to heat energy, so that the signals fail to be read out correctly. The pinned photodiodes (PPD) have the charge storage part buried in the substrate, thereby reducing mixing of the dark current into the signals.

The first transfer transistor TG0-Tr of the photoelectric conversion reading part 210 is connected between the storing part PND0 of the first photodiode PD0 and the floating diffusion FD and controlled by a control signal TG0 applied to the gate thereof through a control line. The first transfer transistor TG0-Tr remains selected and in the conduction state during a transfer period PT in which the control signal TG0 is at the high (H) level, to transfer to the floating diffusion FD the charges (electrons) produced by the photoelectric conversion and then stored in the first photodiode PD0. After the first photodiode PD0 and the floating diffusion FD are reset to a predetermined reset potential, the first transfer transistor TG0-Tr enters the non-conduction state with the control signal TG0 being set to the low (L) level and the first photodiode PD0 enters an integration period PI. Under these circumstances, if the intensity of the incident light is very high (the amount of the incident light is very large), the charges above the well capacity overflow into the floating diffusion FD as overflow charges through the overflow path under the first transfer transistor TG0-Tr.

The first shutter gate transistor SG0-Tr serving as the first charge overflow gate element is connected between the storing part PND0 of the first photodiode PD0 and the predetermined fixed potential VAAPIX and controlled by a control signal SG0 applied thereto through a control line. The first shutter gate transistor SG0-Tr remains selected and in the conduction state during the period in which the control signal SG0 is at the H level, to form a charge release (discharge) path providing for antiblooming function between the charge storing part PND0 of the first photodiode PD0 and the predetermined fixed potential VAAPIX. In this way, unnecessary charges are released to the fixed potential VAAPIX.

As described above, the first transfer transistor TG0-Tr and the first shutter gate transistor SG0-Tr are driven and controlled at individually selected timings.

The second transfer transistor TG1-Tr of the photoelectric conversion reading part 210 is connected between the storing part PND1 of the second photodiode PD1 and the floating diffusion FD and controlled by a control signal TG1 applied to the gate thereof through a control line. The second transfer transistor TG1-Tr remains selected and in the conduction state during a transfer period PT in which the control signal TG1 is at the high (H) level, to transfer to the floating diffusion FD the charges (electrons) produced by the photoelectric conversion and then stored in the second photodiode PD1. After the second photodiode PD1 and the floating diffusion FD are reset to a predetermined reset potential, the second transfer transistor TG1-Tr enters the non-conduction state with the control signal TG1 being set to the low (L) level and the second photodiode PD1 enters an integration period PI. Under these circumstances, if the intensity of the incident light is very high (the amount of the incident light is very large), the charges above the well capacity overflow into the fixed potential VAAPIX as overflow charges through the overflow path under the second shutter gate transistor SG1-Tr.

The second shutter gate transistor SG1-Tr serving as the second charge overflow gate element is connected between the storing part PND1 of the second photodiode PD1 and the predetermined fixed potential VAAPIX and controlled by a control signal SG1 applied thereto through a control line 1. The second shutter gate transistor SG1-Tr remains selected and in the conduction state during the period in which the control signal SG1 is at the H level, to form a charge release (discharge) path providing for antiblooming function between the charge storing part PND1 of the second photodiode PD1 and the predetermined fixed potential VAAPIX. In this way, unnecessary charges are released to the fixed potential VAAPIX.

As described above, the second transfer transistor TG1-Tr and the second shutter gate transistor SG1-Tr are driven and controlled at individually selected timings.

The reset transistor RST-Tr is connected between the power supply line Vaapix of the power supply voltage VAAPIX and the floating diffusion FD and controlled by a control signal RST applied to the gate thereof through a control line. The reset transistor RST-Tr remains selected and in the conduction state during a reset period in which the control signal RST is at the H level, to reset the floating diffusion FD to the potential (Vrst) of the power supply line Vaapix of the power supply voltage VAAPIX.

The storage transistor BIN-Tr is connected between the floating diffusion FD and the reset transistor RST-Tr, and the storage capacitor CS is connected between a connection node ND2 and the reference potential VSS. The storage transistor BIN-Tr is controlled by a control signal BIN applied to the gate thereof through a control line. The storage transistor BIN-Tr remains selected and in the conduction state during a reset period in which the control signal BIN is at the H level so as to connect the floating diffusion FD and the storage capacitor CS.

The first conversion gain signal reading operation HCGSRD is performed while the storage transistor BIN-Tr remains in the non-conduction state, so that the charges in the floating diffusion FD serving as the output node ND0 are separated from the charges in the storage capacitor CS. The second conversion gain signal reading operation LCGSRD is performed while the storage transistor BIN-Tr remains in the conduction state, so that the charges of the floating diffusion FD1 serving as the output node ND0 are combined with the charges in the storage capacitor CS. The second conversion gain reset reading operation LCGRRD is performed while the reset transistor RST-Tr and the storage transistor BIN-Tr remain in the conduction state, so that the charges of the floating diffusion FD serving as the output node ND and the charges of the storage capacitor CS are cleared.

The source follower transistor SF-Tr serving as a source follower element is connected at the source thereof to the reading node ND1, at the drain thereof to the power supply line Vaapix, and at the gate thereof to the floating diffusion FD. The output node ND1 forming the output buffer part 211 is connected to a signal line LSGN1, which is connected to the input part of the AD converting part 220. The drain and source of the current transistor IC-Tr serving as a current source element are connected between the signal line LSGN1 to which the reading node ND1 is connected and the reference potential VSS (for example, GND). The gate of the current transistor IC-Tr is connected to the feeding line of a control signal VBNPIX. The signal line LSGN1 between the reading node ND1 and the input part of the AD converting part 220 is driven by the current transistor IC-Tr serving as a current source element.

Figure 4:
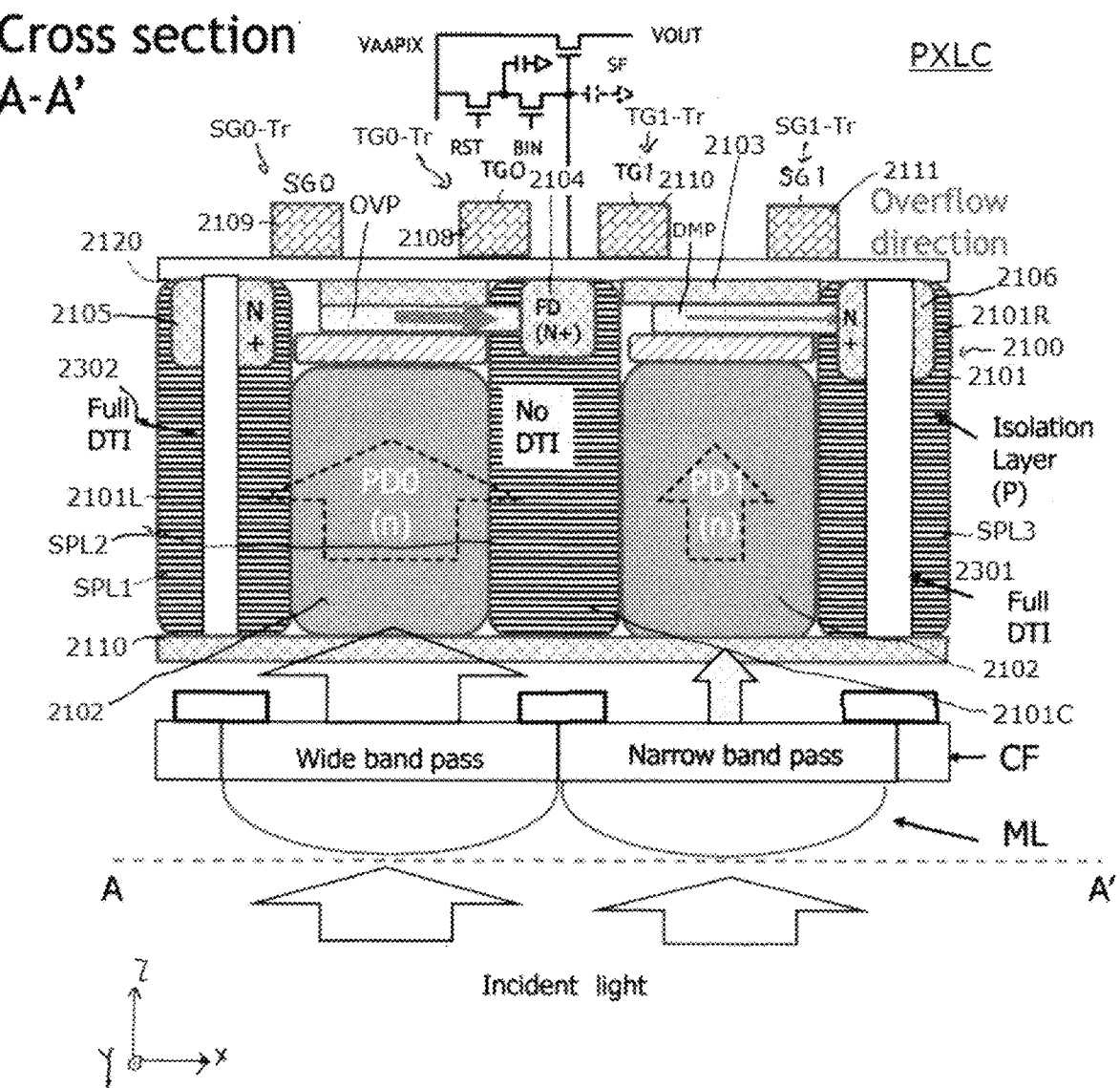
FIG. 4 is a simplified sectional view showing from a Y direction an example configuration of the main part of the sharing pixel relating to the first embodiment of the present disclosure or a charge integrating and transferring system including shutter gate transistors.
Figure 5:
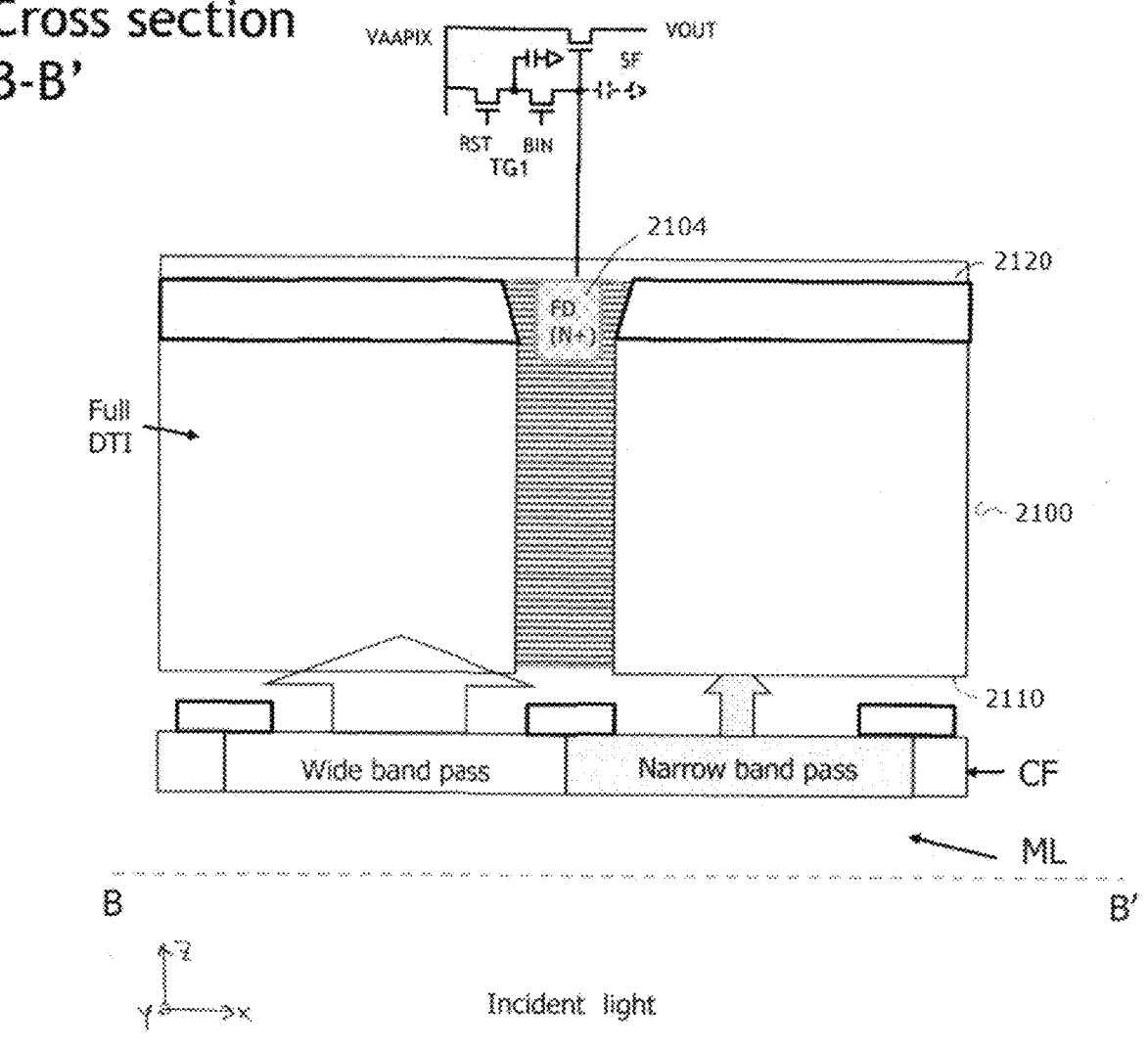
FIG. 5 is a simplified sectional view showing from an X direction an example configuration of the main part of the sharing pixel relating to the first embodiment of the present disclosure or the charge integrating and transferring system including the shutter gate transistors.
Figures 6A, 6B:
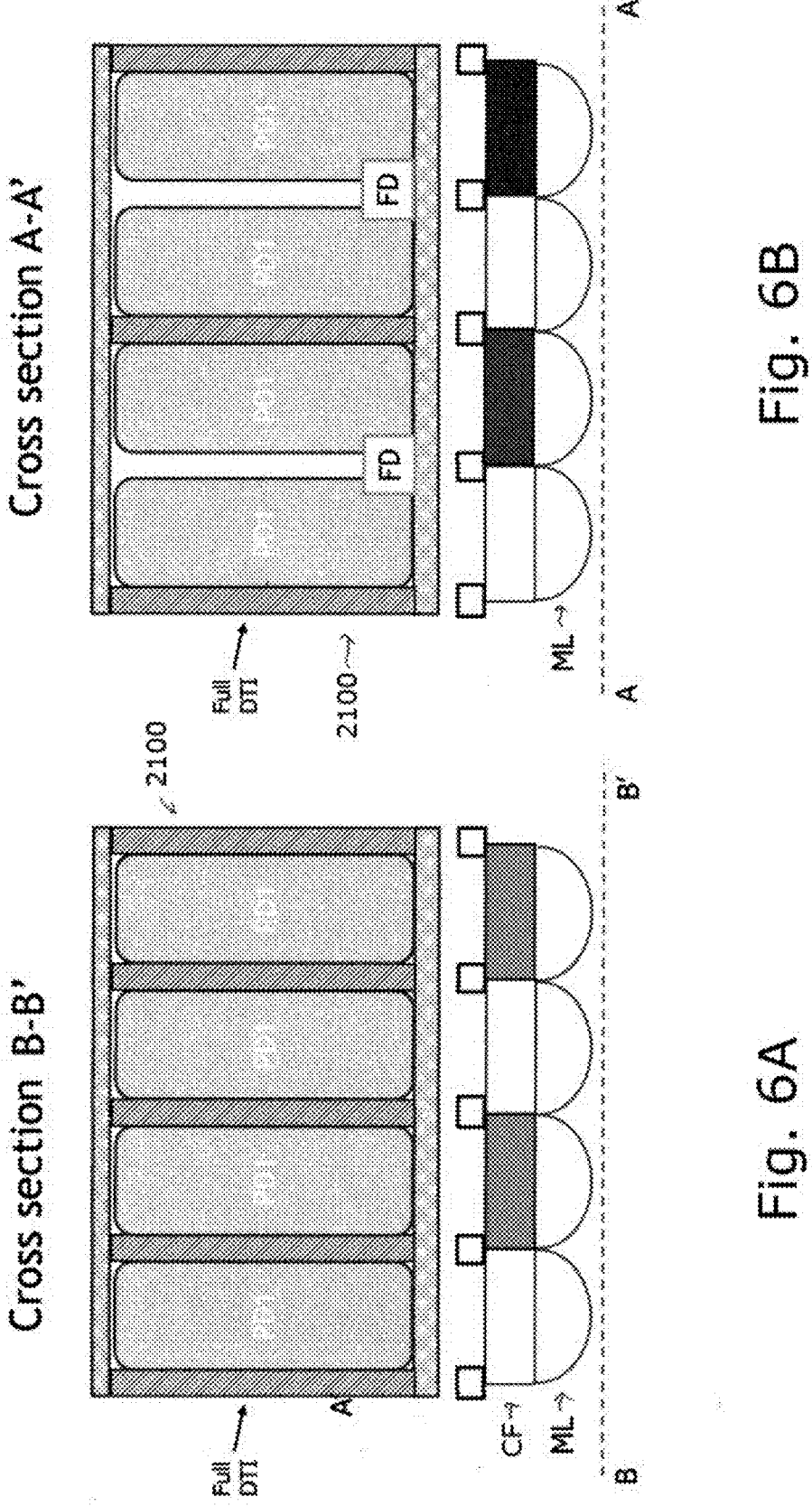
FIGS. 6A and 6B are used to illustrate how to arrange a full DTI (FDTI) in the sharing pixel relating to the first embodiment of the present disclosure.

FIG. 4 is a simplified sectional view showing from a Y direction an example configuration of the main part of the sharing pixel relating to the first embodiment of the present disclosure or a charge integrating and transferring system including the shutter gate transistors. FIG. 5 is a simplified sectional view showing from an X direction an example configuration of the main part of the sharing pixel relating to the first embodiment of the present disclosure or the charge integrating and transferring system including the shutter gate transistors. FIGS. 6A and 6B are used to illustrate how to arrange a full DTI (FDTI) in the sharing pixel relating to the first embodiment of the present disclosure.

Each pixel cell PXLC is formed on a substrate (in the present example, the first substrate 110) having a first substrate surface 2110 (for example, back surface) irradiated with light L and a second substrate surface 2120 that opposes the first substrate surface 2110 and has first and second photodiodes PD0 and PD1 separated from each other by p-type separation layers SPL1, SPL2 and SPL3. The pixel cell PLXC relating to the present embodiment shown in FIGS. 4 and 5 includes the first photodiode PD0, the second photodiode PD1, the first transfer transistor TG0-Tr, the second transfer transistor TG1-Tr, the floating diffusion FD, the first shutter gate transistor SG0-Tr, the second shutter gate transistor SG1-Tr, which together form the photoelectric conversion reading part 210, the separation layers SPL1, SPL2 and SPL3, full DTIs (FDTIs) 2301 and 2302 formed in the left and right separation layers SPL1 and SPL3, excluding the middle separation layer, and a color filter part CF and a microlens ML.

Although a back-illuminated pixel is shown as an example in FIGS. 4 and 5, the present disclosure may be applied to a front-illuminated pixel.

Configuration of Photodiode

The semiconductor substrate 2100 includes a first conductivity type (in the present embodiment, the n-type) semiconductor layer (in the present embodiment, the n layer) 2102, which is formed by burying and arranging the first and second photodiodes PD0 and PD1 in parallel with each other in a second conductivity type (in the present embodiment, the p type) layer 2101 of the semiconductor substrate 2100 having the first substrate surface 2110 and the second substrate surface 2120 opposing the first substrate surface 2110. The semiconductor substrate 2100 is thus capable of photoelectrically convert the received light and storing charges. On the lateral portions of and in the middle portion between the first and second photodiodes PD0 and PD1 in the direction orthogonal to the normal to the substrate (the X direction), the separation layers SPL1, SPL2, SPL3 of the p type layers 2101R, 2101C and 2101L are formed.

As described above, in the present embodiment, each pixel cell PXLC uses a pinned photodiode (PPD) as the photodiode (PD). On the substrate surface for forming the photodiodes (PDs), there is a surface level due to dangling bonds or other defects, and therefore, a lot of charges (dark current) are generated due to heat energy, so that the signals fail to be read out correctly. The pinned photodiodes (PPDs) have the charge storage part buried in the substrate, thereby reducing mixing of the dark current into the signals.

In the first and second photodiodes PD0 and PD1 shown in FIG. 4, the n layer (the first conductivity type semiconductor layer) 2102 has a p+ layer 2103 formed thereon on the second substrate surface 2120 side. A color filter part CF is formed on the light incidence surface of the p-type layer 2101, and a microlens ML is further formed on the light incidence surface of the color filter part in a portion corresponding to the first and second photodiodes PD0 and PD1 and a portion of the separation layers SPL.

Configuration of Separation Layers in X direction
(Column Direction)

An n+ layer 2104 serving as the floating diffusion FD is formed on the p-type separation layer 2101C (SPL2), which is arranged in the middle portion in the X direction (column direction) in FIG. 4, on the second substrate surface 2120 side. An n+ layer 2105 serving as the drain of the shutter gate transistor SG0-Tr is formed on the p-type separation layer 2101L (SPL1) on the second substrate surface 2120 side, which is arranged on the left side in the X direction (column direction) in FIG. 4. An n+ layer 2106 serving as the drain of the shutter gate transistor SG1-Tr is formed on the p-type separation layer 2101R (SPL3) on the second substrate surface 2120 side, which is arranged on the right side in the X direction (column direction) in FIG. 4.

As shown in FIGS. 4 to 6B, the left and right separations layers SPL1 and SPL3, excluding the middle separation layer SPL2, respectively have full DTIs 2301 and 2302 extending in the Y direction through the portion of the semiconductor substrate 2100 that is between the second substrate surface 2120 and the first substrate surface 2110. The middle separation layer SPL2 has the floating diffusion FD formed therein but has no full DTI therein due to the fact that the DTI structure produces no effects when formed under the floating diffusion FD shared between pixels. In other words, in a region under particular pixel components such as the FD that is shared between the pixels, the full DTI is partially missing.

On the p-type layer 2101L, on the second substrate surface 2120 side, a gate electrode 2108 of the first transfer transistor TG0-Tr and the gate electrode 2109 of the first shutter gate transistor SG0-Tr are formed with a gate insulator sandwiched therebetween. Under the first transfer transistor TG0-Tr, an overflow path OVP is formed extending from the first photodiode PD0 to the floating diffusion FD. The potential of the overflow path OVP can also be controlled through gate control, for example.

On the p-type layer 2101R, on the second substrate surface 2120 side, a gate electrode 2110 of the second transfer transistor TG1-Tr and a gate electrode 2111 of the second shutter gate transistor SG1-Tr are formed with a gate insulator sandwiched therebetween. Under the second shutter gate transistor SG1-Tr, a charge release path DMP is formed extending from the first photodiode PD0 to the n+ layer 2107.

With the above-described structure, if the intensity of the incident light is very high (the amount of the incident light is very large), the charges above the well capacity overflow into the floating diffusion FD as overflow charges through the overflow path OVP under the first transfer transistor TG0-Tr. The overflow charges are used in the first comparing operation CMPR1 performed by the comparator 221.

On the other hand, if irregular and strong light enters the first photodiode PD0 during the second comparing operation of the AD conversion, the charges overflow from the photodiode PD0 to the floating diffusion FD and the level of the floating diffusion FD serving as the output node changes. As a consequence, the AD conversion may possibly fail to be completed successfully. To address this issue, the present embodiment employs the first shutter gate transistor SG0-Tr. In this way, if irregular and strong light enters the first photodiode PD0 during the second comparing operation, unnecessary charges may be released from the first photodiode PD0 to a region where the floating diffusion FD is not formed. The first shutter gate transistor SG0-Tr thus prevents a change in the level of the floating diffusion, which may be caused by the charges overflowing from the first photodiode PD0 to the floating diffusion FD. In this way, even if irregular and strong light enters the first photodiode PD0 during the second comparing operation, the pixel is configured to be capable of successfully completing AD conversion by preventing a change in the FD level.

In the photoelectric conversion reading part 210 of the pixel 200 in which the single floating diffusion FD serving as the output node ND0 is shared between the group including the first photodiode PD0, the first transfer gate transistor TG0-Tr and the first shutter gate transistor SG0-Tr and the group including the second photodiode PD1, the second transfer gate transistor TG1-Tr and the second shutter gate transistor SG1-Tr, the photodiodes PD have different capacities to accommodate different reading modes for the purpose of improving the dynamic range. According to the first embodiment, since the charges stored in the first photodiode PD0 are read out using the fourth reading mode RMD4 and the charges stored in the second photodiode PD1 are read out using the second reading mode RMD2, the first and second photodiodes PD0 and PD1 adjacent to each other in the photoelectric conversion reading part 210 is configured such that the capacity of the former is smaller than the capacity of the latter.

The full well capacity (FWC) of the first photodiode PD0, which is read using the fourth reading mode RMD4, is limited by the PD saturation, not by its own FWC. On the other hand, the FWC of the second photodiode PD1, which is read using the first reading mode RMD1 or other reading modes, is limited by its own FWC. Accordingly, while the first photodiode PD0, which is read using the fourth reading mode RMD4, is configured to have a small FWC, the second photodiode PD1, which is read using the first reading mode RMD1 or other reading modes, is configured to have a large FWC.

Figure 8A:
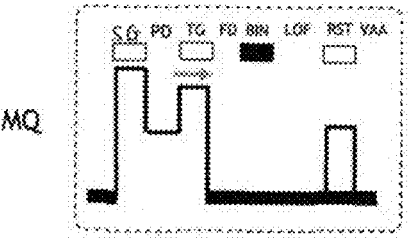
FIGS. 8A and 8B show, as an example, potential transition in two photodiodes.
Figure 8B:
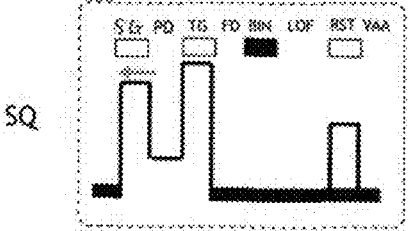

FIG. 7 is a simplified plan view illustrating, as an example, how the transistors, capacitors and other components are arranged when the single floating diffusion FD is shared by the two photodiodes in the single photoelectric conversion reading part relating to the first embodiment. FIGS. 8A and 8B show, as an example, potential transition in the two photodiodes.

The pixel cell PXLC has a rectangular region RCT where the elements are formed. The rectangular region RCT can be divided into a central region CTAR positioned in the center, and a first region FSAR and a second region SCAR sandwiching the central region CTAR therebetween (in the Y direction).

In the central region CTAR, the floating diffusion FD is formed in the X-direction-wise central portion thereof, the storage transistor BIN-Tr and the reset transistor RST-Tr are formed on the right side of the floating diffusion FD in the X direction, and the source follower transistor SF-Tr and the selection transistor SEL-Tr are formed on the left side of the floating diffusion FD in the X direction.

In the first region FSAR, the first photodiode PD0 (MQPD) serving as the first photoelectric conversion element, which is to be accessed at least using the fourth or third reading mode RMD4 or RMD3, the first transfer transistor TG0-Tr serving as the first transfer element, the first shutter gate transistor SG0-Tr serving as the first charge overflow gate element and the storage capacitor CS serving as the storage capacitor element are adjacent to each other. In the example shown in FIG. 7, the storage capacitor CS is divided into two portions, which are formed in the first region FSAR in the X-direction-wise edge portions thereof (on either side). In the central portion sandwiched by the two storage capacitor CS regions, the first photodiode PD0 (MQPD), the first transfer transistor TG0-Tr, and the first shutter gate transistor SG0-Tr are formed. More specifically, the first transfer transistor TG0-Tr is formed near the central region CTAR such that the first transfer transistor TG0-Tr is connected to the floating diffusion FD, and the first shutter gate transistor SG0-Tr is formed near the edge of the rectangular region RCT (the outer periphery, the upper side in the drawing).

In the second region SCAR, the second photodiode PD1 (SQPD) serving as the second photoelectric conversion element, which is to be accessed using the reading mode other than the fourth or third reading mode RMD4 or RMD3, for example, using the second reading mode RMD2, the second transfer transistor TG1-Tr serving as the second transfer element, and the second shutter gate transistor SG1-Tr serving as the second charge overflow gate element, are formed. In this case, the second photodiode PD1 (SQPD) covers the second region SCAR entirely and has a higher capacity than the first photodiode PD0 (MQPD). The second transfer transistor TG1-Tr is formed near the central region CTAR such that the second transfer transistor TG1-Tr is connected to the floating diffusion FD, and the second shutter gate transistor SG1-Tr is formed near the edge portion of the rectangular region RCT (the outer periphery, the lower side in the drawing).

With the configurations shown in FIG. 7, the improved dynamic range can be achieved not only when the fourth reading mode (or the third reading mode) is employed but also when the other reading modes, namely, the first and second reading modes are employed.
MQPD (PD0):

In the pixel cell PXLC described above, the charges integrated in the first photodiode PD0 (MQPD) are stored in the PD node PND0, and the overflowing charges from the first photodiode PD0 are stored in the FD node. Therefore, the saturation signal is limited not by the FWC of the PD but by the FD saturation. Accordingly, the first photodiode PD0 (MQPD) is configured to have a small FWC, and the second photodiode PD1 (SQPD) is configured to have a large FWC. The photo charges can be read at least twice with different gains to be entirely converted into signals.
SQPD (PD1):

The charges integrated in the second photodiode PD1 (SQPD) are stored in the PD node PND1, and the overflowing charges from the second photodiode PD1 are discharged to the drain node through the charge release path DMP. Therefore, the saturation signal is limited not by the FWC of the FD but by the PD saturation. Accordingly, the MQPD is configured to have a small FWC, and the SQPD is configured to have a large FWC.

In relation to the layout of the FD shared pixel described above, the following now describes examples of the full DTI (FDTI) structure pattern.

Figure 9:
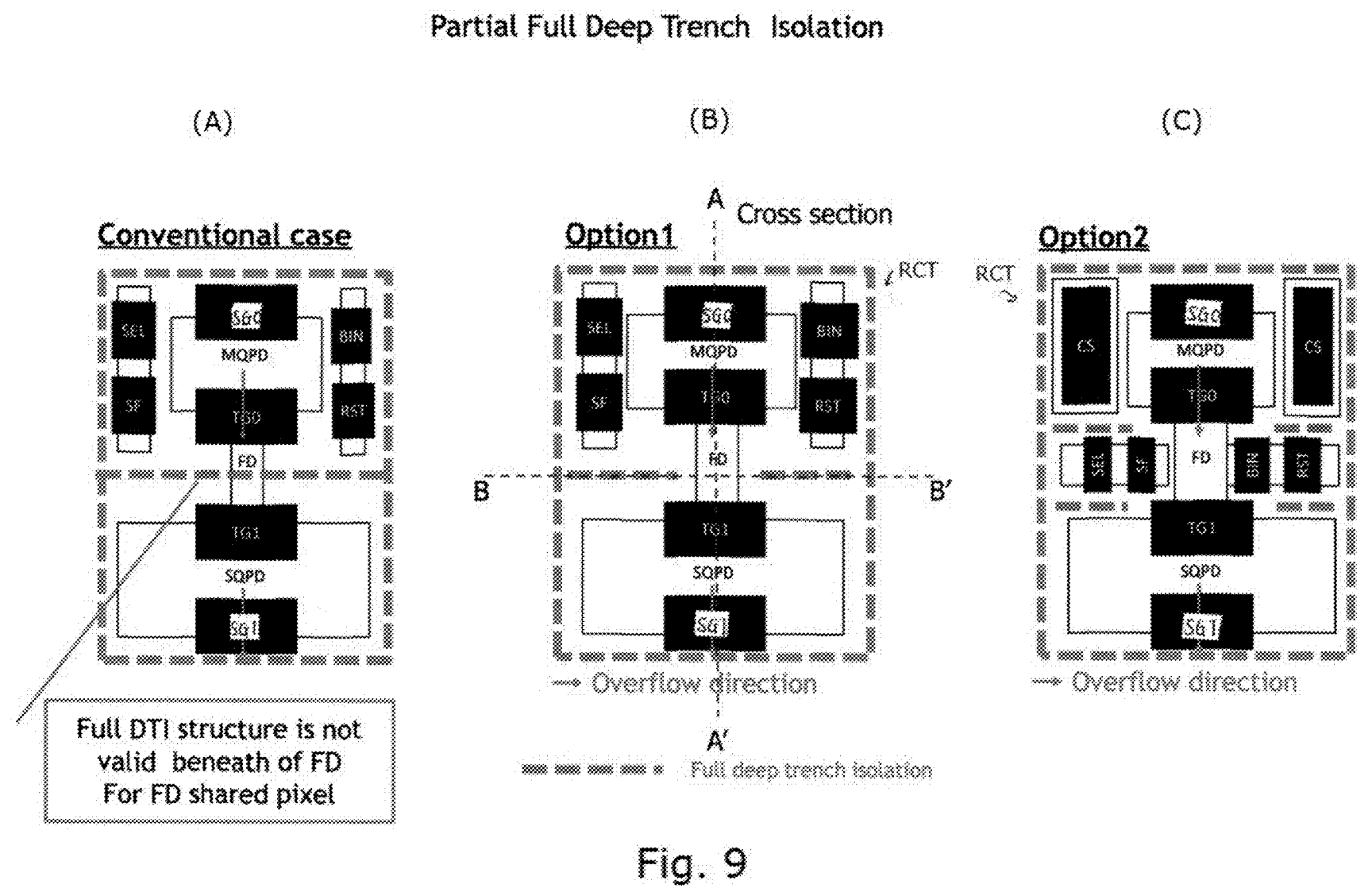

FIG. 9 includes views (A) to (C) to illustrate examples of the full DTI structure pattern in the FD shared pixel in the solid-state imaging device relating to the first embodiment of the present disclosure. In FIG. 9, the view (A) shows a comparative example where the full DTI structure relating to the first embodiment is not employed, the view (B) shows a first example where the full DTI structure relating to the first embodiment is employed, and the view (C) shows a second example where the full DTI structure relating to the first embodiment is employed. The layout of the sharing pixel shown in the view (C) in FIG. 9 is the same as the layout shown in FIG. 7 described above. When comparing the layout of the sharing pixel shown in the views (A) and (B) in FIG. 9 with that shown in FIG. 7, no capacitor is provided in the first region FSAR, the storage transistor BIN-Tr and reset transistor RST-Tr are instead formed on the right side in the X direction, and the source follower transistor SF-Tr and the selection transistor SEL-Tr are instead formed on the left side in the X direction.

According to the comparative example shown in the view (A) in FIG. 9, a full DTI is entirely formed without a gap along the outer edge of the rectangular region RCT, and a full DTI extends linearly in the central region CTAR in the X direction, even in the region corresponding to the region where the floating diffusion FD is formed.

According to the first and second examples shown in the views (B) and (C) in FIG. 9, on the other hand, a full DTI is entirely formed without a gap along the outer edge of the rectangular region RCT, and a full DTI extends linearly in the central area CTAR in the X direction partially (selectively), except for the region corresponding to the region where the floating diffusion FD is formed.

A full DTI structure can not be applied to some pixel components such as pn junctions and MOS transistors. In the first embodiment, the full DTI region is partially absent under such pixel components as an FD of an FD shared pixel. In other words, in a region under a pixel component such as an FD of an FD shared pixel, the full DTI is partially missing. The overflow direction can be controlled either by the transfer transistor TG or shutter gate transistor SG provided for the purpose of anti blooming, by means of the n region formed beneath the gate coupled with the FD node.

Figure 10:
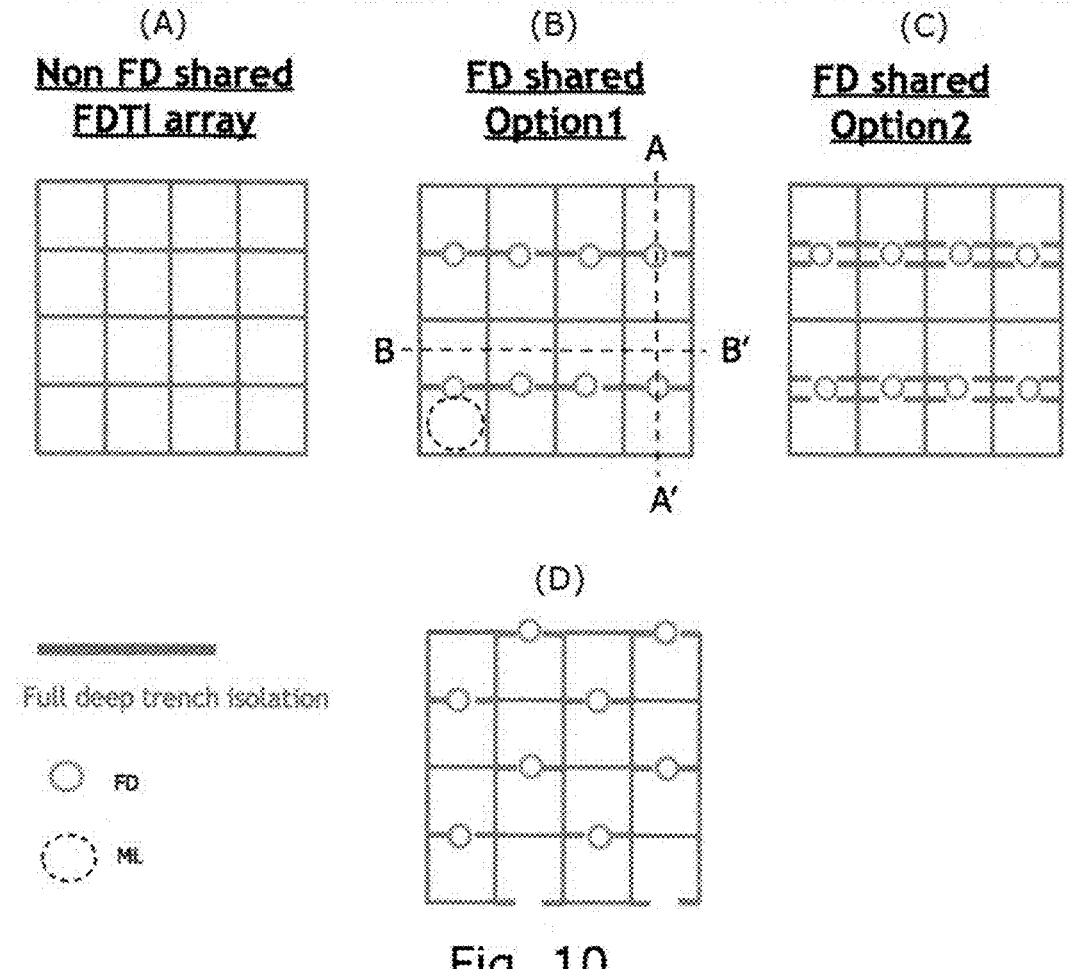
FIG. 10 is used to illustrate examples of a full DTI pattern in a pixel array in the solid-state imaging device relating to the first embodiment of the present disclosure.

The following now describes examples of the full DTI in the pixel array in the solid-state imaging device relating to the first embodiment of the present disclosure. FIG. 10 includes views (A), (B), (C) and (D) to illustrate examples of the full DTI structure pattern in the pixel array in the solid-state imaging device relating to the first embodiment of the present disclosure. In FIG. 10, the view (A) shows, as a comparative example, a pixel array without a full DTI.

According to the examples shown in FIG. 10, the full DTI is formed to draw square blocks in the array of pixels 200. In the first embodiment, the full DTI structure is partially removed, so that pixel component regions are left while the crosstalk between the pixels can be minimized.

The following now describes examples of the configuration of the color matrix applicable in the first embodiment of the present disclosure. FIG. 11 includes views (A) and (B) to illustrate example configurations of a color matrix applicable in the first embodiment of the present disclosure. Shown are examples of a color matrix of RCC(W)B.

The color matrix configuration for PDs sharing an FD, a high-transmittance filter is coupled with a low-transmittance filter matrix. For example, a high-transmittance clear (C) (white: W) filter is coupled with low-transmittance R and G filters.

The following further describes how the color filters are arranged in the first embodiment of the present disclosure. In the present embodiment, color filters are respectively formed above corresponding PDs, which share an FD. Specifically, a color filter configuration of RGB, G filters are applied to a 2×2 block of PDs sharing an FD. In the first embodiment, due to the shared FD configuration, the pixels can be formed above a back sided isolation (BSI) structure using a partial full DTI, which can prevent color signal cross talk between the PDs. This enables the binning function of the PDs sharing a FD. In the case of 2×2 binning, all of the overflow charges are entirely stored in the floating diffusion FD (FD node).

Figure 12:
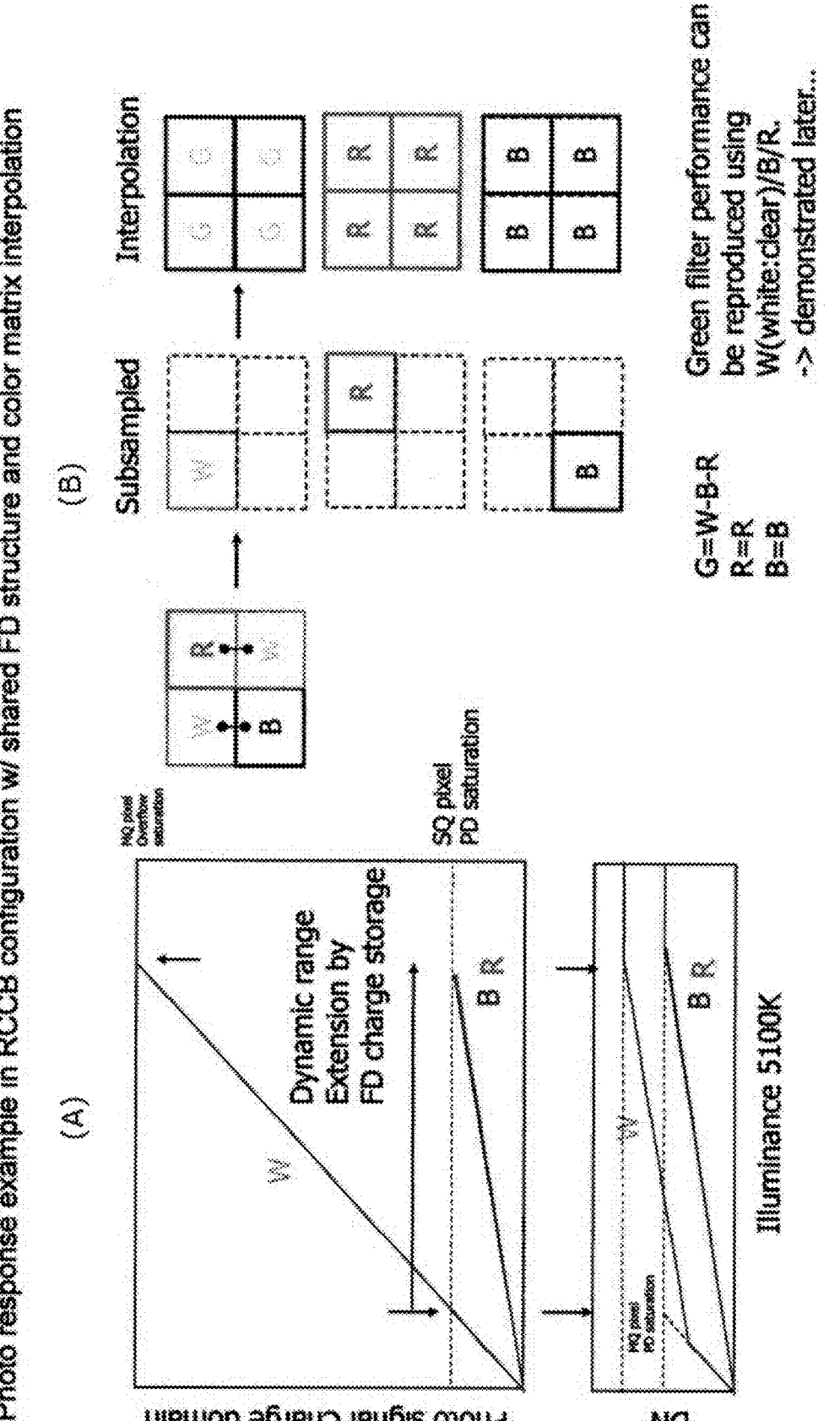
FIG. 12 is used to illustrate an example of photo response for a RWWB (RCCB) configuration with a shared FD structure and color matrix interpolation.
Figure 13:
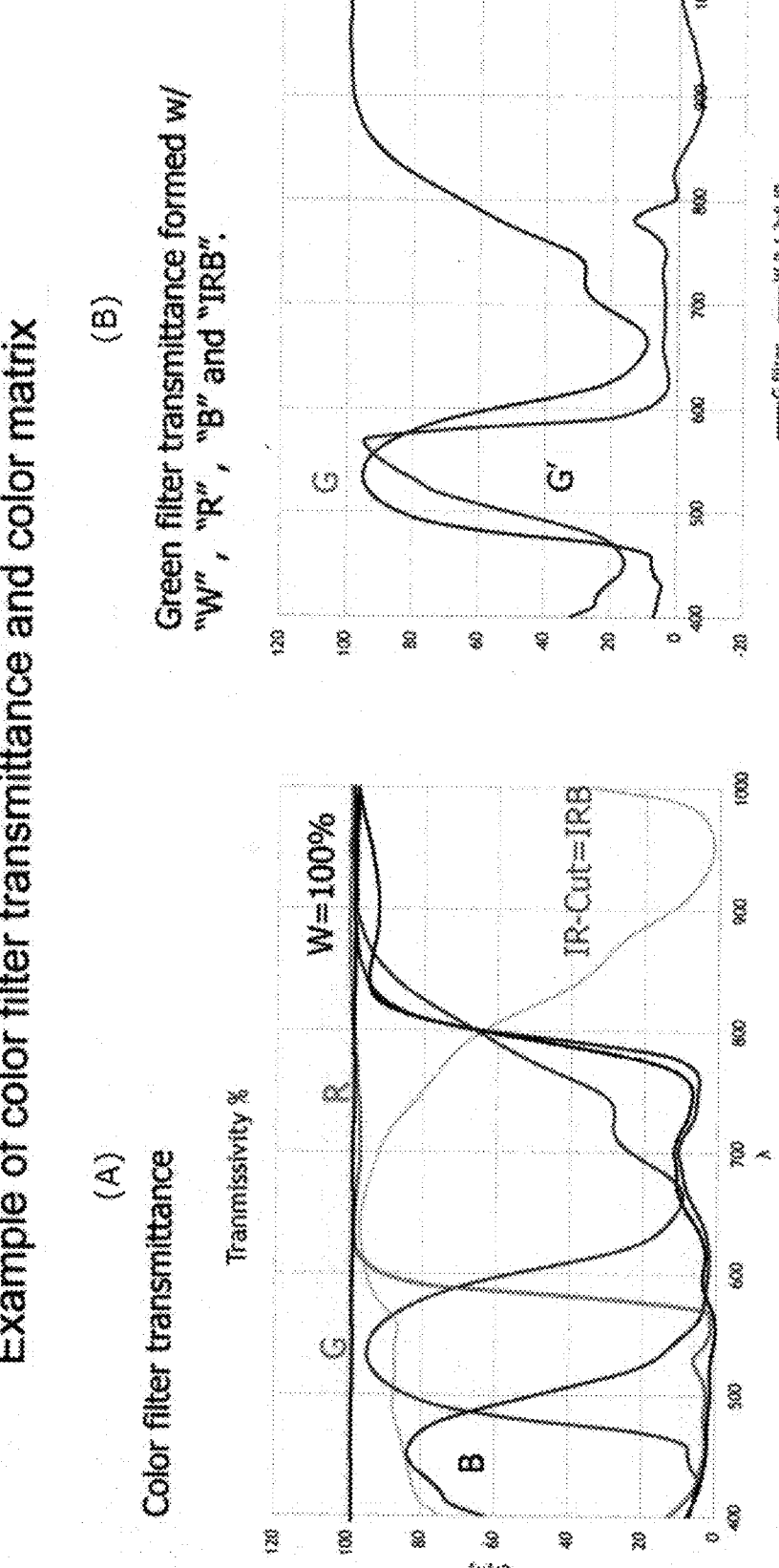
FIG. 13 shows transmittance of a regular color filter and a G filter.

The following now describes an example of photo response in a RWWB (RCCB) configuration with a shared FD structure and color matrix interpolation. FIG. 12 includes views (A) and (B) to illustrate an example of photo response in a RWWB (RCCB) configuration with a shared FD structure and color matrix interpolation. In FIG. 12, the view (A) shows an example of photo response characteristics, and the view (B) shows an example of color matrix interpolation in a RWWB (RCCB) color matrix. FIG. 13 includes views (A) and (B) showing transmittance of regular color filters and a G filter. In FIG. 13, the view (A) shows the transmittance of R, G, B, IRB color filters, and the view (B) shows the transmittance of a G filter with or without interpolation.

According to the configuration shown in FIG. 12, the dynamic range of W can be significantly extended by the charges stored in the floating diffusion FD, as is seen from the view (A). As for the color matrix interpolation shown in the view (B) in FIG. 12, the W (C), B and R filters are used to perform an operation G=W−B−R, so that the green G filter performance can be reproduced at a level close to the original G filter performance.

Referring to the configuration shown in FIG. 13, the color matrix interpolation shown in the view (B) uses the W ( ) B, R and IRB filters to perform an operation G'=W−R−B−IRB, so that the green G' filter performance can be reproduced at a level close to the original G filter.

Figure 14:
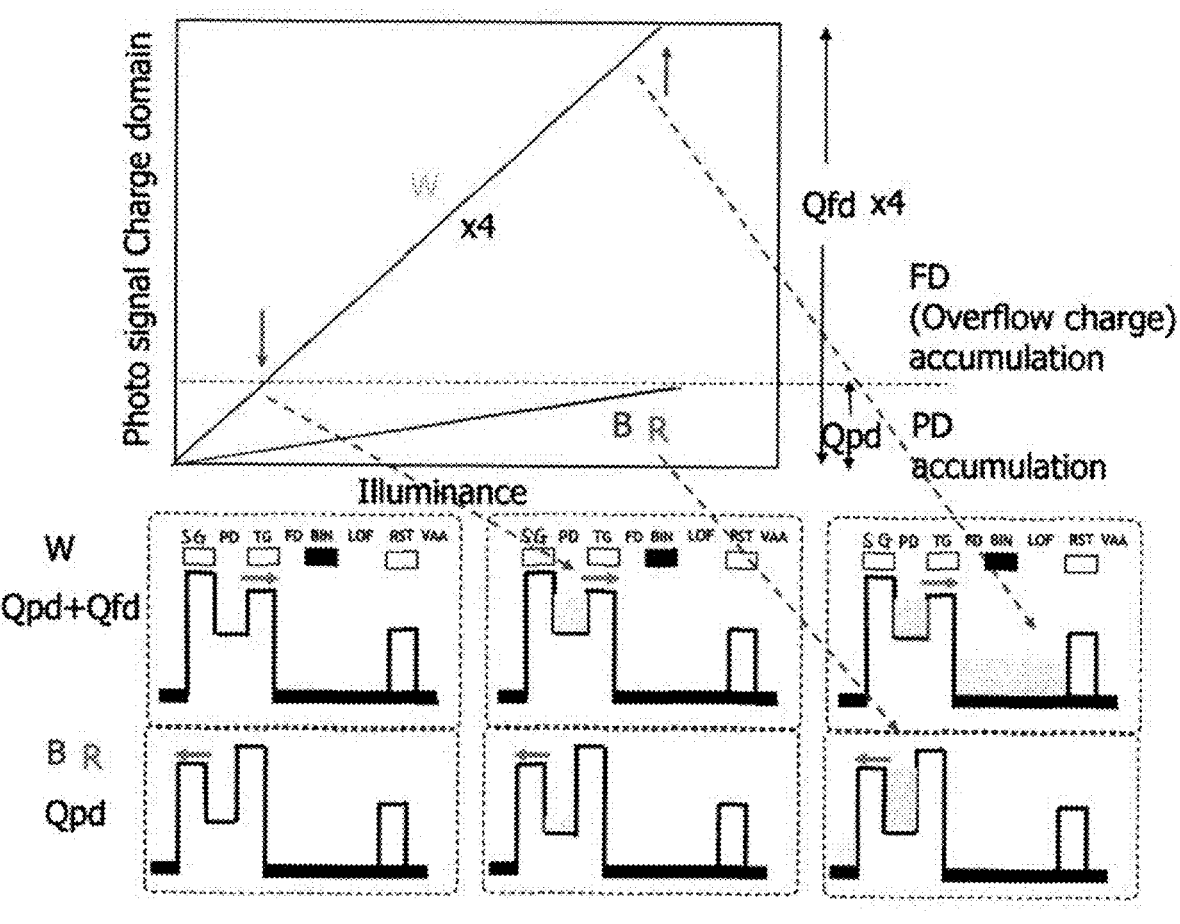
FIG. 14 describes a photo charge state in a FD-shared PD in relation to potential transition.

The following now describes a photo charge state in a FD-shared PD. FIG. 14 describes a photo charge state in a FD-shared PD in relation to potential transition.

According to this example, the responsiveness of the "W" pixel [e⁻/lux] is estimated four times higher, and the charges (Qfd) stored in the floating diffusion FD (FD node) are also estimated to be four times greater. The saturation point [lux] of the high-transmission W filter is extended, so that the saturation points are leveled. In this case, the overflow charges from the clear (white) filter can be stored in the floating diffusion FD (FD node). The overflow charges from the R/B filters are not coupled with the FD node during exposure, and the R and G pixels are coupled with the FD node only during a read-out period.

Figure 1:
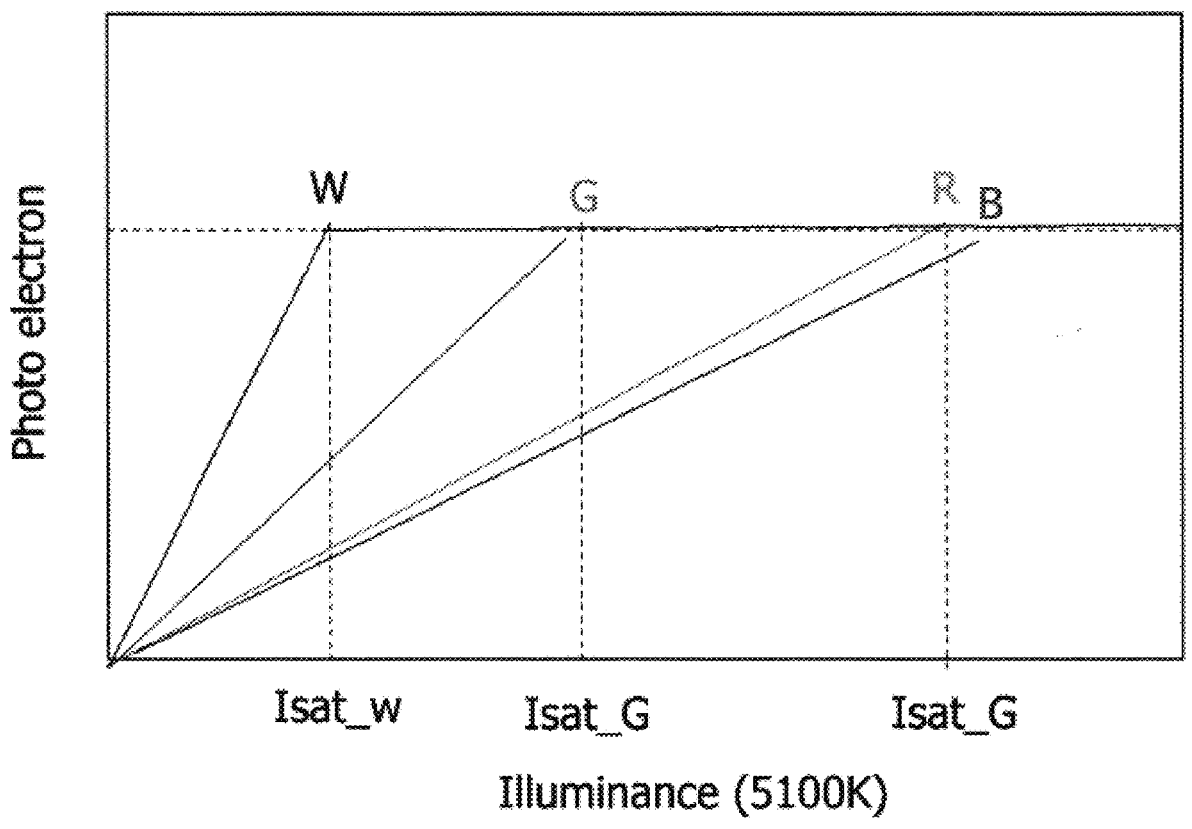
FIG. 1 shows photo-responsive characteristics for a color matrix of various colors including W, R, G and B.

The following description is made with reference to FIGS. 1 and 2.

The AD converting part 220 of the pixel 200 compares the analog voltage signal VSL output from the photoelectric conversion reading part 210 against the referential voltage VREF, which has a ramp waveform varying with a predetermined gradient or a fixed voltage level, to convert the analog signal into a digital signal.

As shown in FIG. 2, the AD converting part 220 includes a comparator (COMP) 221, an output-side load capacitor CL1 and a reset switch SW-RST.

In the comparator 221, a first input terminal or inversion input terminal (−) receives the voltage signal VSL fed thereto, which is output from the output buffer part 211 of the photoelectric conversion reading part 210 to the signal line LSGN1, and a second input terminal or non-inversion input terminal (+) receives the referential voltage VREF fed thereto. The comparator 221 performs AD conversion (a comparing operation) of comparing the voltage signal VST against the referential voltage VREF and outputting a digital comparison result signal SCMP.

The first input terminal or inversion input terminal (−) of the comparator 221 is connected to a coupling capacitor CC1. In this way, the output buffer part 211 of the photoelectric conversion reading part 210 formed on the first substrate 110 is AC coupled to the input part of the comparator 221 of the AD converting part 220 formed on the second substrate 120, so that the noise can be reduced and high SNR can be achieved when the illuminance is low.

As for the comparator 221, the reset switch SW-RST is connected between the output terminal and the first input terminal or inversion input terminal (−), and the load capacitor CL1 is connected between the output terminal and the reference potential VSS.

In the AD converting part 220, basically, the comparator 221 compares the analog signal (the potential VSL) read from the output buffer part 211 of the photoelectric conversion reading part 210 to the signal line LSGN1 against the referential voltage VREF, for example, a ramp signal RAMP that linearly changes with a certain gradient or has a slope waveform. During the comparison, a counter (not shown), which is provided for each column as is the comparator 221, is operating. The ramp signal RAMP having a ramp waveform and the value of the counter vary in a one-to-one correspondence, so that the voltage signal VSL is converted into a digital signal. Basically, the AD converting part 220 converts a change in voltage, in other words, a change in the referential voltage VREF (for example, the ramp signal RAMP) into a change in time, and counts the change in time at certain intervals (with certain clocks). In this way, a digital value is obtained. When the analog signal VSL and the ramp signal RAMP (the referential voltage VREF) cross each other, the output from the comparator 221 is inverted, the clock (not shown) input into the counter is stopped or the suspended clock (not shown) is input into the counter, and the value (data) of the counter at that timing is saved in the memory part 230. In this way, the AD conversion is completed. After the end of the above-described AD converting period, the data (signal) stored in the memory part 230 of each pixel 200 is output through the reading circuit 40 to a signal processing circuit (not shown) and subject to predetermined signal processing, so that a two-dimensional image is produced.

The memory part 230 is formed by an SRAM or DRAM, receives digital signals fed thereto, is compatible with photo conversion codes, and can be read by an external IO buffer in the reading circuit 40 near the pixel array. In the present example, the memory part 230 includes two memories 231 and 232 connected to the output from the comparator 221.

The vertical scanning circuit 30 drives the photoelectric conversion reading part 210 of the pixel 200 through row-scanning control lines in shutter and reading rows, under the control of the timing control circuit 50. The vertical scanning circuit 30 feeds a referential voltage level VREF, which is set in accordance with the comparing operation, to the comparator 221 of each pixel 200, under the control of the timing control circuit 50. Further, the vertical scanning circuit 30 outputs, according to an address signal, row selection signals indicating the row addresses of the reading row from which signals are to be read out and the shutter row in which the charges stored in the photodiodes PD are to be reset.

The reading circuit 40 includes a plurality of column signal processing circuits (not shown) arranged corresponding to the column outputs of the pixel part 20, and the reading circuit 40 may be configured such that the plurality of column signal processing circuits can perform column parallel processing.

The reading circuit 40 may include a correlated double sampling (CDS) circuit, an analog-to-digital converter (ADC), an amplifier (AMP), a sample/hold (S/H) circuit, and the like.

Figure 15:
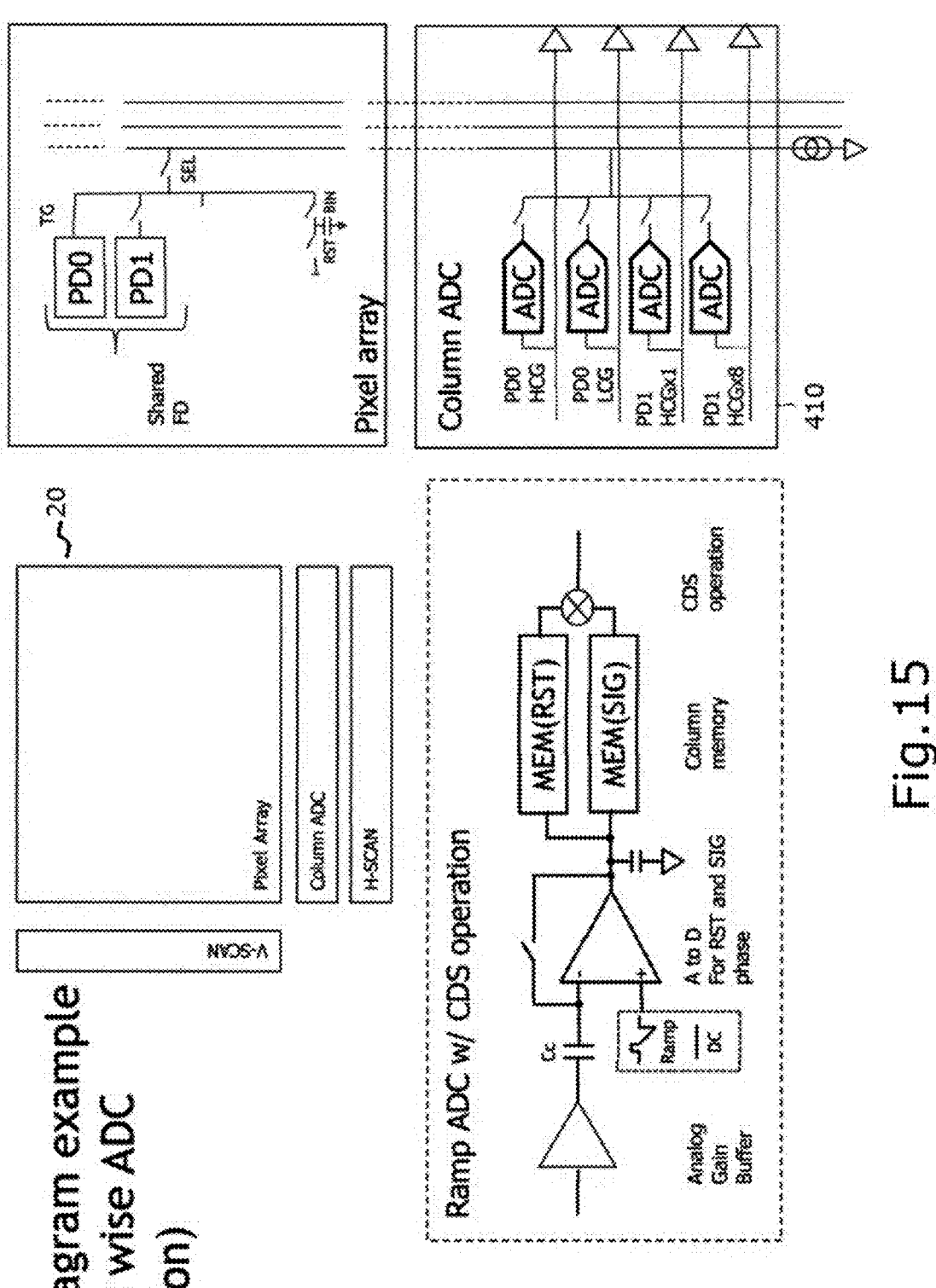
FIG. 15 shows an example configuration of a column-wise ADC conversion employed in a reading system for column outputs from a pixel part of the solid-state imaging device according to the embodiment of the present disclosure.
Figure 16:
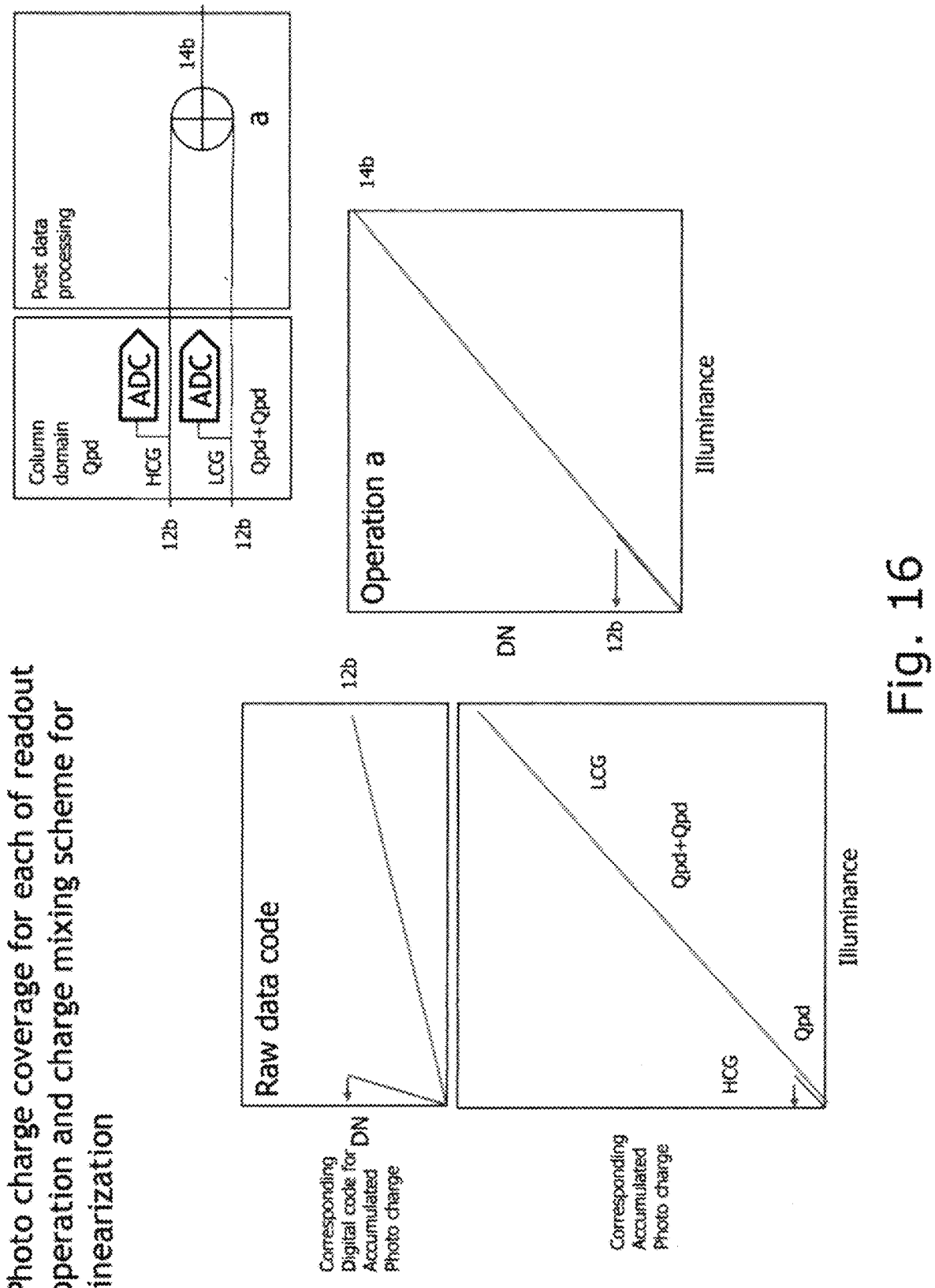
FIG. 16 shows photo charge coverage for each of readout operation and charge mixing scheme for linearization.

FIG. 15 shows an example configuration of a column-wise ADC conversion employed in the reading system for column outputs from the pixel part of the solid-state imaging device according to the embodiment of the present disclosure. FIG. 16 shows photo charge coverage for each of readout operation and charge mixing scheme for linearization.

As shown in FIGS. 15 and 16, for example, the reading circuit 40 may include a plurality of AD converting parts 220 described above as column ADCs 410 for converting the read-out signals VSL output from the respective columns of the pixel part 20 into digital signals.

The timing control circuit 50 generates timing signals required for signal processing in the pixel part 20, the vertical scanning circuit 30, the reading circuit 40, and the like.

In the first embodiment, the reading part 70 controls reading of the pixel signals from the pixel 200.

Figure 17:
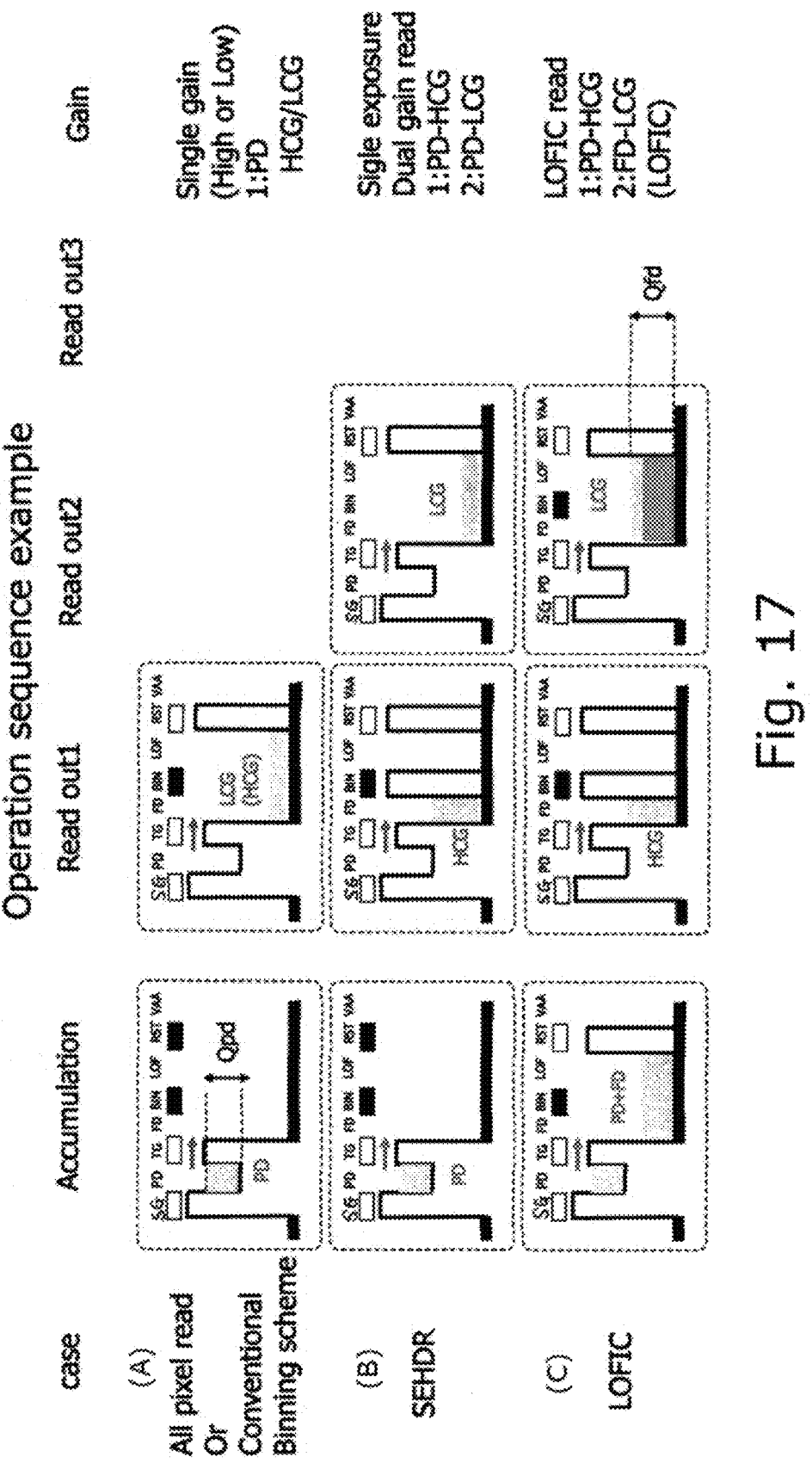
FIG. 17 shows examples of a read-out operation applicable to the solid-state imaging device relating to the first embodiment of the present disclosure.

The following further describes how to read pixel signals in the first embodiment. FIG. 17 includes views (A), (B) and (C) showing examples of the read-out operation applicable to the solid-state imaging device relating to the first embodiment of the present disclosure.

A read-out operation applicable to the sharing pixel can be typified by methods applicable to the cases shown in the views (A), (B) and (C) in FIG. 17.

The method shown in the view (A) in FIG. 17 is applied to the all pixel read or conventional binning scheme. A single gain scheme is used, specifically, either the high conversion gain (first conversion gain) HCG or the low conversion gain (second conversion gain) LCG is used. In this case, a read-out operation is performed on either the first or second photodiode PD0 or PD1.

The view (B) in FIG. 17 shows the method applicable to single exposure high dynamic range (SEHDR) performance. A dual conversion gain scheme is used, specifically, the high conversion gain (first conversion gain) HCG and the low conversion gain (second conversion gain) LCG are both used. In this case, the charges in the first photodiode PD0 are firstly read with the high conversion gain HCG, and the charges in the second photodiode PD1 are secondly read with the low conversion gain LCG.

The method shown in the view (C) in FIG. 17 is applied to the LOFIC mode. A dual conversion gain scheme is used, specifically, the high conversion gain (first conversion gain) HCG and the low conversion gain (second conversion gain) LCG are both used. In this case, the charges in the first photodiode PD0 are firstly read with the high conversion gain HCG, and the charges in the floating diffusion FD are secondly read with the low conversion gain LCG.

Figure 18:
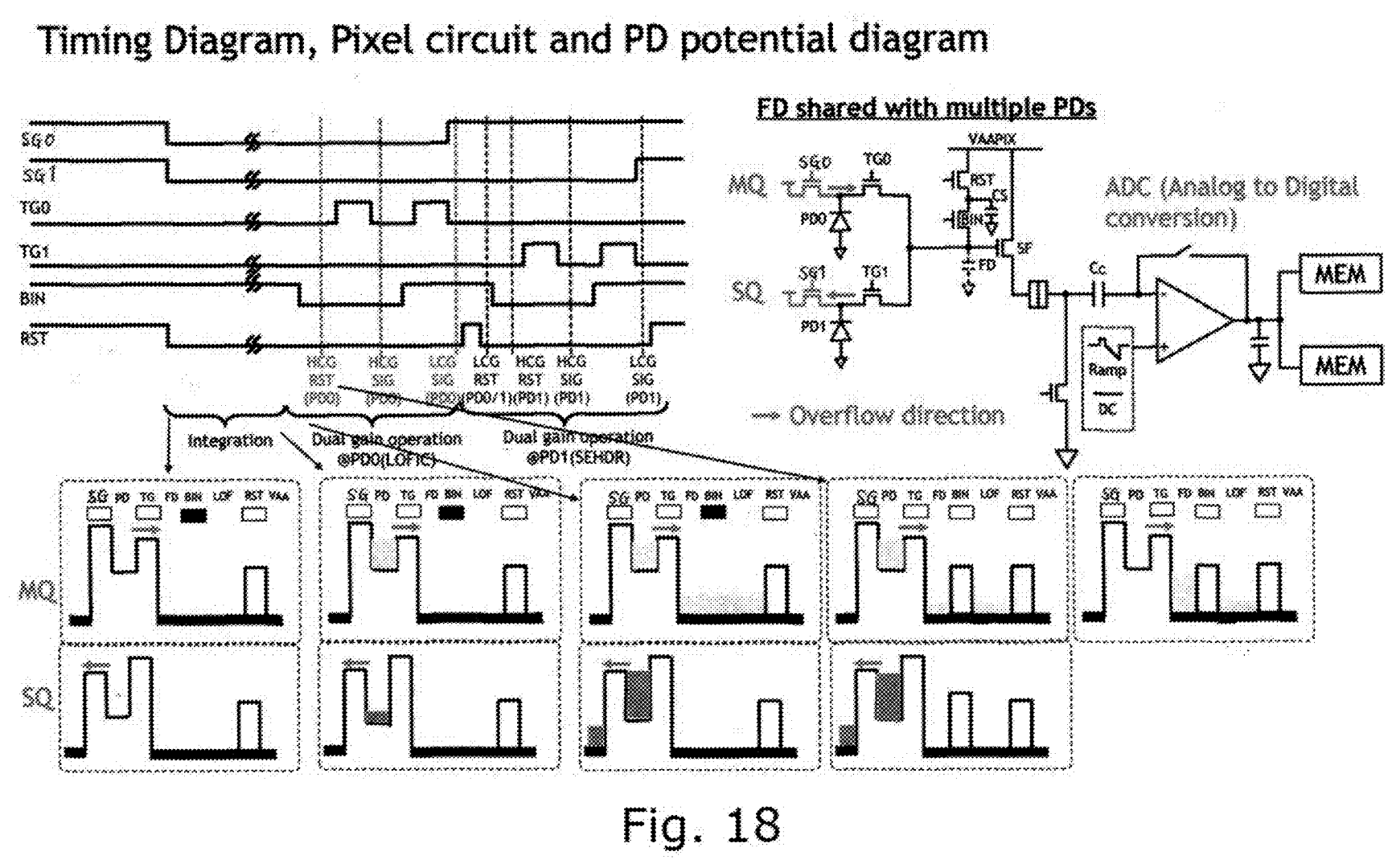

FIG. 18 shows an example of a read-out operation applicable to the sharing pixel of the solid-state imaging device relating to the first embodiment of the present disclosure, showing an example of the circuitry of the sharing pixel, a timing chart and potential transition in relation with each other.

According to the example shown, upon elapse of a charge integration period, a dual conversion gain operation using LOFIC is firstly performed to read the charges in the first photodiode PD0. Specifically, a high conversion gain reset signal read-out operation HCGRST (PD0), a high conversion gain illuminance signal read-out operation HCGSIG (PD0), and a low conversion gain illuminance signal read-out operation LCGSIG (PD0) are performed in order on the first photodiode PD0.

After this, a dual conversion gain operation using SEHDR is next performed to read the charges in the second photodiode PD1. Specifically, a low conversion gain reset signal read-out operation LCGRST(PD0/1) is performed on the first or second photodiode PD0 or PD1. After this, a high conversion gain reset signal read-out operation HCGRST (PD1), a high conversion gain illuminance signal read-out operation HCGSIG(PD1), and a low conversion gain illuminance signal read-out operation LCGSIG(PD1) are performed in order.

Figure 19:
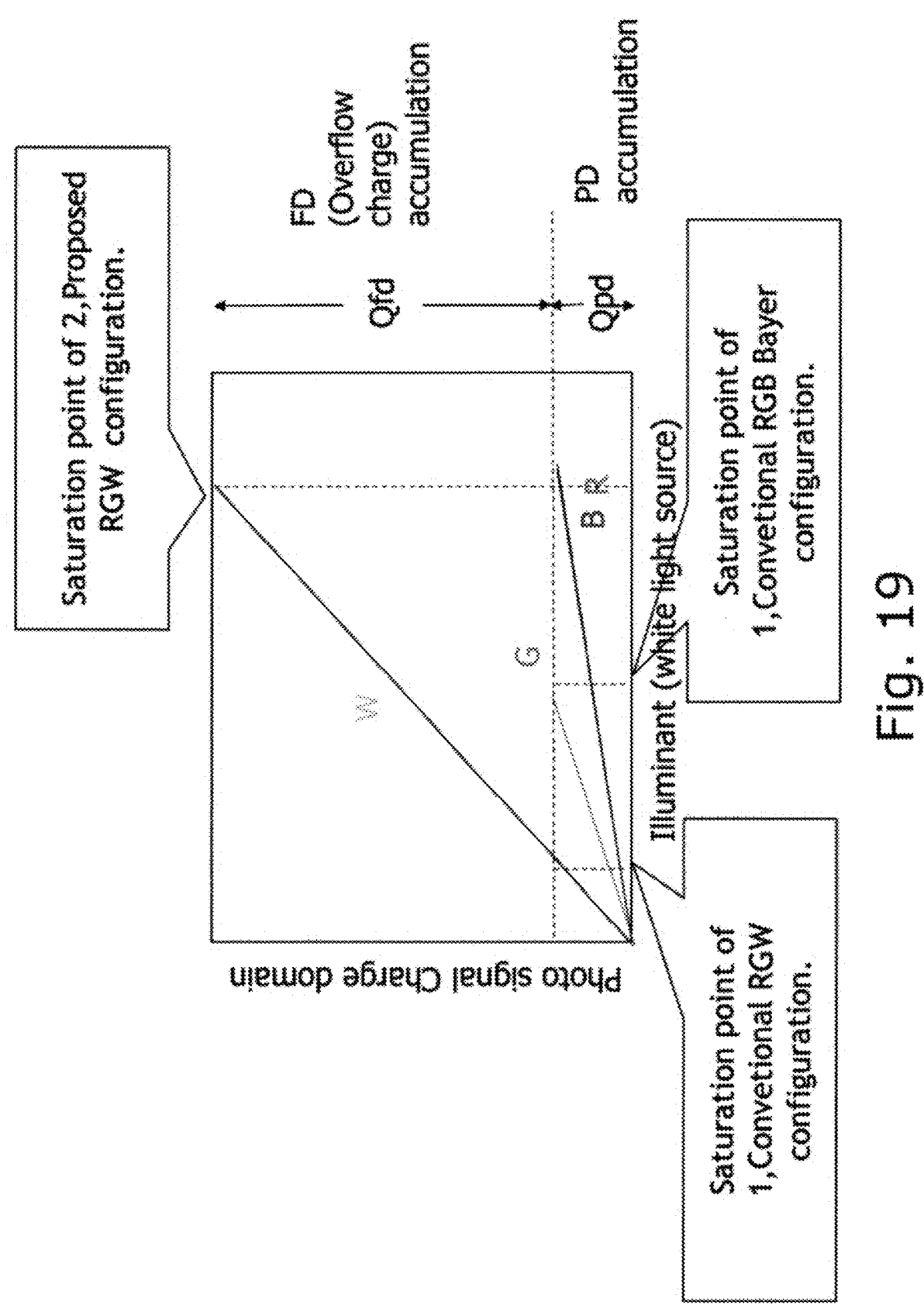
FIG. 19 is used to illustrate the advantages achieved by the solid-state imaging device relating to the first embodiment.

The above has described the characteristic configurations and functions of the solid-state imaging device 10 relating to the first embodiment including sharing pixels, where each sharing pixel has two photodiodes PD0 and PD1 and one floating diffusion FD shared between the photodiodes PD0 and PD1. The following now describes the advantageous effects of the solid-state imaging device 10 relating to the first embodiment, with reference to FIG. 19.

Advantageous Effects of First Embodiment

In the case of a regular RGB Bayer configuration, the saturation point is limited by the characteristics of the green filter. In the case of an RGB (W) filter configuration, where the W (clear: C) filter can provide higher transmittance, the saturation point is limited by the W filter. Therefore, the maximum illuminance, which normally contributes to achieve color reproducibility, may drop.

In the first embodiment, the full well capacitance (FWC) of the PD that has the highest transmittance among the PDs sharing an FD can be extended if overflow charges are accumulated. To completely extend the well capacity, which is determined by the Qpd, requires some overhead for the pixel size, but the first embodiment eliminates the need for such overhead. The solid-state imaging device 10 relating to the first embodiment can thus have high responsiveness, high SNR performance in low illuminance environment, high dynamic range and excellent color reproducibility, as described above.

Second Embodiment

Figure 20:
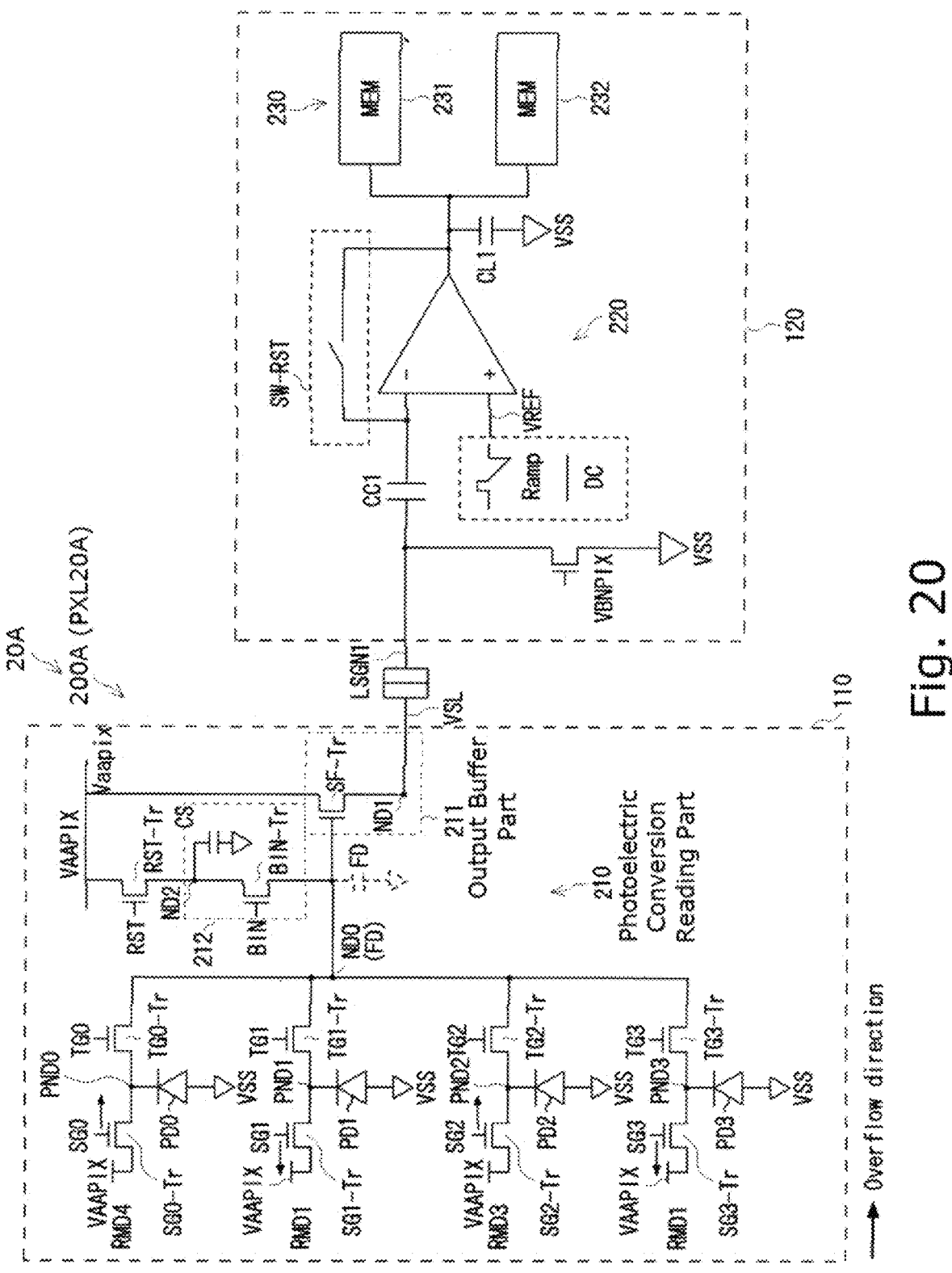
FIG. 20 is a circuit diagram showing an example of a sharing pixel of a solid-state imaging device relating to a second embodiment of the present disclosure.

FIG. 20 is a circuit diagram showing an example of a sharing pixel of a solid-state imaging device relating to a second embodiment of the present disclosure.

A sharing pixel PXL20A of a solid-state imaging device 10A relating to the second embodiment differs from the sharing pixel PXL20 of the solid-state imaging device 10 relating to the above-described first embodiment in the following points.

In the sharing pixel PXL20 of the solid-state imaging device 10 relating to the first embodiment, the two photodiodes PD0 and PD1 share one floating diffusion FD. The solid-state imaging device 10 relating to the first embodiment includes the first photodiode PD0 connected to the first transfer transistor TG0-Tr, the second photodiode PD1 connected to the second transfer transistor TG1-Tr, the floating diffusion FD connected to the first and second transfer transistors TG0-Tr and TG1-Tr, the first shutter gate transistor SG0-Tr serving as the anti-blooming gate connected to the first photodiode PD0, and the second shutter gate transistor SG1-Tr serving as the anti-blooming gate connected to the second photodiode PD1. In the sharing pixel PXL20 of the solid-state imaging device 10 relating to the first embodiment, a first saturation signal SAT0 from the first photodiode PD0 entirely overflows into the floating diffusion FD via the first transfer transistor TG0-Tr, and a second saturation signal SAT1 from the second photodiode PD1 is discharged through the second shutter gate transistor SG1-Tr.

In the sharing pixel PXL20A of the solid-state imaging device 10A relating to the second embodiment, four photodiodes PD0 to PD3, namely, the two photodiodes PD0 and PD1 and additional two photodiodes PD2 and PD3, share one floating diffusion FD. Specifically, the solid-state imaging device 10A relating to the second embodiment includes a first photodiode PD0 connected to a first transfer transistor TG0-Tr, a second photodiode PD1 connected to a second transfer transistor TG1-Tr, a third photodiode PD2 connected to a third transfer transistor TG2-Tr, a fourth photodiode PD3 connected to a fourth transfer transistor TG3-Tr, a floating diffusion FD connected to the first, second, third and fourth transfer transistors TG0-Tr, TG1-Tr, TG2-Tr and TG3-Tr, a first shutter gate transistor SG0-Tr serving as an anti-blooming gate connected to the first photodiode PD0, a second shutter gate transistor SG1-Tr serving as an anti-blooming gate connected to the second photodiode PD1, a third shutter gate transistor SG2-Tr serving as an anti-blooming gate connected to the third photodiode PD2, and a fourth shutter gate transistor SG3-Tr serving as an anti-blooming gate connected to the fourth photodiode PD3.

As noted above, the sharing pixel PXL20A of the solid-state imaging device 10A relating to the second embodiment additionally includes the third and fourth photodiodes PD2 and PD3 respectively coupled with the third and fourth transfer transistors TG2-Tr and TG3-Tr. The layout of the FD shared pixel PXL20A is as follows. The first, second, third and fourth photodiodes PD0, PD1, PD2 and PD3 are provided, and all of the saturation signals SAT0 to SAT3 from the photodiodes PD0 to PD3 are completely transferred (overflow) to the floating diffusion FD, and the overflow charges of the photodiodes can be discharged to the drain of the shutter gate transistors SG via the other side of the transfer transistors TG. Alternatively or additionally, at least one of the saturation signals SAT0 to SAT3 from the photodiodes PD0 to PD3 is completely transferred (overflows) to the floating diffusion FD, but the overflow charges of the photodiodes can be discharged to the drain of the shutter gate transistors SG on the other side of the transfer transistors TG.

In the sharing pixel PXL20A, the photodiodes PD0 to PD3 are each connected to two charge transfer transistors through which the integrated charges can be individually discharged and the integration time can be individually controlled. The sharing pixel PXL20A has color filters formed above the corresponding PDs sharing the FD. For example, a color filter configuration of RGB, G filters is applied to a 2×2 block of PDs sharing an FD. Due to the FD shared configuration, the pixels can be formed above a back sided isolation (BSI) structure using a partial full DTI, which can prevent color signal cross talk between the photodiodes PD0 to PD3.

The sharing pixel PXL20A includes color filters arranged correspondingly to the pixels respectively including the photoelectric conversion elements. A high-sensitivity and high-transmittance color filter W (C) is applied to a first one of the photoelectric conversion elements from which the overflow photo charges are stored into the floating diffusion FD. Relatively less sensitive transmissive color filters are applied to second and subsequent ones of the photoelectric conversion elements in which the produced photo charges are accumulated as a read-out signal. In order to extend the overflow signal from the high-sensitivity pixel, the color filters of the other pixels than the high-sensitivity pixel are configured as R-G-B-IR, or combined with a filter sensitive to any one of the relatively less sensitive transmissive color filters.

The above has briefly described the characteristic configurations of the solid-state imaging device 10A relating to the second embodiment, such as the sharing pixel and the color filter matrix of the pixel part. The following now describes in order the configuration and arrangement of the sharing pixels of the solid-state imaging device 10A relating to the second embodiment, the configuration and functions of the color matrix and also describes in detail how to read the signals.

Example of 2×2 Color Matrix

Figure 21:
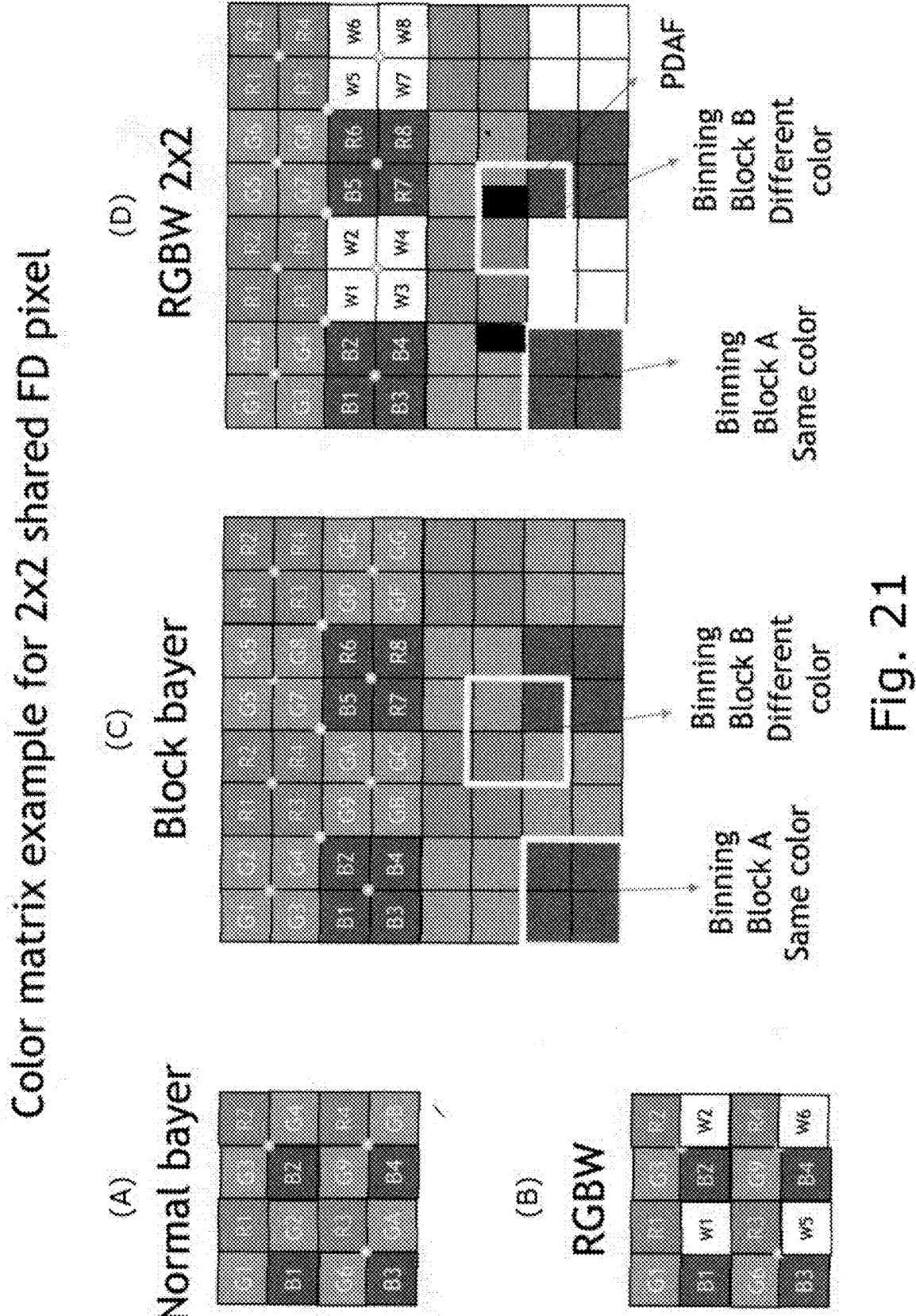
FIG. 21 shows examples of a color matrix for 2×2 FD-shared pixels.

The following now describes an example configuration of a 2×2 color matrix. FIG. 21 includes views (A) to (D) showing examples of a color matrix for 2×2 FD-shared pixels.

In FIG. 21, the view (A) shows a regular Bayer arrangement where RGGB pixels are arranged in a 2×2 square pattern, the view (B) shows an example of a color matrix where RGBW pixels are arranged in a 2×2 square pattern, the view (C) shows a block Bayer arrangement where four pixel units are arranged in a 2×2 square pattern, with each pixel unit including four pixels of the same color selected from R, G, G, and B arranged in a 2×2 square pattern, and the view (D) shows an example of a color matrix where four pixel units are arranged in a 2×2 square pattern, with each pixel unit including four pixels of the same color selected from R, G, B, and W arranged in a 2×2 square pattern.

Example Arrangement of Four PDs and One FD in Sharing Pixel PXL20A

Figure 22:
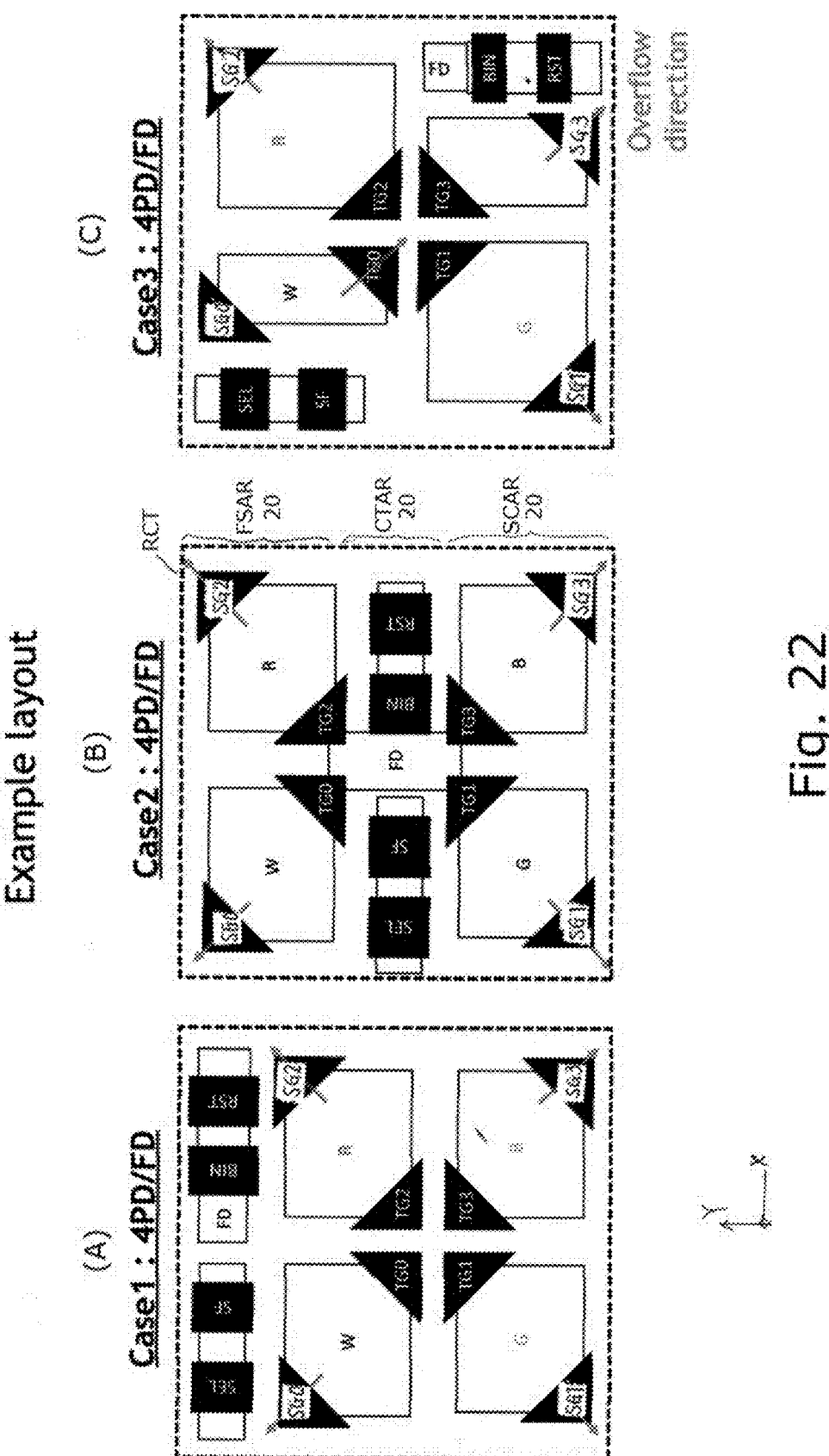
FIG. 22 shows simplified plan views showing examples of how four photodiodes, four transfer transistors, one floating diffusion FD, one reset transistor, one source follower transistor and one selection transistor are arranged in the sharing pixel relating to the second embodiment of the present disclosure.

The following now shows an example layout of the sharing pixel PXL20A. FIG. 22 includes simplified plan views (A), (B) and (C) showing, as an example, how four photodiodes, four transfer transistors, one floating diffusion FD, one reset transistor, one source follower transistor and one selection transistor are arranged in the sharing pixel relating to the second embodiment.

With reference to the following example, an example of how the four photodiodes PD0, PD1, PD2 and PD3, the four transfer transistors TG0-Tr, TG1-Tr, TG2-Tr and TG3-Tr, the four shutter gate transistors SG0-Tr, SG1-Tr, SG2-Tr, and SG3-Tr, one floating diffusion FD, one storage transistor BIN-Tr, one reset transistor RST-Tr, one source follower transistor SF-Tr, and one selection transistor SEL-Tr are arranged in the sharing pixel PXL20A. The relative positions of the elements represented by the terms such as left and right in the following description can be only example and modified in any other manners than the illustrated example.

The sharing pixel PXL20A has a rectangular region RCT20 where the elements are formed. The rectangular region RCT20 can be divided into a central region CTAR20 positioned in the center, and a first region FSAR20 and a second region SCAR20 sandwiching the central region CTAR20 therebetween (in the Y direction).

The first photodiode PD0, the first transfer transistor TG0-Tr, the first shutter gate transistor SG0-Tr, the third photodiode PD2, the third transfer transistor TG2-Tr and the third shutter gate transistor SG2-Tr are adjacent to each other in the X direction in the first region FSAR20. In the example shown in FIG. 22, the first photodiode PD0, the first transfer transistor TG0-Tr and the first shutter gate transistor SG0-Tr are formed in the left part (left half) of the first region FSAR20, and the third photodiode PD2, the third transfer transistor TG2-Tr and the third shutter gate transistor SG2-Tr are formed in the right part (right half) of the first region FSAR20. The first and third transfer transistors TG0-Tr and TG2-Tr are shaped like a triangle when seen from above, and formed near the central region CTAR20. The first and third shutter gate transistors SG0-Tr and SG2-Tr are shaped like a triangle when seen from above, and formed near the corners of the outer rectangular region RCT.

The second photodiode PD1, the second transfer transistor TG1-Tr, the second shutter gate transistor SG1-Tr, the fourth photodiode PD3, the fourth transfer transistor TG3-Tr and the four shutter gate transistor SG3-Tr are adjacent to each other in the X direction in the second region SCAR20. In the example shown in FIG. 22, the second photodiode PD1, the second transfer transistor TG1-Tr and the second shutter gate transistor SG1-Tr are formed in the left part (left half) of the second region SCAR20, and the fourth photodiode PD3, the fourth transfer transistor TG3-Tr and the fourth shutter gate transistor SG3-Tr are formed in the right part (right half) of the second region CSAR20. The second and fourth transfer transistors TG1-Tr and TG3-Tr are shaped like a triangle when seen from above, and formed near the central region CTAR20. The second and fourth shutter gate transistors SG1-Tr and SG3-Tr are shaped like a triangle when seen from above, and formed near the corners of the outer rectangular region RCT.

Referring to the example indicated by the view (A) in FIG. 22, in the first region FSAR20, the floating diffusion FD is arranged in the X- and Y-direction-wise central portion thereof, the reset transistor RST-Tr is arranged on the right side of the floating diffusion FD in the X direction, and the source follower transistor SF-Tr and the selection transistor SEL-Tr are arranged on the left side of the floating diffusion FD in the X direction.

Referring to the example indicated by the view (B) in FIG. 22, in the central region CTAR20, the floating diffusion FD is formed in the X- and Y-direction-wise central portion thereof, the reset transistor RST-Tr is formed on the right side of the floating diffusion FD in the X direction, and the source follower transistor SF-Tr and the selection transistor SEL-Tr are formed on the left side of the floating diffusion FD in the X direction.

Referring to the example indicated by the view (C) in FIG. 22, the floating diffusion FD, the storage transistor BIN-Tr, and the reset transistor RST-Tr are arranged in the right part of the second region SCAR20 in the X direction, and the source follower transistor SF-Tr and the selection transistor SEL-Tr are arranged in the upper left part of the first region SCAR20.

According to these examples of the layout of the pixels, the four photodiodes PD0 to PD3 are coupled with one floating diffusion FD via the four corresponding transfer transistors TG0-Tr to TG3-Tr. The overflow direction may be distorted by the channel formed beneath the transfer transistors TG. While the pixel transistor components are arranged in any of the PD regions, the distortion can be spatially accommodated by controlling the PD size.

In relation to the above-described layout of the pixels sharing the FD, the following now describes an example of the pattern of the full DTI (FDTI) structure.

Figure 23:
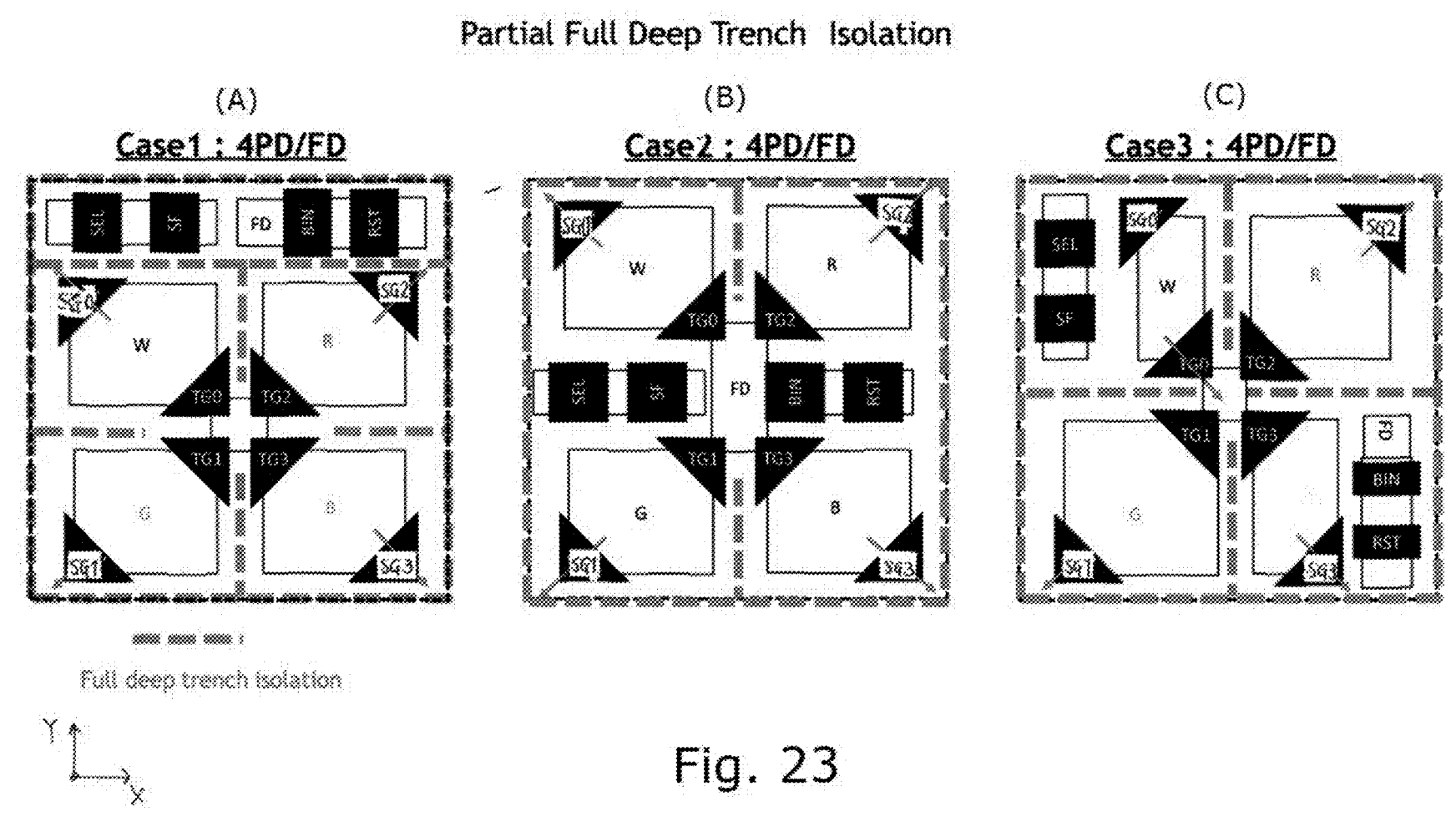

FIG. 23 includes views (A), (B) and (C) to illustrate example patterns of the full DTI structure in the FD shared pixel in the solid-state imaging device relating to the second embodiment of the present disclosure. The view (A) in FIG. 23 shows a full DTI structure relating to the second embodiment, which corresponds to the layout of the view (A) in FIG. 22. The view (B) in FIG. 23 shows a full DTI structure relating to the second embodiment, which corresponds to the layout of the view (B) in FIG. 22. The view (C) in FIG. 23 shows a full DTI structure relating to the second embodiment, which corresponds to the view (C) in FIG. 22.

As shown in the comparative example shown in the view (A) in FIG. 9, a full DTI is entirely formed without a gap along the outer edge of a rectangular region RCT in the conventional art, and a full DTI extends linearly in the central area CTAR in the X direction, even in the region corresponding to the region where the floating diffusion FD is formed.

According to the examples shown in the views (A), (B) and (C) in FIG. 23, on the other hand, a full DTI is entirely formed without a gap along the outer edge of a rectangular region RCT, and a full DTI extends linearly in the central area CTAR in the X direction partially (selectively), except for the central region corresponding to the region where the floating diffusion FD is formed.

A full DTI structure can not be applied to such pixel components as pn junctions and MOS transistors. In the second embodiment, the full DTI region is partially absent under such pixel components as the FD for the FD shared pixel. In other words, in a region under a pixel component such as an FD of an FD shared pixel, the full DTI is partially missing. The overflow direction can be controlled either by the transfer transistor TG or shutter gate transistor SG provided for the purpose of anti blooming, by means of the n region formed beneath the gate coupled with the FD node. The full DTI is positioned between the photodiodes PD and the pixel transistors, to prevent crosstalk between adjacent photodiodes PDs.

The following now describes a block Bayer configuration and a color filter configuration applicable in the second embodiment of the present disclosure. FIG. 24 includes views (A) and (B) to illustrate a block Bayer configuration and a color filter configuration applicable in the second embodiment of the present disclosure.

In a block Bayer arrangement, four pixel units PU are arranged in a 2×2 square pattern, where each pixel unit PU includes four pixels of the same color selected from the R, G, G and B pixels and arranged in a 2×2 square pattern. The view (A) shown in FIG. 24 shows a color matrix of a block Bayer arrangement in a full resolution mode. In FIG. 24, the view (B) shows a color matrix in a 2×2 binning mode. The 2×2 binning mode can achieve high dynamic range (HDR) and high speed and low noise responsiveness.

Figure 25:
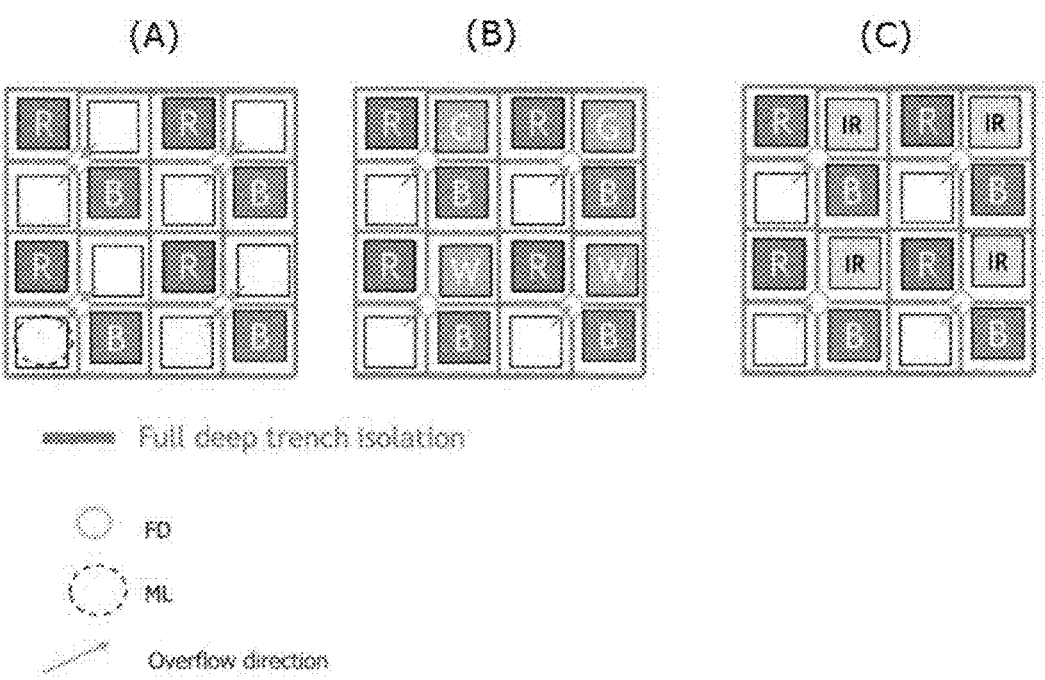
FIG. 25 is used to illustrate examples of a color matrix configuration applicable in the second embodiment of the present disclosure.

The following now describes examples of the color matrix configuration applicable in the second embodiment of the present disclosure. The views (A), (B) and (C) in FIG. 25 are used to illustrate examples of the color matrix configuration applicable in the second embodiment of the present disclosure. In FIG. 25, the view (A) shows an example of a color matrix of RCC(W) B, the view (B) shows an example of a color matrix of RGC(W) B, and the view (C) shows an example of a color matrix of R(IR)C(W)B.

In a color matrix configuration for FD shared PDs, a high-transmittance filter is coupled with a low-transmittance filter matrix. For example, a high-transmittance clear (C) (white: W) filter is coupled with low-transmittance R and G filters. The overflow charges at the maximum responsiveness are stored in the floating diffusion FD (FD node), so that its saturation level is extended and the saturation points are thus equalized.

The following further describes the color filters relating to the second embodiment of the present disclosure. A color filter is formed above a corresponding FD shared PD. Specifically, a color filter configuration of RGB, G filters are applied to a 2×2 block of FD shared PDs. Since a FD shared configuration is employed in the second embodiment, the pixels can be formed above a back sided isolation (BSI) structure utilizing a partial full DTI, which can prevent color signal crosstalk between the PDs. This enables the binning function of the PDs sharing a FD. In the case of 2×2 binning, all of the overflow charges are entirely stored in the floating diffusion FD (FD node).

Figure 26:
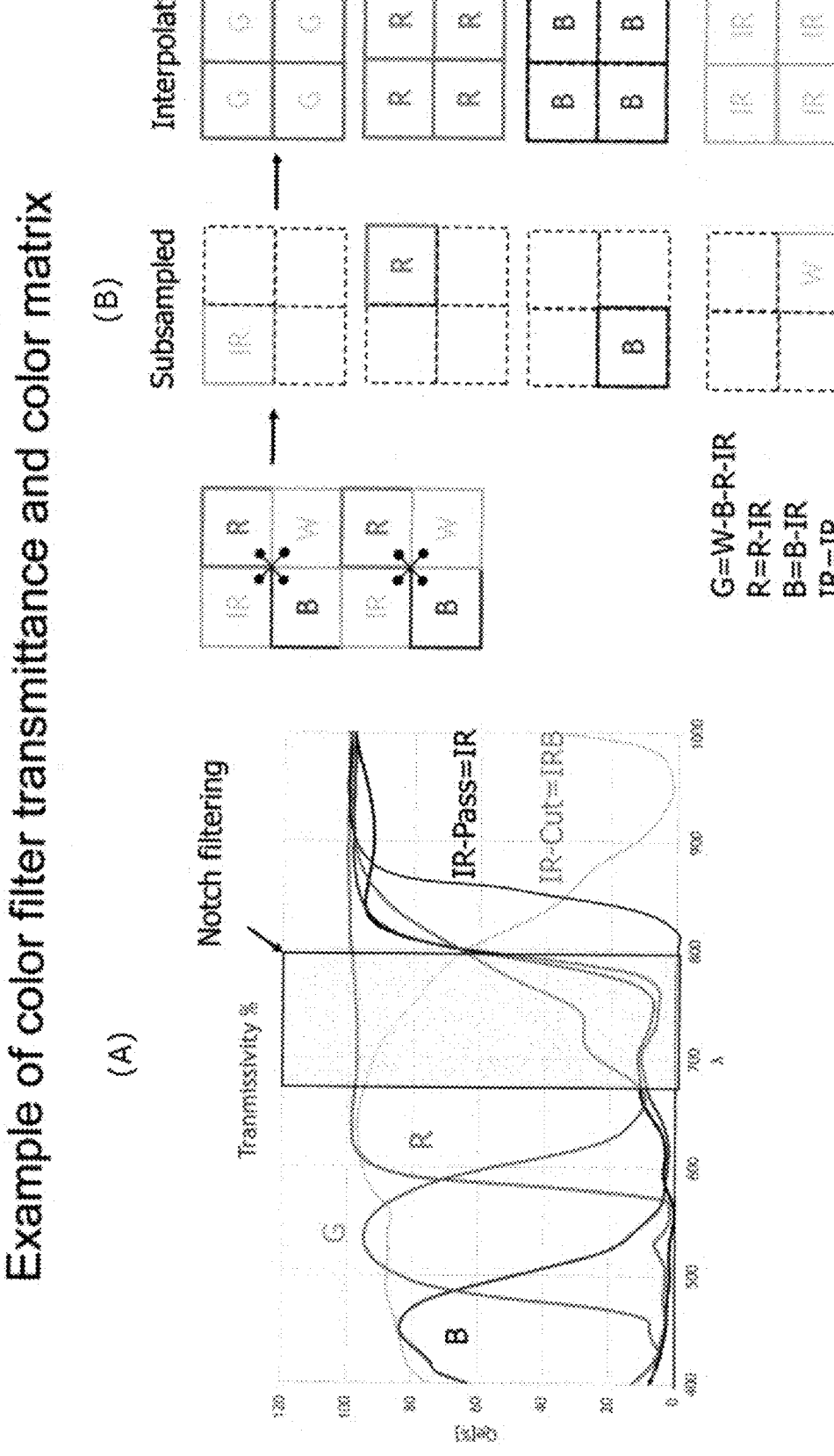
FIG. 26 is used to illustrate an example of photo response for a (IR)RBW configuration with a shared FD structure and color matrix interpolation.

The following now describes an example of photo response in a (IR)RBW configuration with a shared FD structure and color matrix interpolation. FIG. 26 includes views (A) and (B) to illustrate, as an example, photo response in a (IR)RBW configuration with a shared FD structure and color matrix interpolation. In FIG. 26, the view (A) shows, as an example, the transmittance of the color filters, and the view (B) shows, as an example, color matrix interpolation in a (IR)(RBW) color matrix. The view (A) in FIG. 26 shows the transmittance of regular color filters and transmittance of an IR notch filter.

According to the configuration shown in FIG. 26, the dynamic range of the W filter is significantly extended by the charges stored in the floating diffusion FD. As for the color matrix interpolation shown in the view (B) in FIG. 26, the W(C), B, R and IR filters are used, and operations G=W−B−R−IR, R=R−IR, B=B−IR, IR=IR are performed, so that the performance of the GRB filters can be reproduced at a level close to that of the original GRB filters.

The following now describes the circuit and method for reading column outputs from the sharing pixels PXL20A using a predetermined color matrix in the pixel part 20 relating to the second embodiment.

Figure 27:
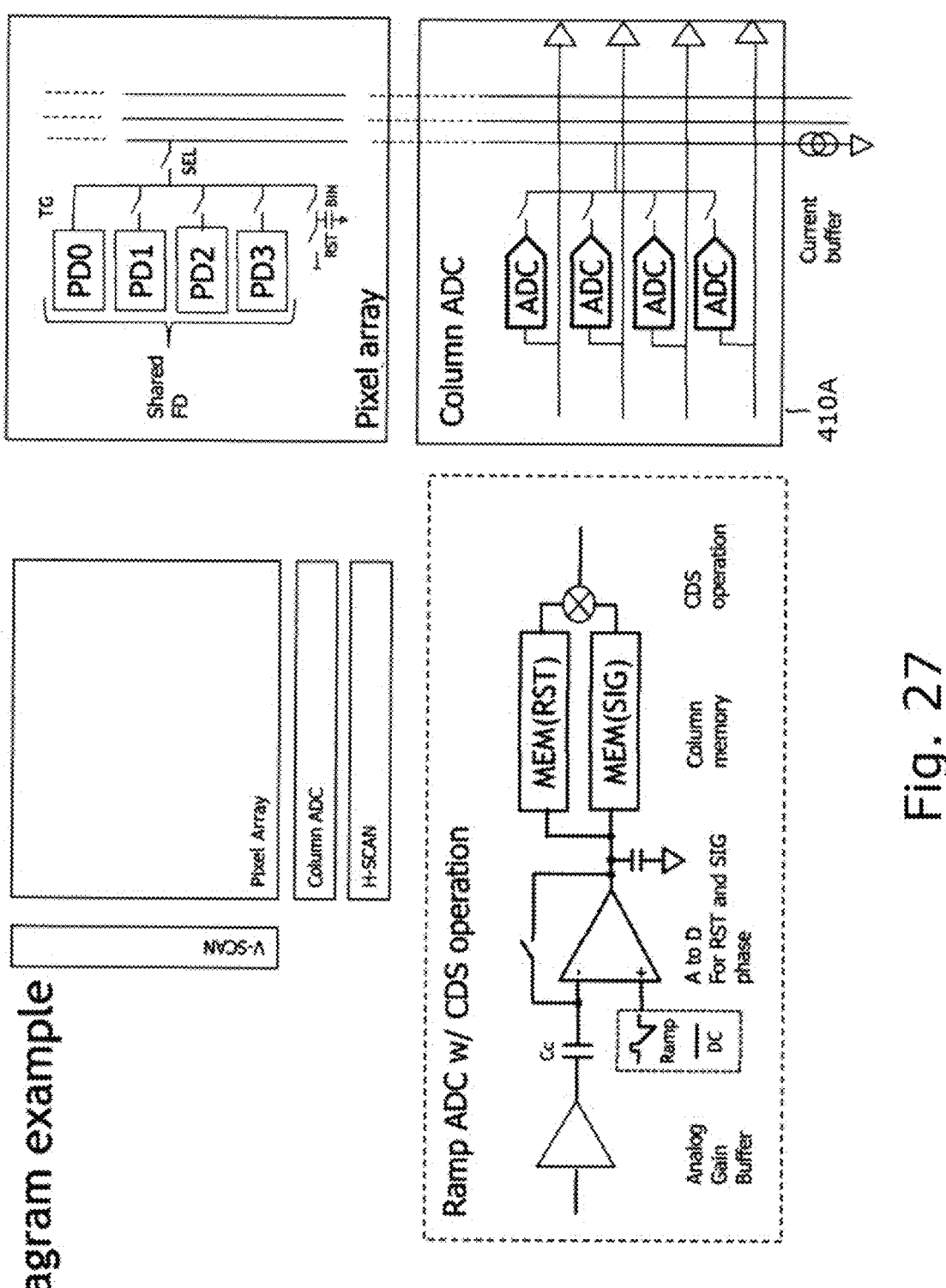
FIG. 27 shows an example configuration of a column-wise ADC conversion employed in a reading system for column outputs from a pixel part of the solid-state imaging device according to the embodiment of the present disclosure.
Figure 28:
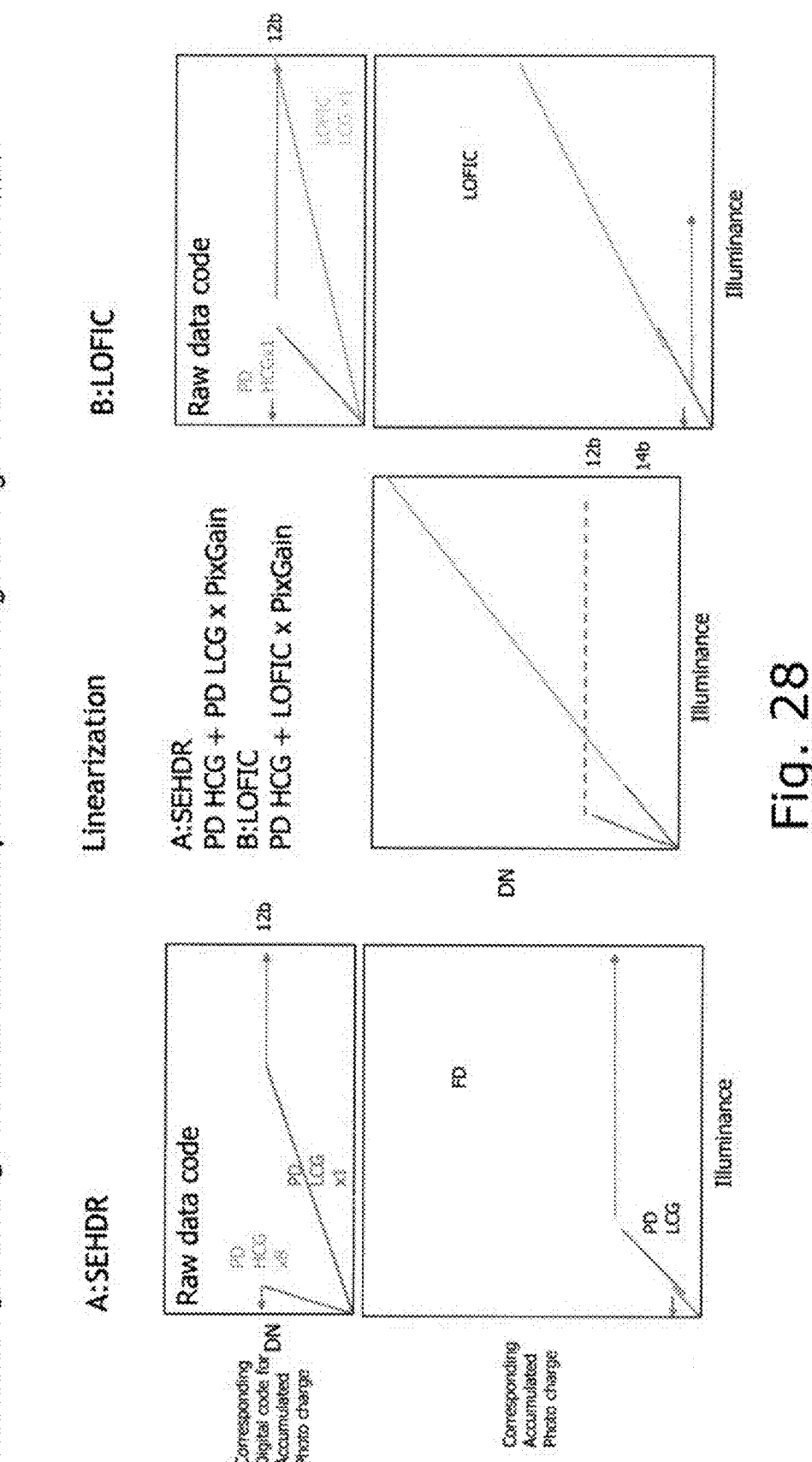
FIG. 28 is a first view showing photo charge coverage for each of readout operation and charge mixing scheme for linearization.
Figure 29:
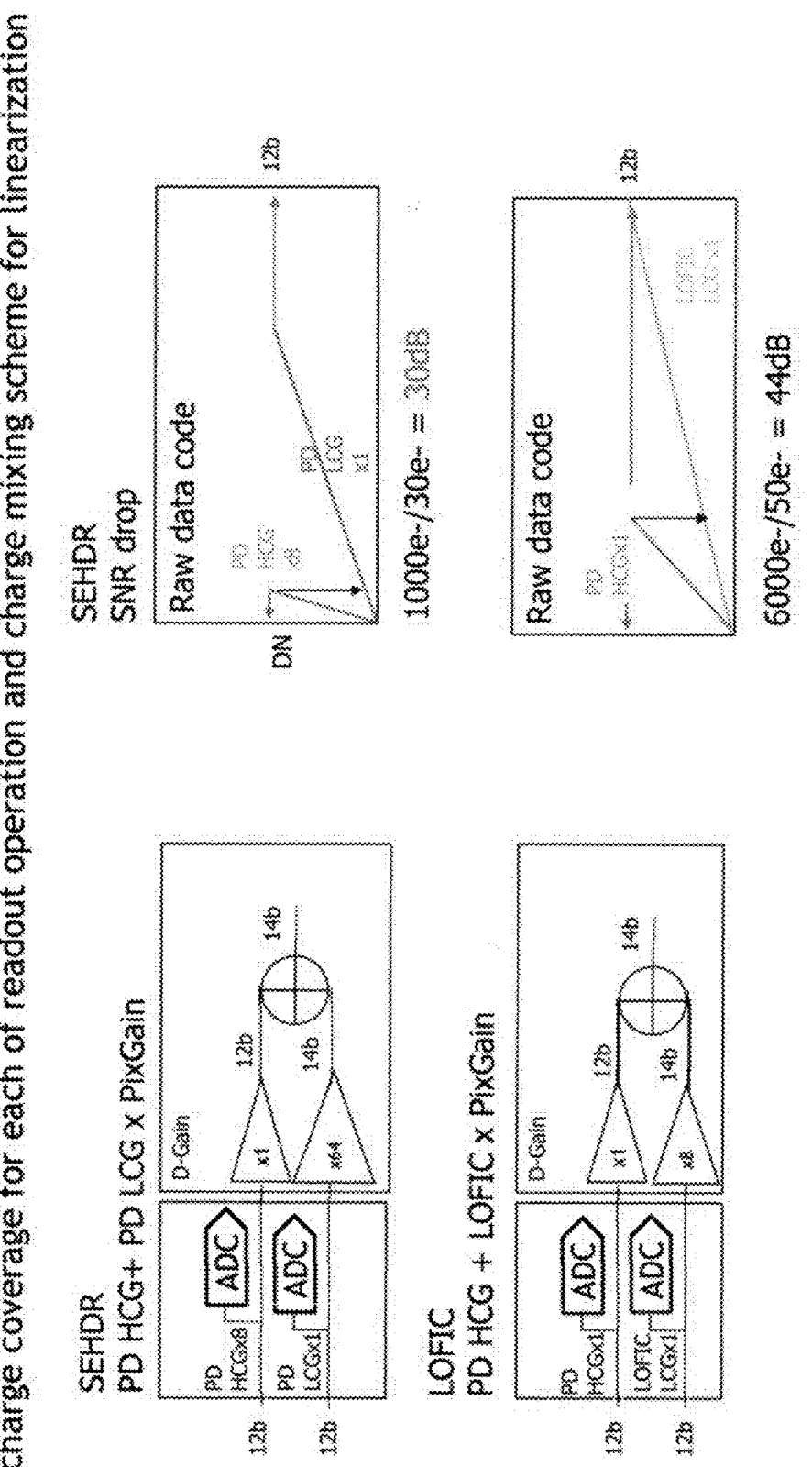
FIG. 29 is a second view showing photo charge coverage for each of readout operation and charge mixing scheme for linearization.
Figure 30:
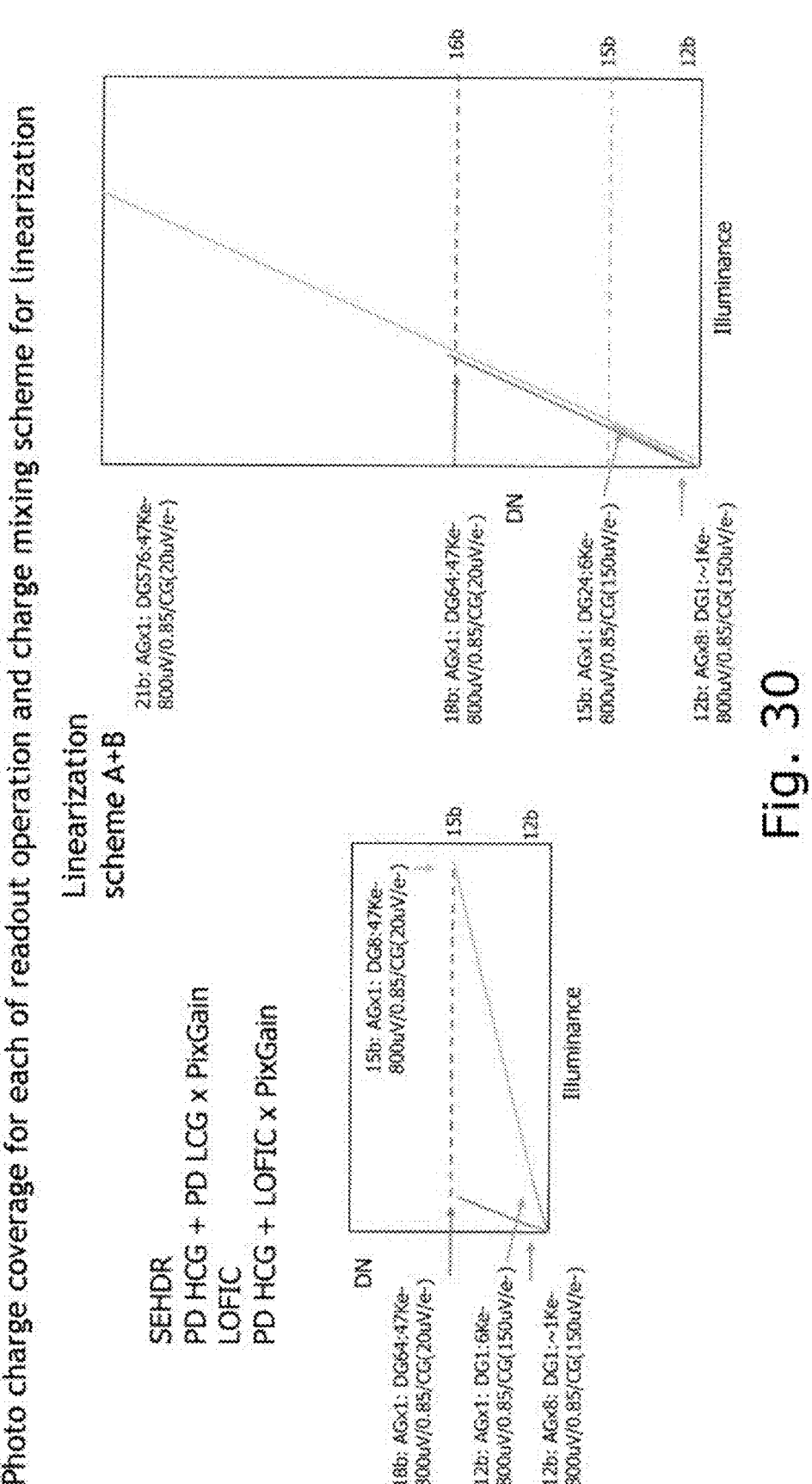
FIG. 30 is a third view showing photo charge coverage for each of readout operation and charge mixing scheme for linearization.

FIG. 27 shows an example configuration of the column-wise ADC conversion employed in the reading system for the column outputs from the pixel part of the solid-state imaging device according to the embodiment of the present disclosure. FIG. 28 is a first view showing photo charge coverage for each of readout operation and charge mixing scheme for linearization. FIG. 29 is a second view showing photo charge coverage for each of readout operation and charge mixing scheme for linearization. FIG. 30 is a third view showing photo charge coverage for each of readout operation and charge mixing scheme for linearization.

A reading circuit 40A relating to the present embodiment includes a column ADC 410A. FIG. 28 shows a case A where the column ADC 410A is applied to a single exposure high dynamic range (SEHDR) performance. A dual conversion gain scheme is used, specifically, the high conversion gain (first conversion gain) HCG and the low conversion gain (second conversion gain) LCG are both used. In this case, the charges in the photodiodes PDs are firstly read with the high conversion gain HCG as a signal, the charges in the photodiodes PDs are secondly read with a product of multiplying the low conversion gain LCG with a pixel gain PixGain as another signal, and the signals are added together.

A case B where the column ADC 410A is applied to the LOFIC mode is now described. A dual conversion gain scheme is used, specifically, the high conversion gain (first conversion gain) HCG and the low conversion gain (second conversion gain) LCG are both used. In this case, the charges in the photodiode PD0 are firstly read with the high conversion gain HCG as a signal, a product of multiplying a predetermined gain corresponding to the charges in the floating diffusion FD with the pixel gain PixGain is read as another signal, and the signals are added together. The addition allows highly advanced linearization to be performed as shown in FIG. 30.

In this case, as shown in FIG. 29, AD conversion can be performed for each of the signals representing stored photo charges and at least a plurality of ADCs are utilized for different conversion gains. These digital codes can be linearized after post data processing.

The FD shared reading system circuit relating to the second embodiment is configured such that global reading may be realized with pixel-wise ADCs (3QDPS) having a plurality of operation sequences.

Figure 31:
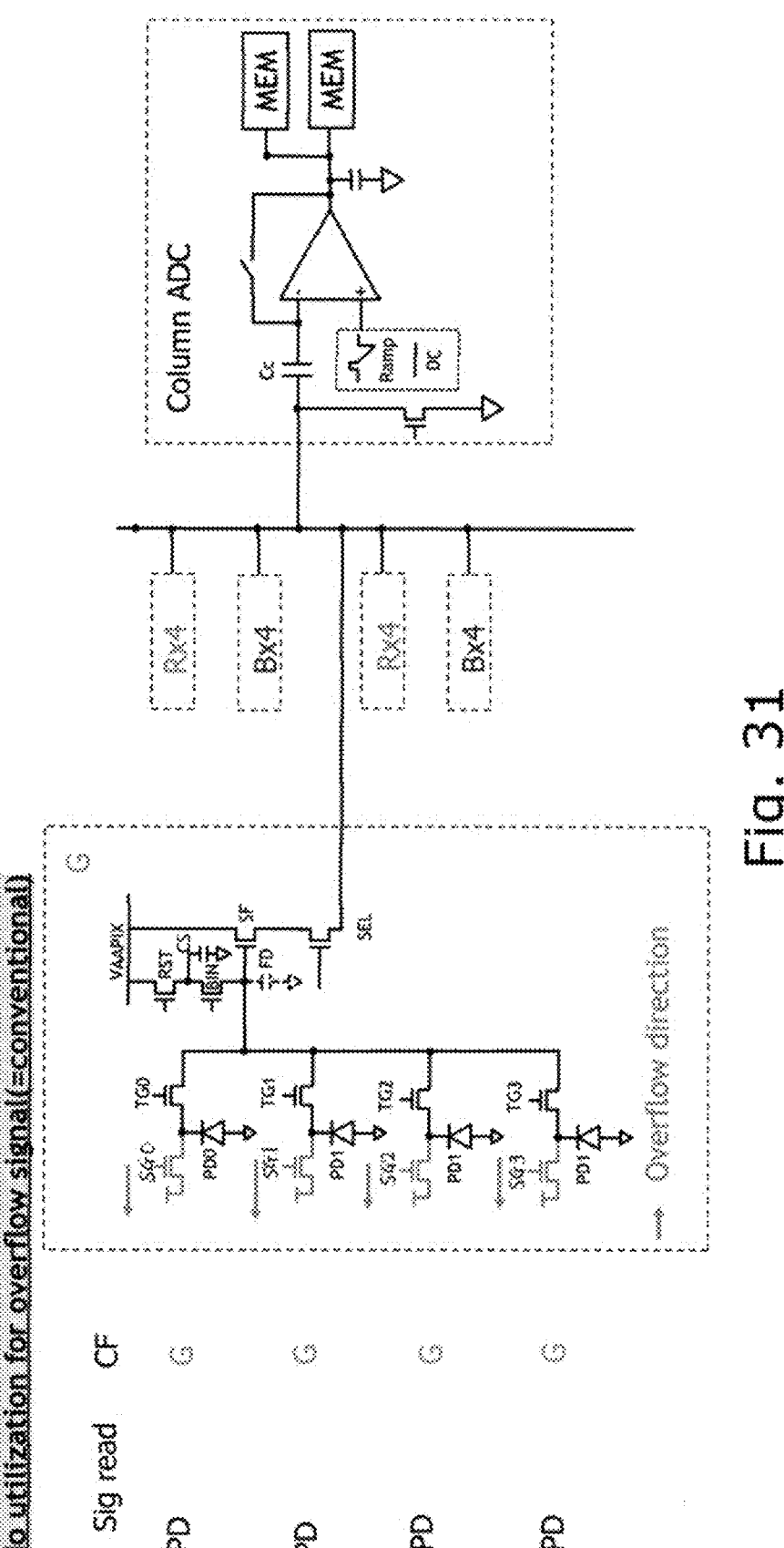
FIG. 31 shows an example reading system for a pixel circuit with shutter function that has a 2×2 block Bayer configuration and in which four photodiodes PDs share one floating diffusion FD, where no overflow signals are used.
Figure 32:
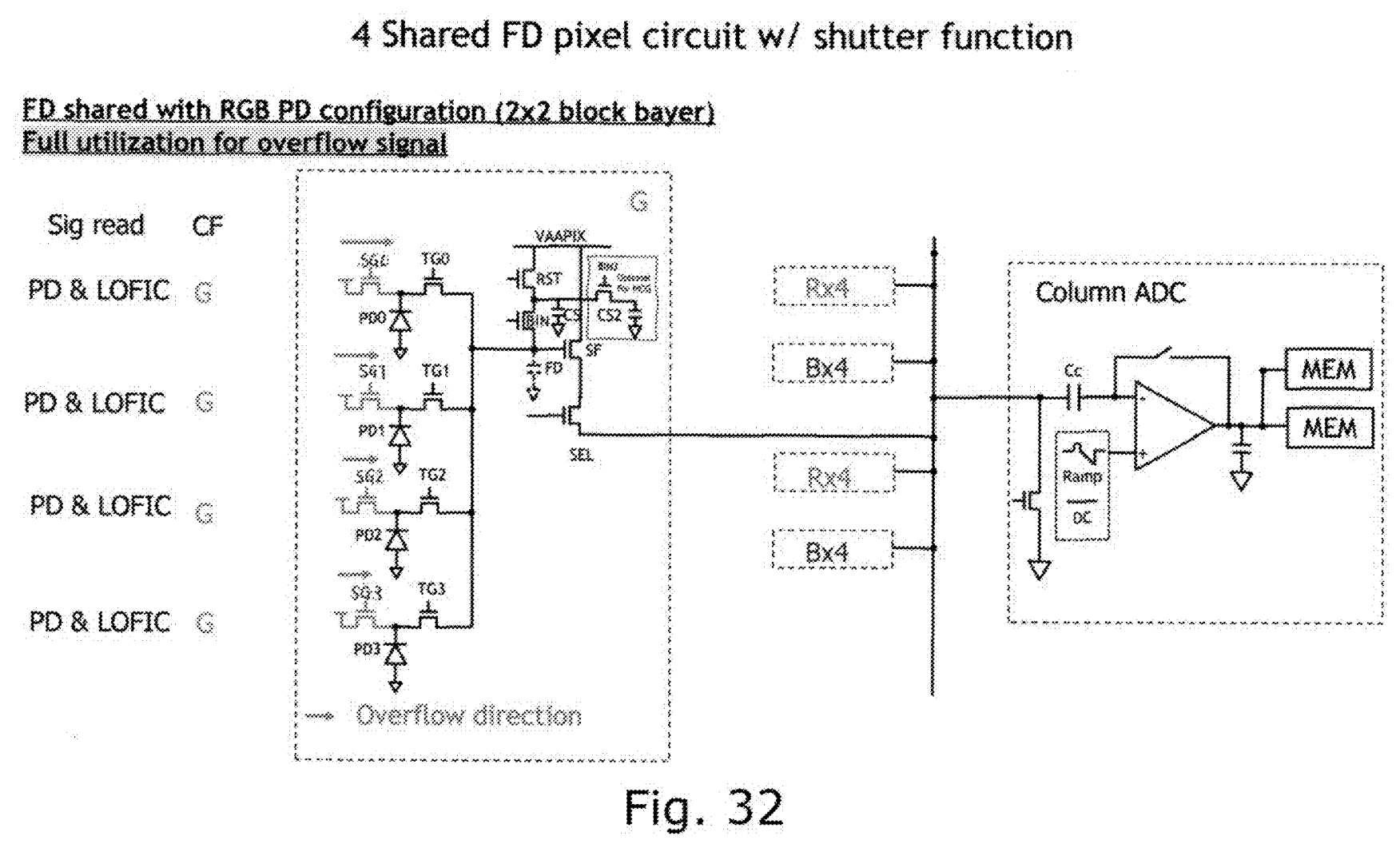
Figure 33:
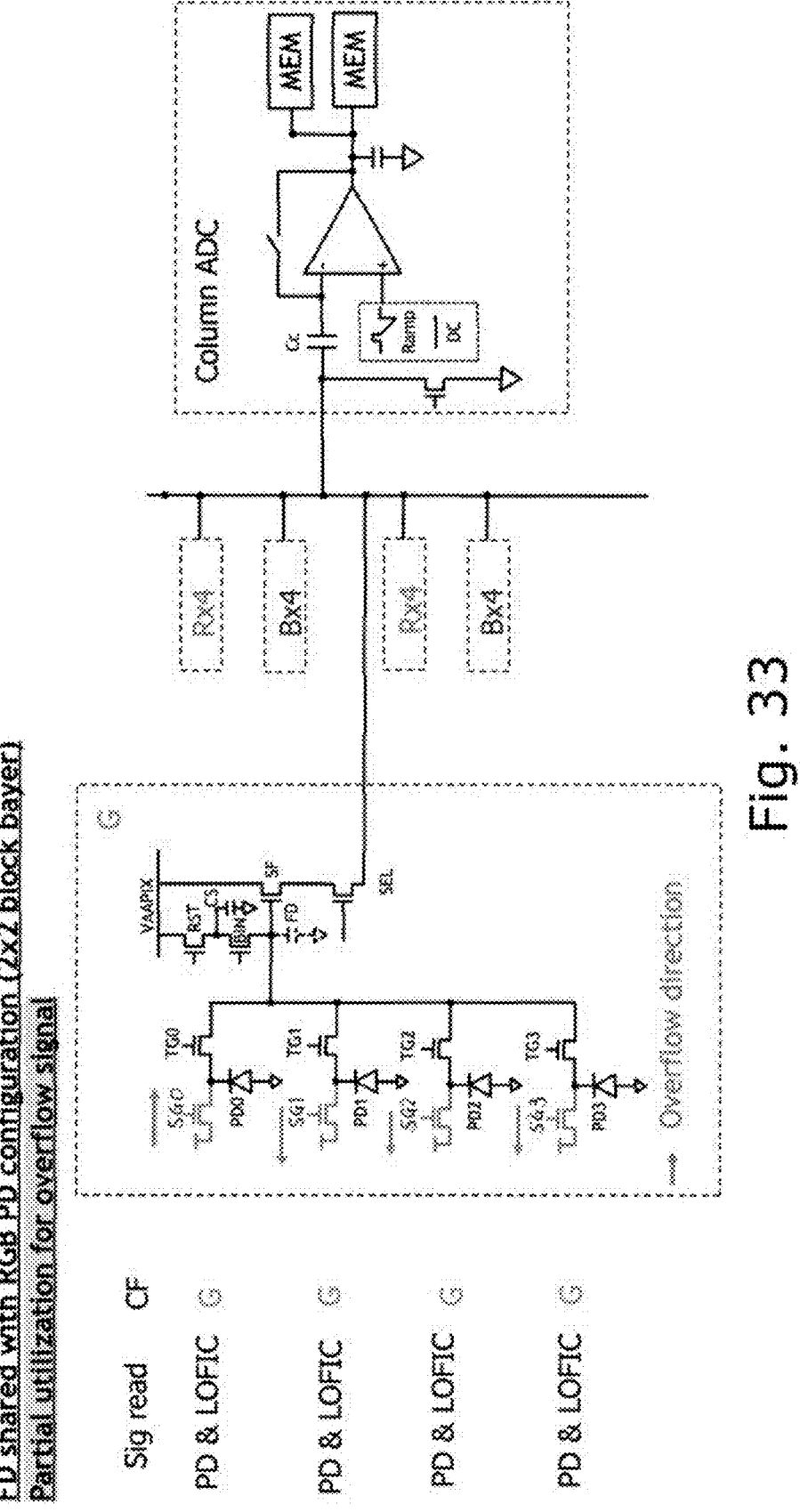
FIG. 33 shows an example reading system for a pixel circuit with shutter function that has a 2×2 block Bayer configuration and in which four photodiodes PDs share one floating diffusion FD, where part of the overflow signals are used.

FIGS. 31, 32 and 33 show examples of a reading system for a pixel circuit with shutter function that has the block Bayer configuration relating to the second embodiment and in which four photodiodes PDs share one floating diffusion FD.

FIG. 31 shows an example reading system for a pixel circuit with shutter function that has a 2×2 block Bayer configuration and in which four photodiodes PDs share one floating diffusion FD, where no overflow signals are used.

FIG. 32 shows an example reading system for a pixel circuit with shutter function that has a 2×2 block Bayer configuration and in which four photodiodes PDs share one floating diffusion FD, where all overflow signals are used.

FIG. 33 shows an example reading system for a pixel circuit with shutter function that has a 2×2 block Bayer configuration and in which four photodiodes PDs share one floating diffusion FD, where part of the overflow signals are used. In the present example, the overflow signal from the photodiode PD0 is used.

Figure 34:
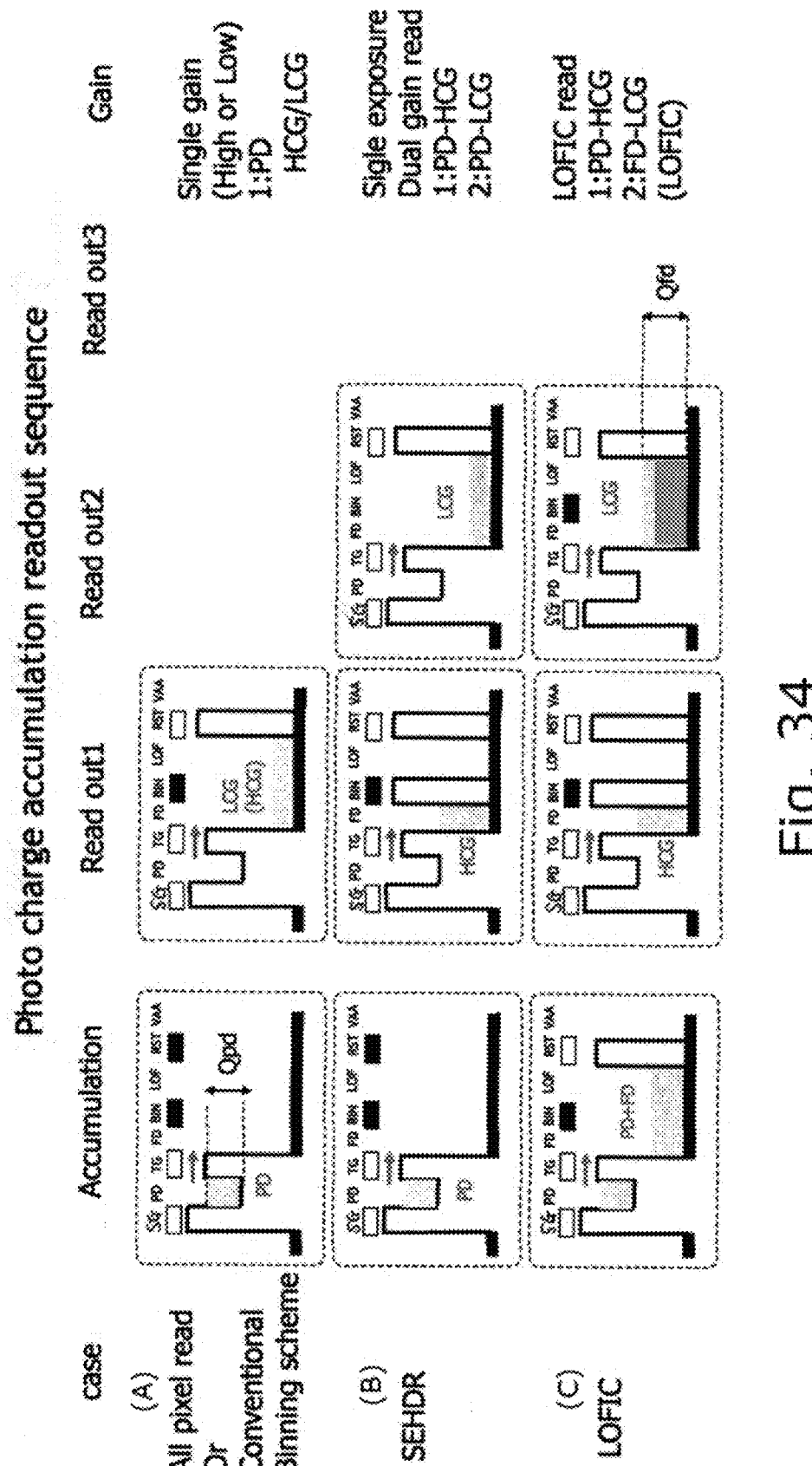
FIG. 34 shows example sequences of operations to accumulate and read photo charges applicable to the solid-state imaging device relating to the second embodiment of the present disclosure.

The following further describes how to read the pixel signals in the second embodiment. FIG. 34 includes views (A), (B) and (C) showing example sequences of operations to read accumulated photo charges applicable to the solid-state imaging device relating to the second embodiment of the present disclosure. For better intelligibility, the views (A), (B) and (C) in FIG. 34 are equivalent to those in FIG. 17, which are referred to in the first embodiment.

A read-out operation applicable to sharing pixels can be typified by the methods applicable to the cases shown in the views (A), (B) and (C) in FIG. 34.

The case shown in the view (A) in FIG. 34 is applied to read pixel signals from all pixels or perform binning. A single gain is used as the read-out gain, which is selected from among the high conversion gain (first conversion gain) HCG and the low conversion gain (second conversion gain) LCG. In this case, the charges in the first or second photodiode PD0 or PD1 are read, for example.

The case shown in the view (B) in FIG. 34 is applied to single exposure high dynamic range (SEHDR) performance. A dual conversion gain scheme is used, specifically, the high conversion gain (first conversion gain) HCG and the low conversion gain (second conversion gain) LCG are both used. In this case, the charges in the first photodiode PD0 are firstly read with the high conversion gain HCG, and the charges in the photodiodes PDs are secondly read with the low conversion gain LCG.

The case shown in the view (C) in FIG. 34 is applied to the LOFIC mode. A dual conversion gain scheme is used, specifically, the high conversion gain (first conversion gain) HCG and the low conversion gain (second conversion gain) LCG are both used. In this case, the charges in the first photodiode PD0 are firstly read with the high conversion gain HCG, and the charges in the floating diffusion FD are secondly read with the low conversion gain LCG.

Figure 35:
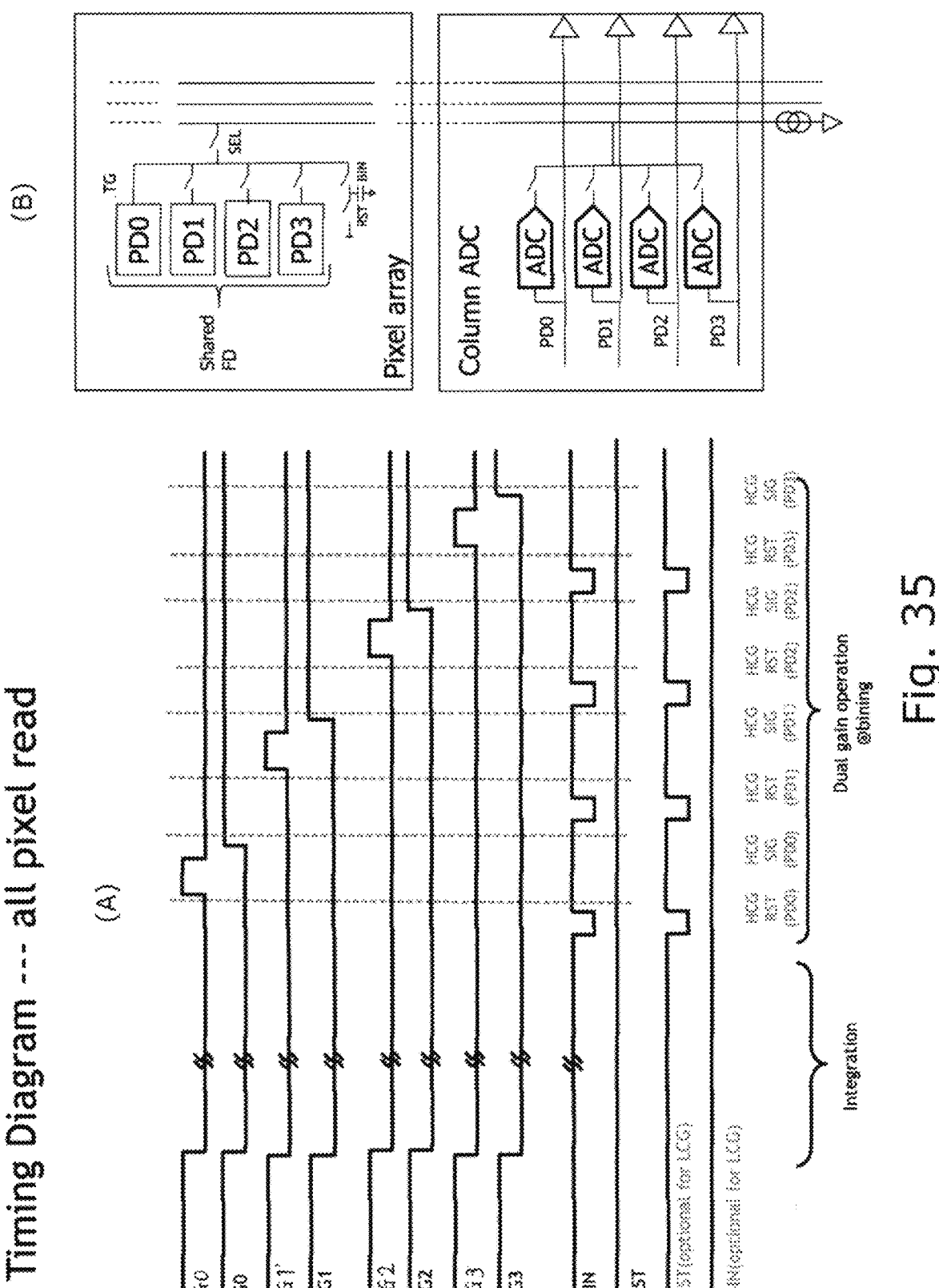
FIG. 35 is a timing chart to illustrate an example of all pixel read-out operation applicable to the sharing pixel of the solid-state imaging device relating to the second embodiment of the present disclosure, also showing an example of the reading circuit of the sharing pixel.

FIG. 35 includes a timing chart (A) to illustrate an example of all pixel read-out operation applicable to the sharing pixel of the solid-state imaging device relating to the second embodiment of the present disclosure, along with a view (B) showing an example of the reading circuit of the sharing pixel.

According to the example shown, upon elapse of a charge integration period, a dual conversion gain operation using LOFIC is firstly performed to read the charges in the first photodiode PD0. Specifically, a high conversion gain reset signal read-out operation HCGRST(PD0), and a high conversion gain illuminance signal read-out operation HCGSIG (PD0) are performed in order on the first photodiode PD0. After this, a high conversion gain reset signal read-out operation HCGRST(PD1) and a high conversion gain illuminance signal read-out operation HCGSIG(PD1) are performed in order on the second photodiode PD1. Subsequently, a high conversion gain reset signal read-out operation HCGRST(PD2) and a high conversion gain illuminance signal read-out operation HCGSIG(PD2) are performed in order on the third photodiode PD2. Following this, a high conversion gain reset signal read-out operation HCGRST(PD3) and a high conversion gain illuminance signal read-out operation HCGSIG(PD3) are performed in order on the fourth photodiode PD3.

After this, a dual conversion gain operation using SEHDR is next performed to read the charges in the second photodiode PD1. Specifically, a low conversion gain reset signal read-out operation LCGRST(PD0/1) is performed on the first or second photodiode PD0 or PD1. After this, a high conversion gain reset signal read-out operation HCGRST (PD1), a high conversion gain illuminance signal read-out operation HCGSIG(PD1), and a low conversion gain illuminance signal read-out operation LCGSIG(PD1) are performed in order.

Figure 36:
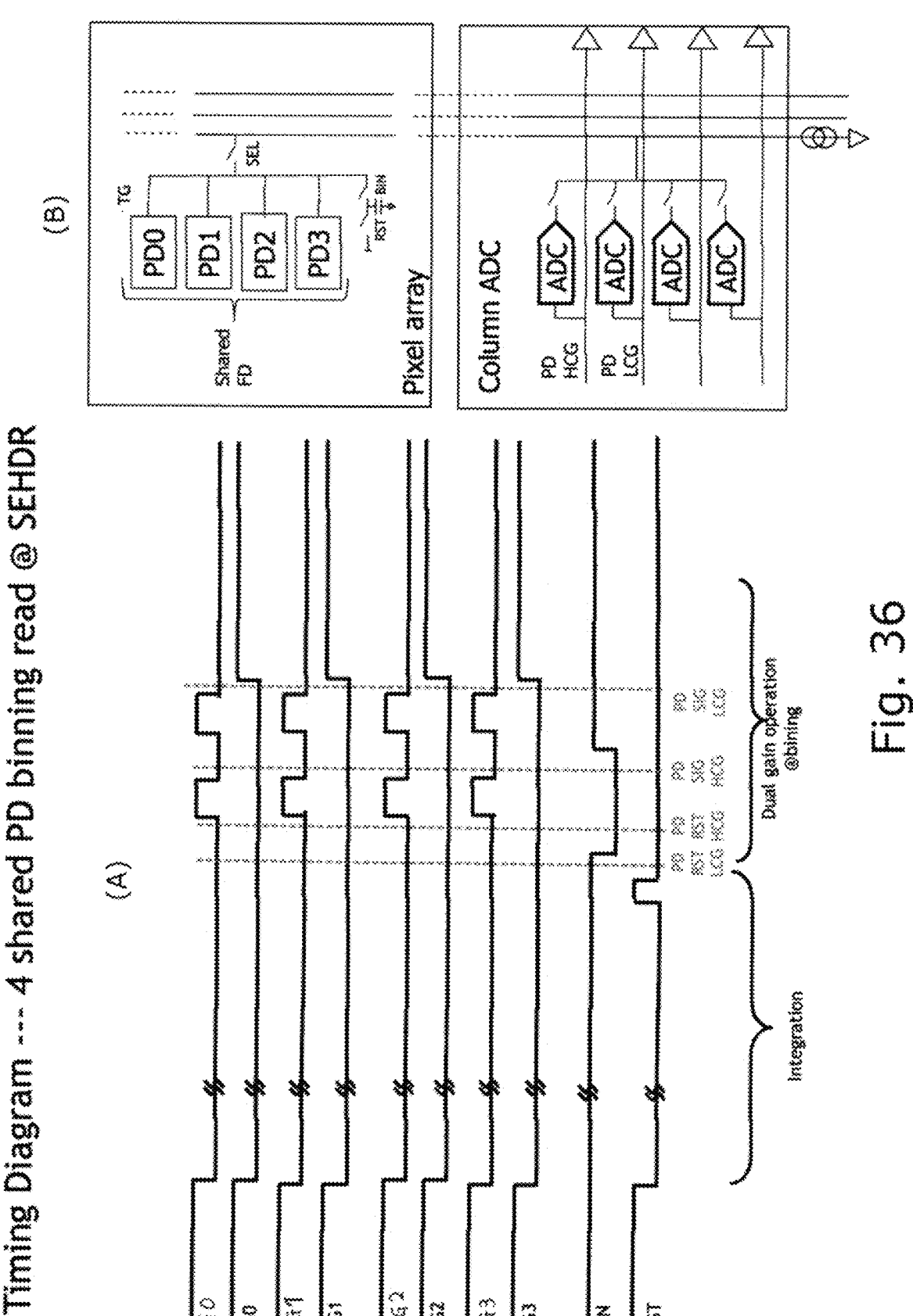
FIG. 36 is a timing chart illustrating an example of a four shared PD binning read-out operation applicable to the sharing pixel of the solid-state imaging device relating to the second embodiment of the present disclosure, also showing an example of the reading circuit of the sharing pixel.

FIG. 36 includes a timing chart (A) illustrating an example of a four shared PD binning read-out operation applicable to the sharing pixel of the solid-state imaging device relating to the first embodiment of the present disclosure, along with a view (B) showing an example of the reading circuit of the sharing pixel.

According to the example shown, upon elapse of a charge integration period, a dual conversion gain operation using SEHDR is firstly performed to read the charges in a predetermined photodiode, for example, the first photodiode PD0. Specifically, a low conversion gain reset signal read-out operation LCGRST(PD), a high conversion gain reset signal read-out operation HCGRST (PD), a high conversion gain illuminance signal read-out operation HCGSIG (PD), and a low conversion gain illuminance signal read-out operation LCGSIG (PD) are performed in order on the first photodiode PD0.

Figure 37:
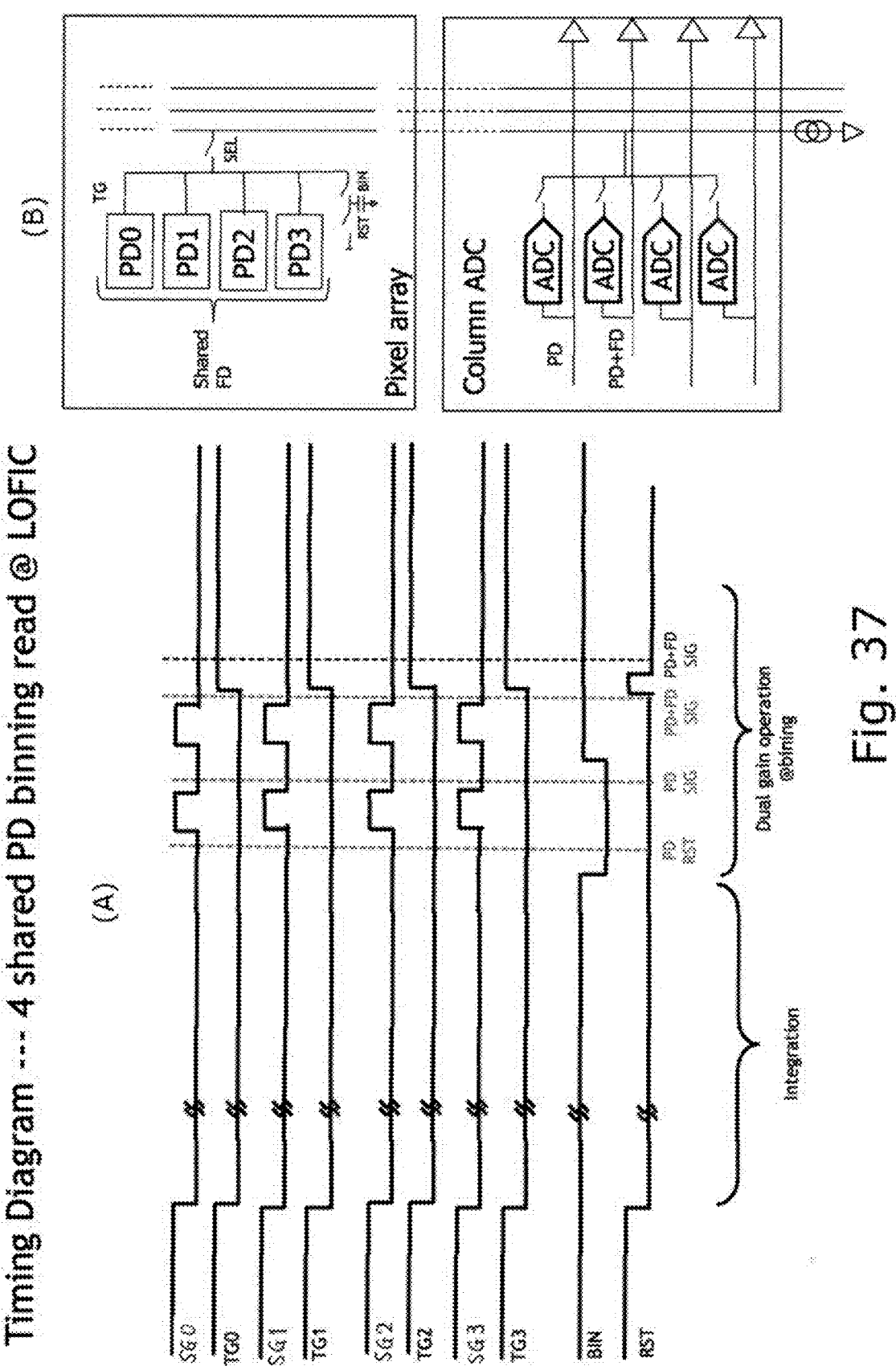
FIG. 37 is a timing chart illustrating an example of a four shared PD binning read-out operation with LOFIC applicable to the sharing pixel of the solid-state imaging device relating to the second embodiment of the present disclosure, also showing an example of the reading circuit of the sharing pixel.
Figure 38:
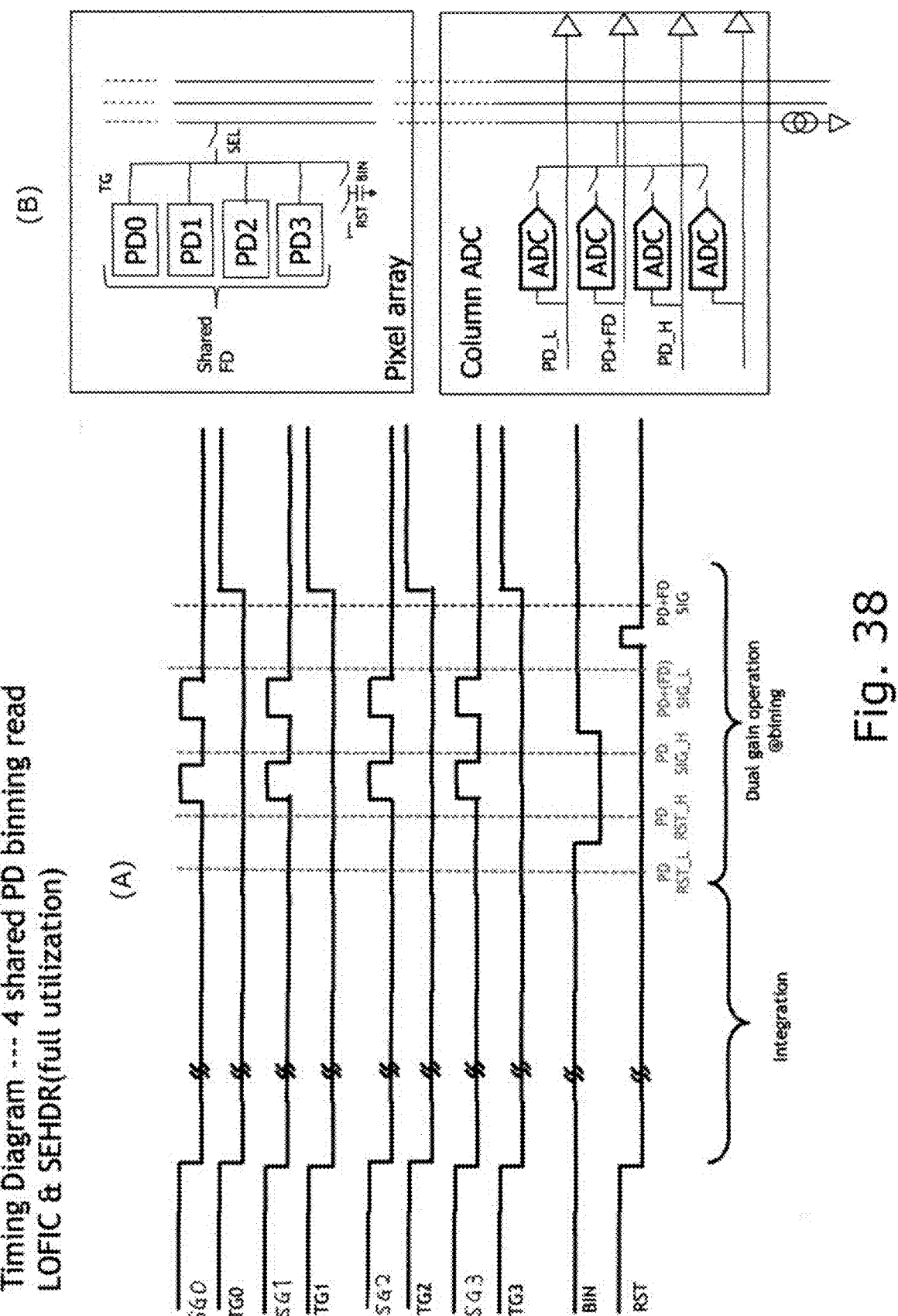
FIG. 38 is a timing chart to illustrate an example of a four shared PD binning read-out operation with LOFIC and SEHDR being fully utilized applicable to the sharing pixel of the solid-state imaging device relating to the second embodiment of the present disclosure, also showing an example of the reading circuit of the sharing pixel.
Figure 39:
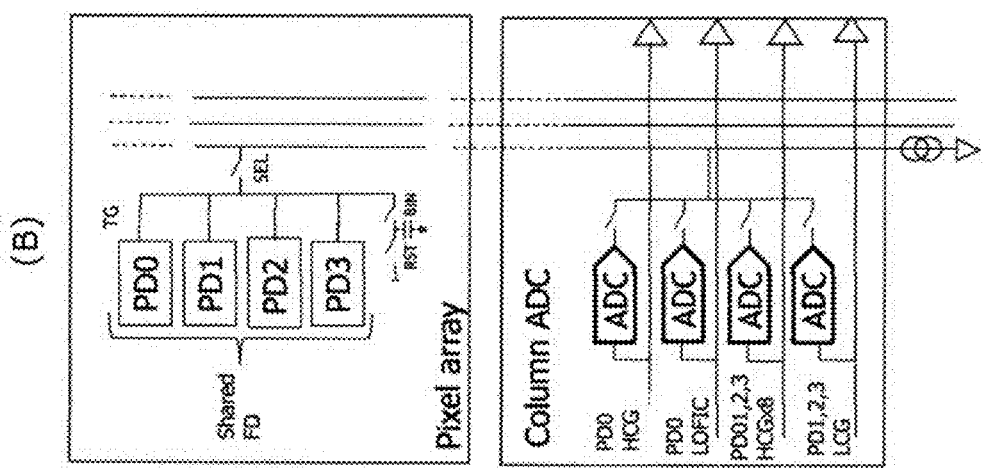
FIG. 39 is a timing chart illustrating an example of a four-sharing PD binning read-out operation with LOFIC and SEHDR being partially utilized applicable to the sharing pixel of the solid-state imaging device relating to the second embodiment of the present disclosure, showing an example of the reading circuit of the sharing pixel.

FIGS. 37, 38 and 39 each show a timing chart to illustrate an example of a read-out operation applicable to the sharing pixel of the solid-state imaging device relating to the second embodiment, along with the respective read-out processes.

FIG. 37 includes a timing chart (A) illustrating an example of a four shared PD binning read-out operation at LOFIC applicable to the sharing pixel of the solid-state imaging device relating to the second embodiment of the present disclosure, along with a view (B) showing an example of the reading circuit of the sharing pixel. FIG. 38 includes a timing chart (A) to illustrate an example of a four shared PD binning read-out operation with LOFIC and SEHDR being fully utilized applicable to the sharing pixel of the solid-state imaging device relating to the second embodiment of the present disclosure, along with a view (B) showing an example of the reading circuit of the sharing pixel. FIG. 39 includes a timing chart (A) illustrating an example of a four shared PD binning read-out operation with LOFIC and SEHDR being partially utilized applicable to the sharing pixel of the solid-state imaging device relating to the first embodiment of the present disclosure, along with a view (B) showing an example of the reading circuit of the sharing pixel.

FIG. 40 includes views (A), (B) and (C) showing an example of a read-out operation with LOFIC and SEHDR being fully utilized applicable to the solid-state imaging device relating to the second embodiment of the present disclosure. FIG. 41 includes views (A), (B), (C) and (D) showing an example of a read-out operation with LOFIC being partially utilized and SEHDR applicable to the solid-state imaging device relating to the second embodiment of the present disclosure.

A read-out operation with LOFIC and SEHDR being partially used applicable to the sharing pixels can be typified by the method applicable to the cases shown in the views (A), (B), (C) and (D) in FIGS. 40 and 41.

In FIG. 40, the view (A) shows an example of how to read the charges in the photodiodes PD with the high conversion gain, the view (B) shows an example of how to read the charges in the photodiodes PD with the low conversion gain, and the view (C) shows an example of how to read the floating diffusion FD including the overflow charges.

In FIG. 41, the view (A) shows an example of how to read the charges in the photodiode PD0 with the high conversion gain, the view (B) shows an example of how to read the floating diffusion FD including the overflow charges from the photodiode PD0, the view (C) shows an example of how to read the charges in the photodiodes PD1, PD2, and PD3 with the high conversion gain, and the view (D) shows an example of how to read the charges in the photodiodes PD1, PD2 and PD3 with the low conversion gain.

Figure 42:
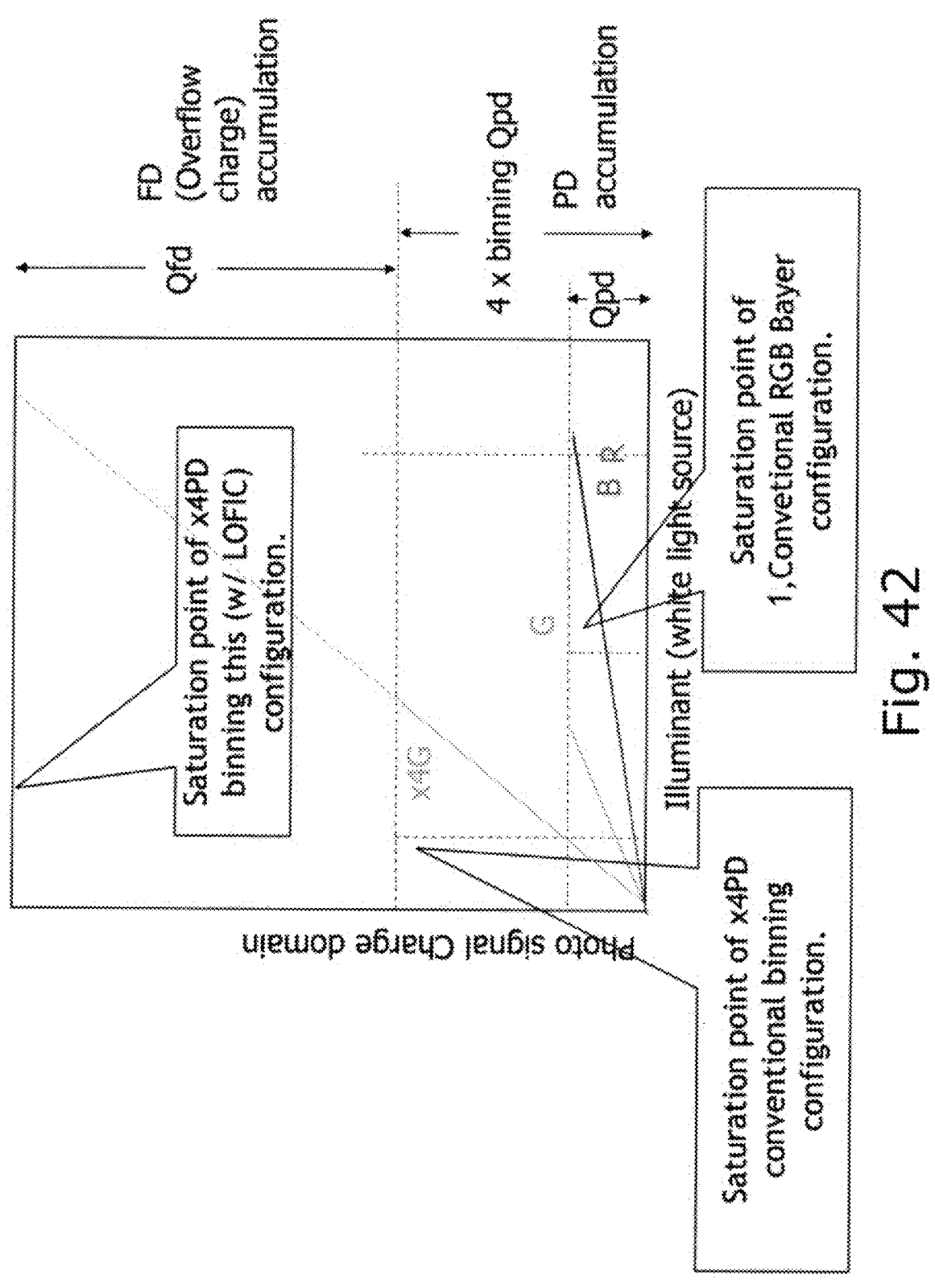
FIG. 42 is used to illustrate the advantages achieved by the solid-state imaging device relating to the second embodiment.

The above has described the characteristic configurations and functions of the solid-state imaging device 10A relating to the second embodiment including sharing pixels, where each sharing pixel has four photodiodes PD0, PD1, PD2 and PD3 and one floating diffusion FD shared between the photodiodes PD0, PD1, PD2 and PD3. The following now describes the advantages of the solid-state imaging device 10A relating to the second embodiment, with reference to FIG. 42.

Advantageous Effects of Second Embodiment

The saturation point of a regular RGB Bayer is limited by the characteristics of the green filter. The FD binning based on the 2×2 filter configuration can double the effective pixel size due to the 2×2 pixel binning scheme, in addition to achieving improved (×4) transmissivity and perfect well (×4 saturation point). In the second embodiment, the full well capacity (FWC) can be extended for the FD shared PDs where overflow charges are stored. While the conventional binning scheme combines only the PD signals at the FD node, the present embodiment can use the overflow charges Qfd to further extend the full well capacity. Therefore, the present embodiment does not require overhead for either the pixel size expansion or complete well capacity extension. As described above, the solid-state imaging device relating to the second embodiment can achieve higher SNR performance in low illuminance environment and better responsiveness, which can contribute to accomplishing higher dynamic range without overhead for the pixel size, than does solid-state imaging devices employing the conventional binning scheme.

The solid-state imaging devices 10 and 10A described above can be applied, as an imaging device, to electronic apparatuses such as digital cameras, video cameras, mobile terminals, surveillance cameras, and medical endoscope cameras.

Figure 43:
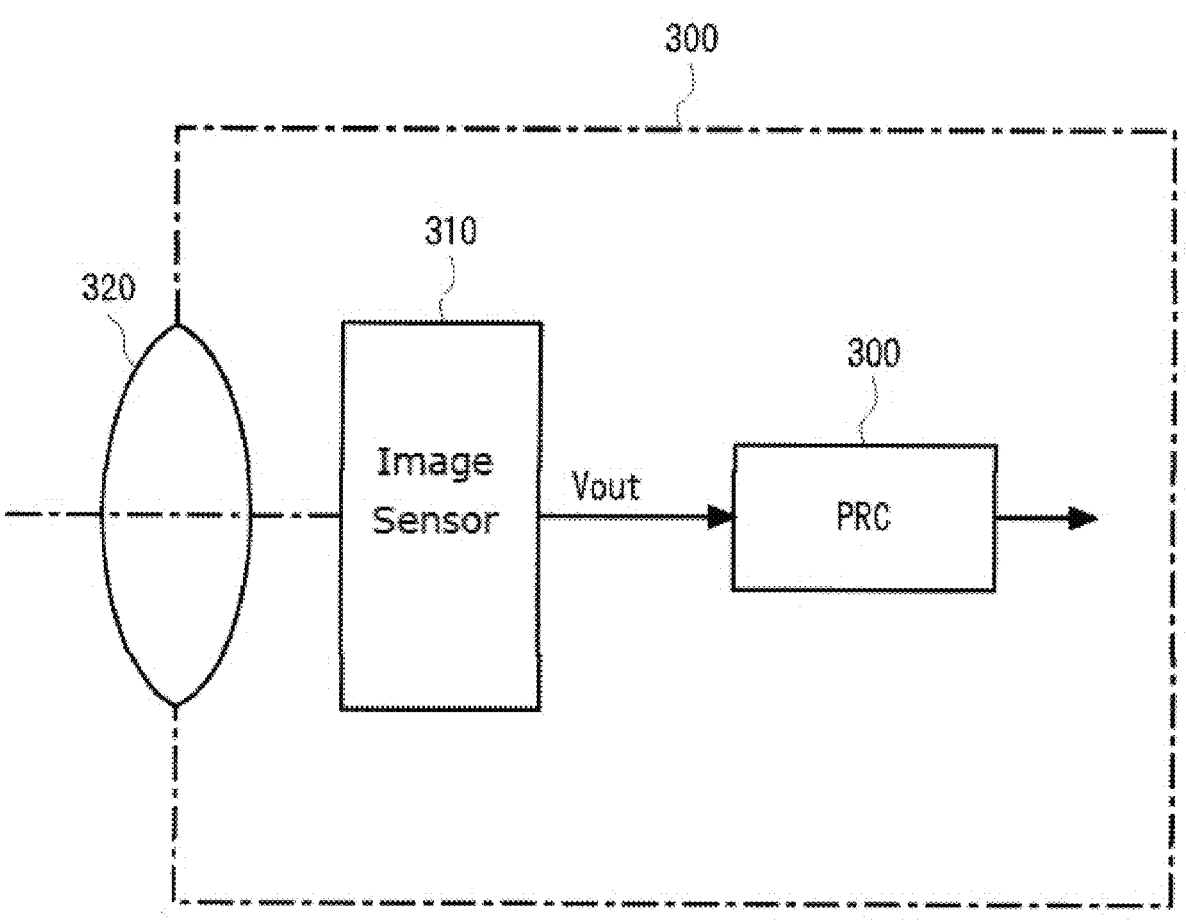
FIG. 43 shows an example configuration of an electronic apparatus to which the solid-state imaging devices relating to the embodiments of the present disclosure can be applied.

FIG. 43 shows an example of the configuration of an electronic apparatus including a camera system to which the solid-state imaging devices relating to the embodiments of the present disclosure are applied.

As shown in FIG. 43, the electronic apparatus 300 includes a CMOS image sensor 310 that can be constituted by any of the solid-state imaging devices 10 and 10A relating to the embodiments of the present disclosure. The electronic apparatus 300 further includes an optical system (such as a lens) 320 for redirecting the incident light to the pixel region of the CMOS image sensor 310 (to form a subject image). The electronic apparatus 300 includes a signal processing circuit (PRC) 330 for processing the output signals from the CMOS image sensor 310.

The signal processing circuit 330 performs predetermined signal processing on the output signals from the CMOS image sensor 310. The image signals resulting from the processing in the signal processing circuit 330 can be handled in various manners. For example, the image signals can be displayed as a video image on a monitor having a liquid crystal display, printed by a printer, or recorded directly on a storage medium such as a memory card.

As described above, a high-performance, compact, and low-cost camera system can be provided that includes the solid-state imaging device 10, 10A as the CMOS image sensor 310. Accordingly, the embodiments of the present disclosure can provide for electronic apparatuses such as surveillance cameras and medical endoscope cameras, which are used for applications where the cameras are installed under restricted conditions from various perspectives such as the installation size, the number of connectable cables, the length of cables and the installation height.

What is claimed is:

1. A solid-state imaging device comprising:
a pixel part including sharing pixels arranged therein; and
a reading part for reading a pixel signal from each sharing pixel in the pixel part,
wherein the each sharing pixel comprises
at least two photoelectric conversion elements for storing therein charges generated by photoelectric conversion;
at least two transfer elements for individually transferring the charges stored in the respective photoelectric conversion elements; and
a floating diffusion to which the charges stored in each of the photoelectric conversion elements are transferred through a corresponding one of the transfer elements;
wherein one floating diffusion is shared between the photoelectric conversion elements and between the transfer elements, and
wherein a first charge transfer path part extending from at least a first one of the photoelectric conversion elements to the floating diffusion via one of the transfer elements has an overflow path part for allowing a first saturation signal to overflow from each first photoelectric conversion element into the floating diffusion,
wherein a second charge transfer path part extending from at least a second one of the photoelectric conversion elements to a region that is not occupied by the floating diffusion has a charge discharge path part for allowing a second saturation signal to be discharged from each second photoelectric conversion element into the region that is not occupied by the floating diffusion,
wherein the first saturation signal from each first one of the photoelectric conversion elements is transferred to the floating diffusion via one of the transfer elements, and
wherein the second saturation signal from each second one of the photoelectric conversion elements is discharged through the charge discharge path part into a predetermined fixed potential region that is not electrically connected to the floating diffusion.

2. The solid-state imaging device of claim 1, wherein the each sharing pixel at least comprises:

a first photoelectric conversion element for storing therein charges generated by photoelectric conversion;

a first transfer element for transferring the charges stored in the first photoelectric conversion element;

a second photoelectric conversion element for storing therein charges generated by photoelectric conversion;

a second transfer element for transferring the charges stored in the second photoelectric conversion element, wherein, to the floating diffusion, at least the charges stored in the first photoelectric conversion element and the charges stored in the second photoelectric conversion element are transferred respectively through the first transfer element and the second transfer element, wherein charges integrated in the first photoelectric conversion element are stored in a storage node, and charges overflowing from the first photoelectric conversion element are stored in the floating diffusion, and wherein charges integrated in the second photoelectric conversion element are stored in a storage node, and charges overflowing from the second photoelectric conversion element are discharged to the region that is not occupied by the floating diffusion.

3. The solid-state imaging device of claim 2, wherein the first saturation signal from the first photoelectric conversion element is limited by saturation of the floating diffusion, and a full well capacity (FWC) of the first photoelectric conversion element is less than a FWC of the second photoelectric conversion element, photo charges of the first photoelectric conversion element are read at least twice with different gains, and wherein the second saturation signal of the second photoelectric conversion element is limited by saturation of the second photoelectric conversion element, and the FWC of the second photoelectric conversion element is greater than the FWC of the first photoelectric conversion element.

4. The solid-state imaging device of claim 3, wherein the reading part performs a sequence of operations to read the pixel signal from the each sharing pixel, starting with a read-out operation of a read-out signal (Qpd0) from the first photoelectric conversion element, subsequently performing a read-out operation of an overflow signal (Qfd), so that a total amount of photo charges to be processed is extended, and subsequently performing a read-out operation of a read-out signal (Qpd1) from the second photoelectric conversion element, wherein a total amount of photo charges is determined by photo charges (Qpd0+Qfd) from the first photoelectric conversion element and photo charges Qpd1 from the second photoelectric conversion element.

5. The solid-state imaging device of claim 4, wherein the reading part is configured to read each of signals representing stored photo charges within a single frame using a pair of memories for the each signal provided in a column- or pixel-wise analog-to-digital converter (ADC).

6. The solid-state imaging device of claim 5, wherein the reading part performs AD conversion for each of the signals representing stored photo charges and uses at least a plurality of ADC conversions for different conversion gains.

7. The solid-state imaging device of claim 6, wherein the each sharing pixel comprises color filters arranged correspondingly to the first and the second photoelectric conversion elements, and wherein a high-transmittance color filter is applied to the first photoelectric conversion element from which overflow photo charges are stored in the floating diffusion, and a relatively low-transmittance color filter is applied to the second photoelectric conversion element in which generated photo charges are accumulated and stored as a read-out signal.

8. The solid-state imaging device of claim 7, wherein the each sharing pixel has a DTI structure to keep crosstalk within an acceptable range, or a partial full DTI structure to prevent color signal crosstalk between the first and the second photoelectric conversion elements.

9. The solid-state imaging device of claim 7, wherein the each sharing pixel comprises the color filters arranged correspondingly to the pixels respectively including the first and second photoelectric conversion elements, wherein a high-sensitivity high-transmittance color filter is applied to the first photoelectric conversion element from which the overflow photo charges are stored into the floating diffusion, and relatively less sensitive transmissive color filters are applied to the second photoelectric conversion element in which the produced photo charges are accumulated as the read-out signal, and wherein in order to extend an overflow signal from the high-sensitivity pixel, color filters of other pixels than the high-sensitivity pixel are combined with a filter sensitive to any one of the relatively less sensitive transmissive color filters.

10. The solid-state imaging device of claim 1, wherein the each sharing pixel at least comprises:

a first photoelectric conversion element for storing therein charges generated by photoelectric conversion;

a first transfer element for transferring the charges stored in the first photoelectric conversion element;

a second photoelectric conversion element for storing therein charges generated by photoelectric conversion;

a second transfer element for transferring the charges stored in the second photoelectric conversion element;

a third photoelectric conversion element for storing therein charges generated by photoelectric conversion;

a third transfer element for transferring the charges stored in the third photoelectric conversion element;

a fourth photoelectric conversion element for storing therein charges generated by photoelectric conversion; and a fourth transfer element for transferring the charges stored in the fourth photoelectric conversion element, wherein, to the floating diffusion, the charges stored in the first photoelectric conversion element are transferred through the first transfer element, the charges stored in the second photoelectric conversion element are transferred through the second transfer element, the charges stored in the third photoelectric conversion element are transferred through the third transfer element, and the charges stored in the fourth photoelectric conversion element are transferred through the fourth transfer element, wherein the first, the second, a third, and a fourth saturation signals from the first, second, third and fourth photoelectric conversion elements are transferred to the floating diffusion respectively via the first, second, third and fourth transfer elements via one of terminals thereof, and wherein overflow charges from the first, second, third and fourth photoelectric conversion elements are released to the region that is not occupied by the floating diffusion, respectively via the first, second third and fourth transfer elements via another one of the terminals thereof.

11. The solid-state imaging device of claim 10, wherein the each sharing pixel has color filters arranged correspondingly to the first, second, third and fourth photoelectric conversion elements, and wherein the color filters are applied to the first, second, third and fourth photoelectric conversion elements that share the floating diffusion and that are arranged in a m×m block (m is an integer equal to or greater than two).

12. The solid-state imaging device of claim 11, wherein the each sharing pixel comprises a DTI structure to keep crosstalk within an acceptable range, or a partial full DTI structure to prevent color signal crosstalk between the first, second, third and fourth photoelectric conversion elements.

13. The solid-state imaging device of claim 12, wherein the reading part is configured to exploit a binning capability of the first, second, third and fourth photoelectric conversion elements sharing the floating diffusion, and wherein m×m binning extends the overflow charges, and the extended overflow charges are stored in the floating diffusion.

14. The solid-state imaging device of claim 13, wherein, when applied to photoelectric conversion elements, a 2×2 binning capability doubles an effective pixel size while achieving increased (by a factor of 4) sensitivity and increased well (a saturation point is increased by a factor of 4).

15. The solid-state imaging device of claim 13, wherein the photoelectric conversion elements share the floating diffusion, overflow charges from at least one or more of the first, second, third and fourth photoelectric conversion elements are stored in the floating diffusion, and a full well capacity (FWC) of a desired one of the first, second, third and fourth photoelectric conversion elements is extended.

16. The solid-state imaging device of claim 13, wherein the reading part performs a sequence of operations to read the pixel signal from the each sharing pixel, starting with a read-out operation of a read-out signal (Qpd0) from a first one of the photoelectric conversion elements, subsequently performing a read-out operation of an overflow signal (Qfd), so that a total amount of photo charges to be processed is extended, and subsequently performing a read-out operation of a read-out signal (Qpdn) from second and subsequent ones of the photoelectric conversion elements, and wherein a total amount of photo charges is determined by photo charges (Qpd0+Qfd) from the first one of the photoelectric conversion elements and photo charges Qpdn from the second and subsequent ones of the photoelectric conversion elements.

17. The solid-state imaging device of claim 16, wherein the reading part is configured to perform global read-out using pixel-wise analog sample-and-hold circuits or analog-to-digital conversions (ADCs) for respective signal sequences having a plurality of operation sequences.

18. The solid-state imaging device of claim 1, wherein the each sharing pixel comprises: a storage element connected to the floating diffusion; and a storage capacitance element for storing the charges received from the floating diffusion via the storage element.

19. The solid-state imaging device of claim 18, wherein an overflow path is formed in the transfer elements in a layer at least deeper than a channel formation region, and wherein an overflow path is formed in charge overflow gate elements at least under a channel formation region.

20. The solid-state imaging device of claim 19, wherein the charge overflow gate elements each serve as a shutter gate for transferring the charges stored in the connected photoelectric conversion element toward a region other than a region where the floating diffusion serving as an output node is formed.

21. The solid-state imaging device of claim 20, wherein each of the transfer elements and a corresponding one of the charge overflow gate elements are driven and controlled at independently selected timings.

\* \* \* \* \*